(12) United States Patent
Wada

(10) Patent No.: US 8,722,449 B2
(45) Date of Patent: May 13, 2014

(54) MANUFACTURING METHOD OF SEMICONDUCTOR DEVICE

(75) Inventor: Eiji Wada, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 117 days.

(21) Appl. No.: 13/404,952

(22) Filed: Feb. 24, 2012

(65) Prior Publication Data
US 2012/0225514 A1 Sep. 6, 2012

(30) Foreign Application Priority Data
Mar. 4, 2011 (JP) .................................. 2011-047064

(51) Int. Cl.
*H01L 21/00* (2006.01)
(52) U.S. Cl.
USPC ..................................... 438/65; 257/E31.127
(58) Field of Classification Search
USPC ........................................................ 438/65
See application file for complete search history.

(56) References Cited

U.S. PATENT DOCUMENTS

| 7,211,466 B2* | 5/2007 | Lo et al. ......................... 438/109 |
| 2007/0098227 A1 | 5/2007 | Takahashi |
| 2010/0164032 A1* | 7/2010 | Kita ............................... 257/432 |

FOREIGN PATENT DOCUMENTS

JP 2007-117397 A 5/2007

* cited by examiner

*Primary Examiner* — Reema Patel
(74) *Attorney, Agent, or Firm* — Miles & Stockbridge P.C.

(57) ABSTRACT

An optical component is fixed precisely on a sensor chip. After a sensor chip including a front surface having a sensor plane with a plurality of light receiving elements is mounted face-up over a wiring substrate, an adhesive is disposed on the front surface of the sensor chip at a plurality of positions, and a plurality of spacers having adherence is formed by curing this adhesive. Then, an adhesive paste is disposed on the front surface of the sensor chip. Then, an optical component held by a bonding tool is disposed on the front surface via the spacer and the adhesive. After that, the bonding tool is separated from the optical component and the optical component is fixed by curing the adhesive in a state in which a load is not applied to the optical component.

19 Claims, 45 Drawing Sheets

MANUFACTURING METHOD OF SEMICONDUCTOR DEVICE

CROSS-REFERENCE TO RELATED APPLICATION

The disclosure of Japanese Patent Application No. 2011-47064 filed on Mar. 4, 2011 including the specification, drawings and abstract is incorporated herein by reference in its entirety.

BACKGROUND

The present invention relates to a manufacturing method of a semiconductor device, and specifically relates to a technique which is effectively applied to a manufacturing method of a semiconductor device as a sensor module.

The sensor module includes one using a photoelectric conversion device which converts an optical signal into an electrical signal. This sensor module is used for various kinds of application, such as a vein authentication sensor which reads a vein pattern.

Japanese patent Laid-Open No. 2007-117397 (Patent document 1) discloses a technique regarding an optical biological sensor which can read a finger print or a vein pattern.

SUMMARY

In a configuration of a prior-art sensor module (here, vein authentication sensor module), an optical component (lens) is disposed over a sensor chip (CMOS sensor chip) separated from the sensor chip to some extent, and thus the thickness of the sensor module (mounting height) is large.

Recently, the sensor module has been required to be thin and therefore a thin sensor module is studied in which an optical component (protection layer) is bonded directly on the sensor chip as in Patent document 1.

The inventors have studied the manufacturing of such a thin sensor module and found a problem as follows.

The problem is a positional shift of an optical component from a sensor chip.

To be more detail, since an adhesive in a paste state (adhesive having flowability) is used when the optical component is fixed (disposed) on the sensor chip, the optical component disposed on the sensor chip moves before this adhesive is cured even if the optical component is disposed precisely with respect to the sensor chip.

Accordingly, the inventors studied a method of curing this adhesive by applying heat to the adhesive in a state in which the optical component was held by a bonding tool to prevent the component from moving even when the adhesive in a paste state was used. As a result, although the positional shift of the optical component from the sensor chip in the horizontal direction was prevented, the transmittance of the cured adhesive was reduced (An interference pattern occurred).

Studying the cause of this phenomenon, the inventors found that the load of the bonding tool was applied to this adhesive was cured until the adhesive was cured. The thickness of the adhesive became non-uniform and the interference pattern was formed in the cured adhesive.

When an optical component is bonded and fixed to a sensor chip, not only the positional shift in the horizontal direction but also disposition preciseness in the vertical direction (thickness direction) should be considered.

Although the technique of Patent document 1 discloses that a protection film (13b) is disposed over a semiconductor layer (7) via a spacer (14), there is a problem that the position of the disposed protection film (13b) shifts before a protection layer (13a) made of resin is cured completely (The reference numeral described in the parenthesis corresponds to the reference numeral of Patent document 1).

An object of the present invention is to provide a technique capable of disposing (fixing) an optical component over a sensor chip with high precision.

Further, another object of the present invention is to provide a technique capable of improving performance of a semiconductor device.

The other purposes and the new feature of the present invention will become clear from the description of the present specification and the accompanying drawings.

The following explains briefly the outline of a typical invention among the inventions disclosed in the present application.

In a manufacturing method of a semiconductor device in accordance with a typical embodiment, a sensor chip including a front surface having a sensor region with a plurality of pixels formed on is mounted face-up on the upper surface of a wiring substrate, then a first adhesive is disposed on the front surface of the sensor chip at a plurality of positions, and a plurality of first spacers having adherence is formed on the front surface of the sensor chip by curing this first adhesive. Then, after a second adhesive in a paste state is disposed on the front surface of the sensor chip, a first optical component having a light blocking layer with a plurality of optical regions formed on is disposed over the front surface of the sensor chip via the first spacers and the second adhesive while a load is applied to the first optical component. After that, the first optical component is fixed by curing the second adhesive in a state that no load is applied to the first optical component.

The following explains briefly the effect acquired by the typical invention among the inventions disclosed in the present application.

A typical embodiment can dispose (fix) an optical component over a sensor chip with high precision.

Further, performance of a semiconductor device can be improved.

DETAILED DESCRIPTION

Figure 1:
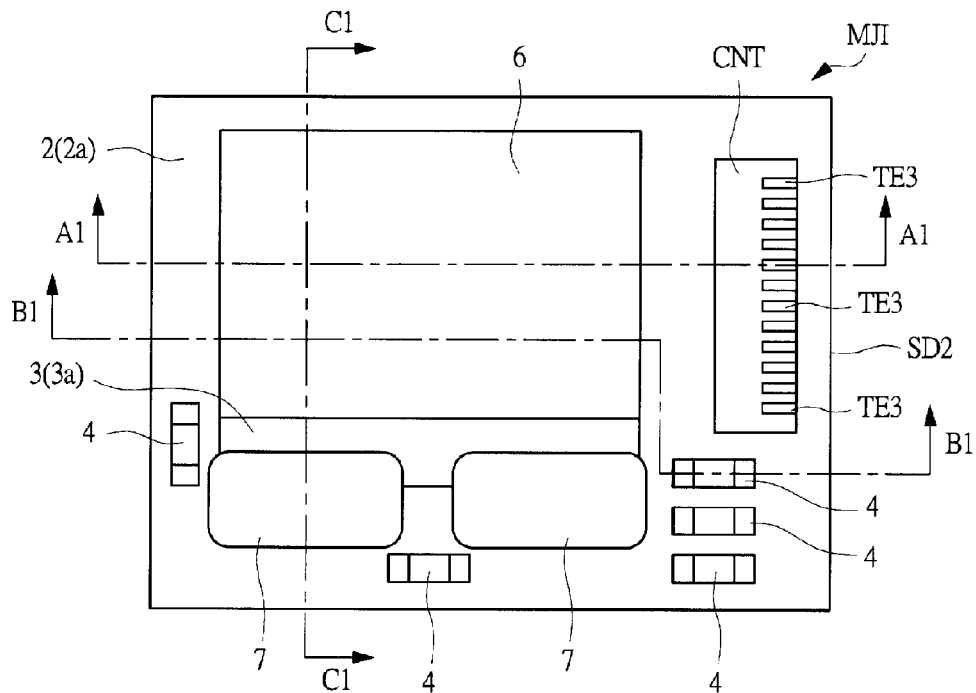
FIG. 1 is a plan view of a sensor module in accordance with an embodiment of the present invention.

The following embodiment will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements (including the number, a numeric value, an amount, a range), they may be not restricted to the specific number but may be greater or smaller than the specific number, except for the case where they are clearly specified in particular and where they are clearly restricted to a specific number theoretically. Furthermore, in the following embodiment, that an element (including an element process) is not necessarily indispensable, except for the case where it is clearly specified in particular and where it is considered to be clearly indispensable from a theoretical point of view. Similarly, in the following embodiments, when shape, position relationship of an element are referred to, what resembles or is similar to the shape substantially shall be included, except for the case where it is clearly specified in particular and where it is considered to be clearly not right from a theoretical point of view. This statement also applies to the numeric value and range described above.

An embodiment of the present invention will be explained in detail according to the drawings. In all the drawings for explaining the embodiment, a member having the same function is denoted by the same reference numeral and the repeated explanation will be omitted. Further, in the following embodiment, explanation of the same or similar portion will not repeated as a principle unless it is required in particular.

Further, in the drawings to be used in an embodiment, hatching is omitted sometimes for easy viewing of the drawing even if it is a cross-sectional view. Further, hatching is attached sometimes for easy viewing of the drawing even if it is a plan view.

A sensor module (semiconductor device) and its manufacturing step in accordance with an embodiment of the present invention will be explained with reference to the drawings. The sensor module in the embodiment is one used as a sensor module for a vein authentication, such as a finger vein authentication. The sensor module can be used also for an application other than the vein authentication, such as a finger print authentication.

Figure 2:
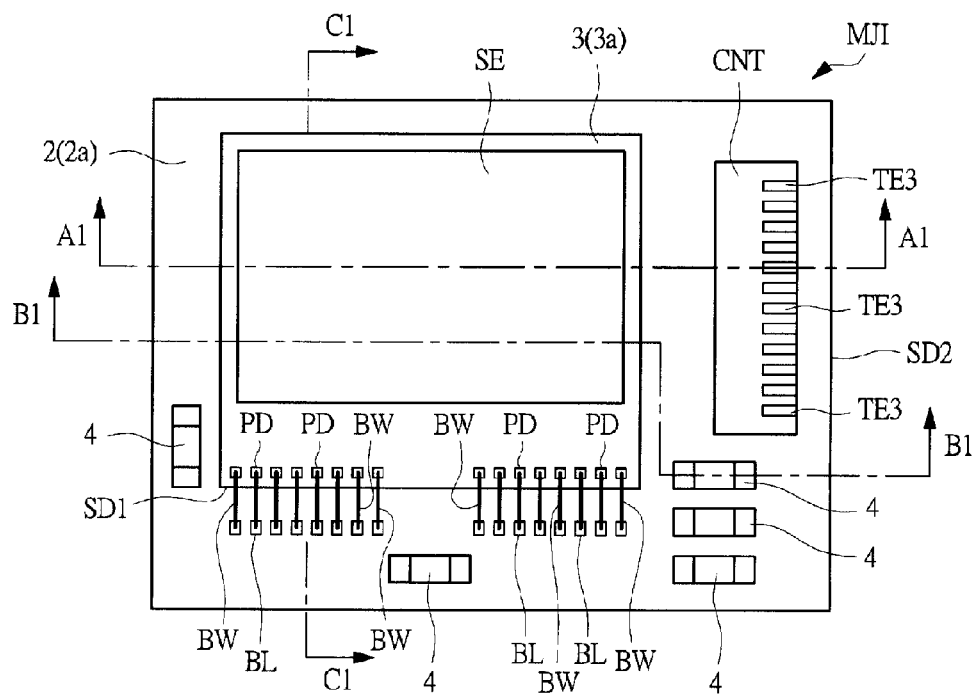
FIG. 2 is a perspective plan view of a sensor module in accordance with an embodiment of the present invention.
Figure 3:
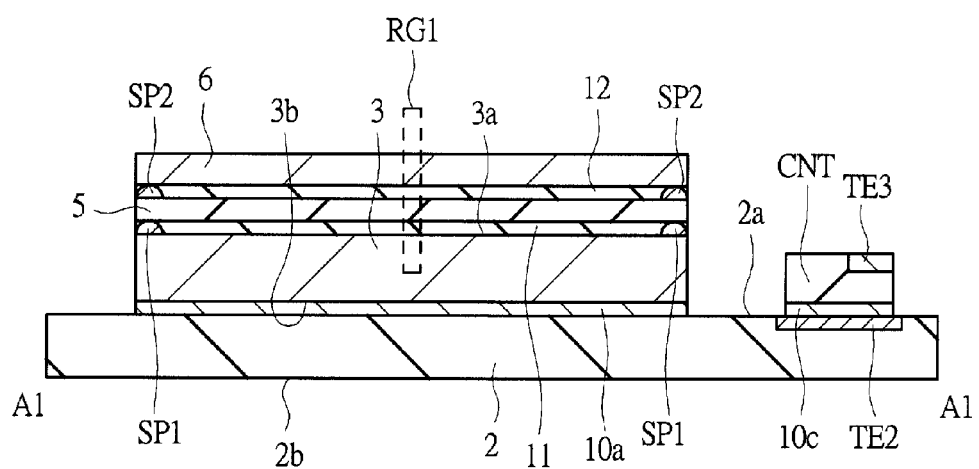
FIG. 3 is a cross-sectional view (an A1-A1 cross-sectional view) of a sensor module in accordance with an embodiment of the present invention.
Figure 4:
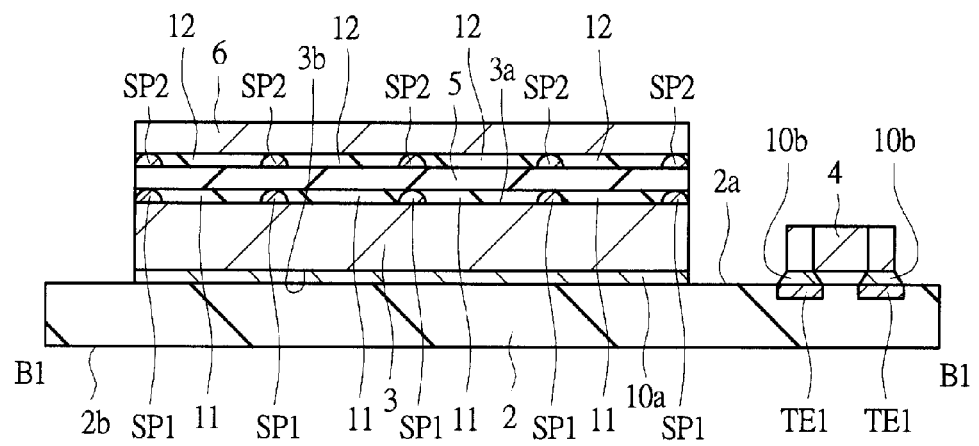
FIG. 4 is a cross-sectional view (a B1-B1 cross-sectional view) of a sensor module in accordance with an embodiment of the present invention.
Figure 5:
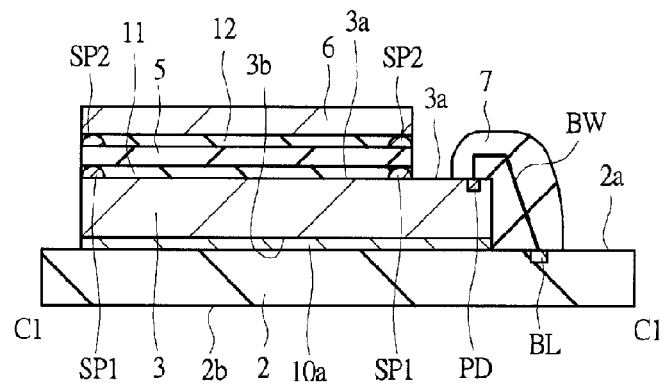
FIG. 5 is a cross-sectional view (a C1-C1 cross-sectional view) of a sensor module in accordance with an embodiment of the present invention.
Figure 6:
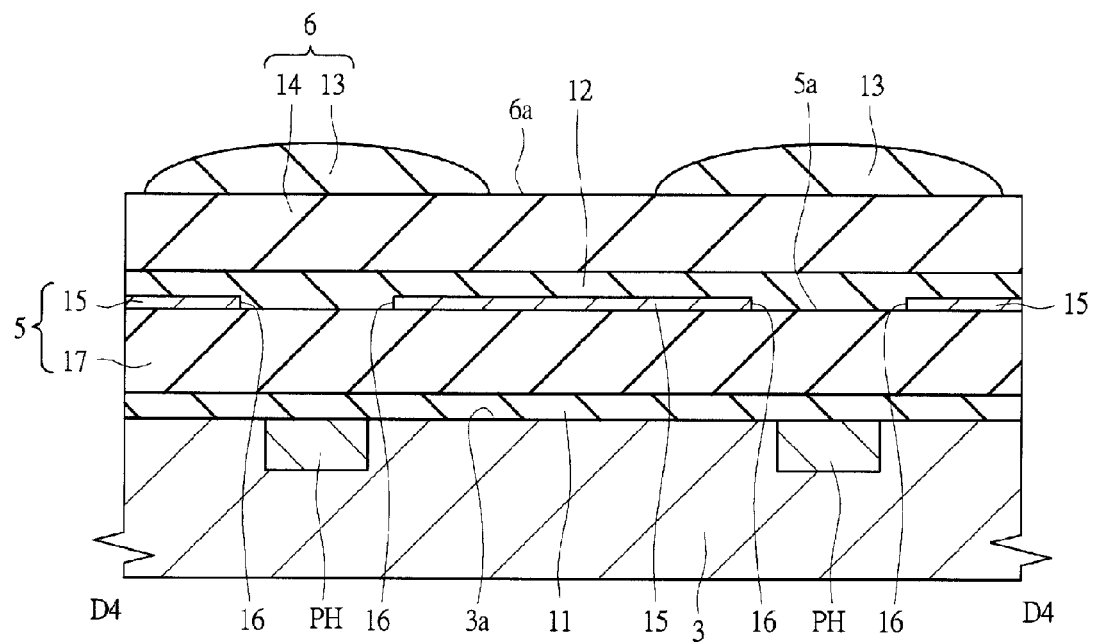
FIG. 6 is a partial enlarged cross-sectional view of a sensor module in accordance with an embodiment of the present invention.
Figure 7:
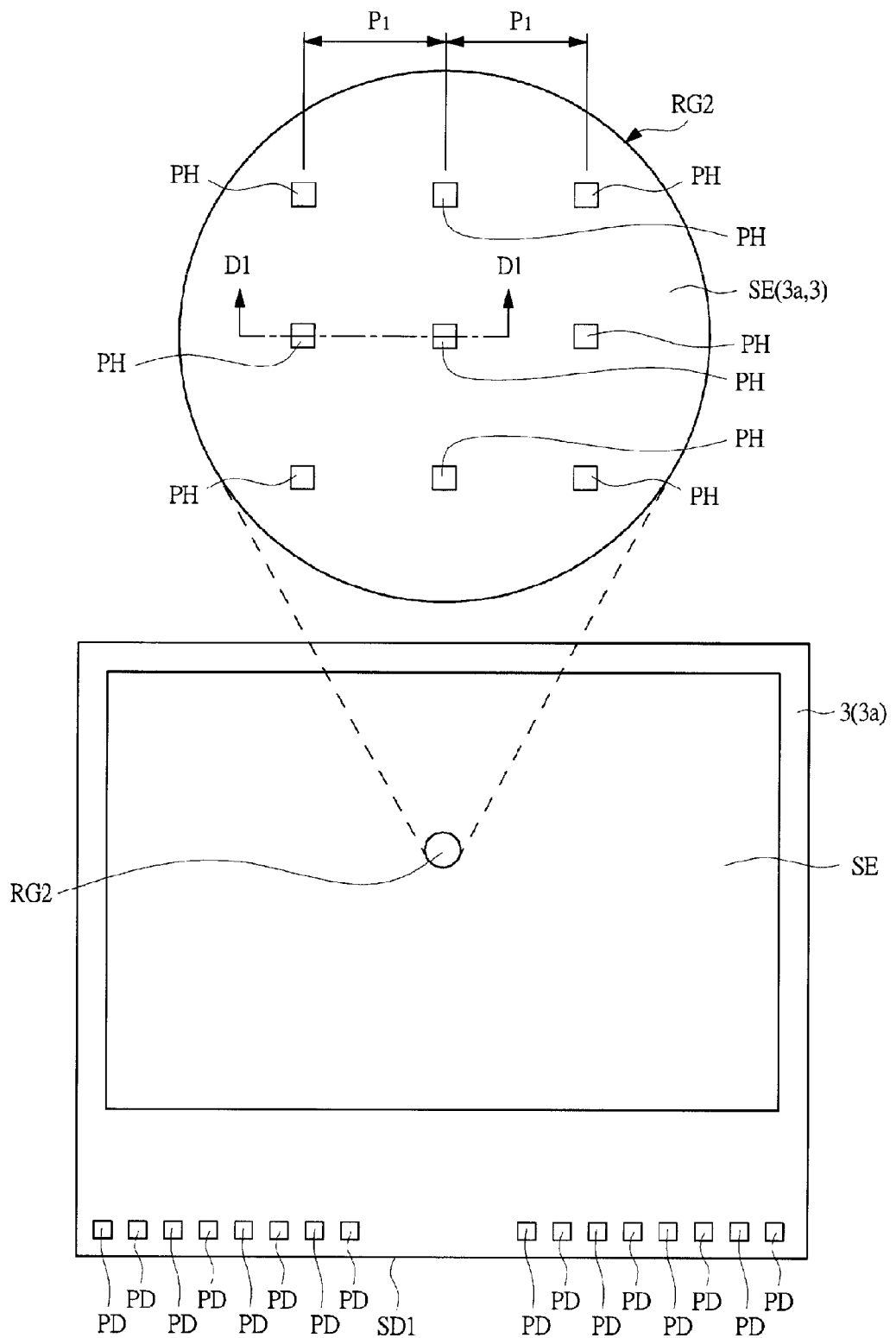
FIG. 7 is a plan view of a sensor chip used in a sensor module in accordance with an embodiment of the present invention.
Figure 8:
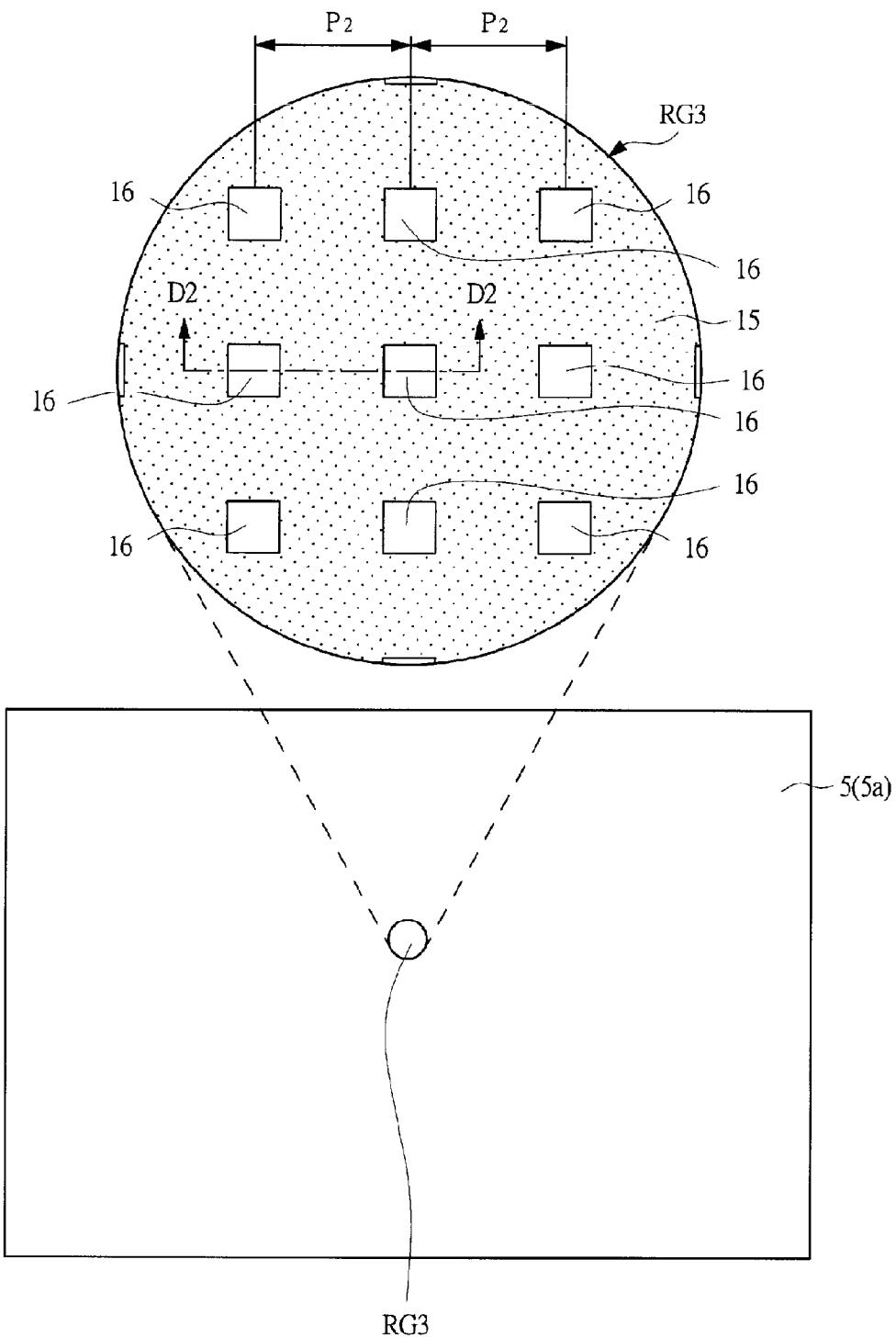
FIG. 8 is a plan view of an optical component used in a sensor module in accordance with an embodiment of the present invention.
Figure 9:
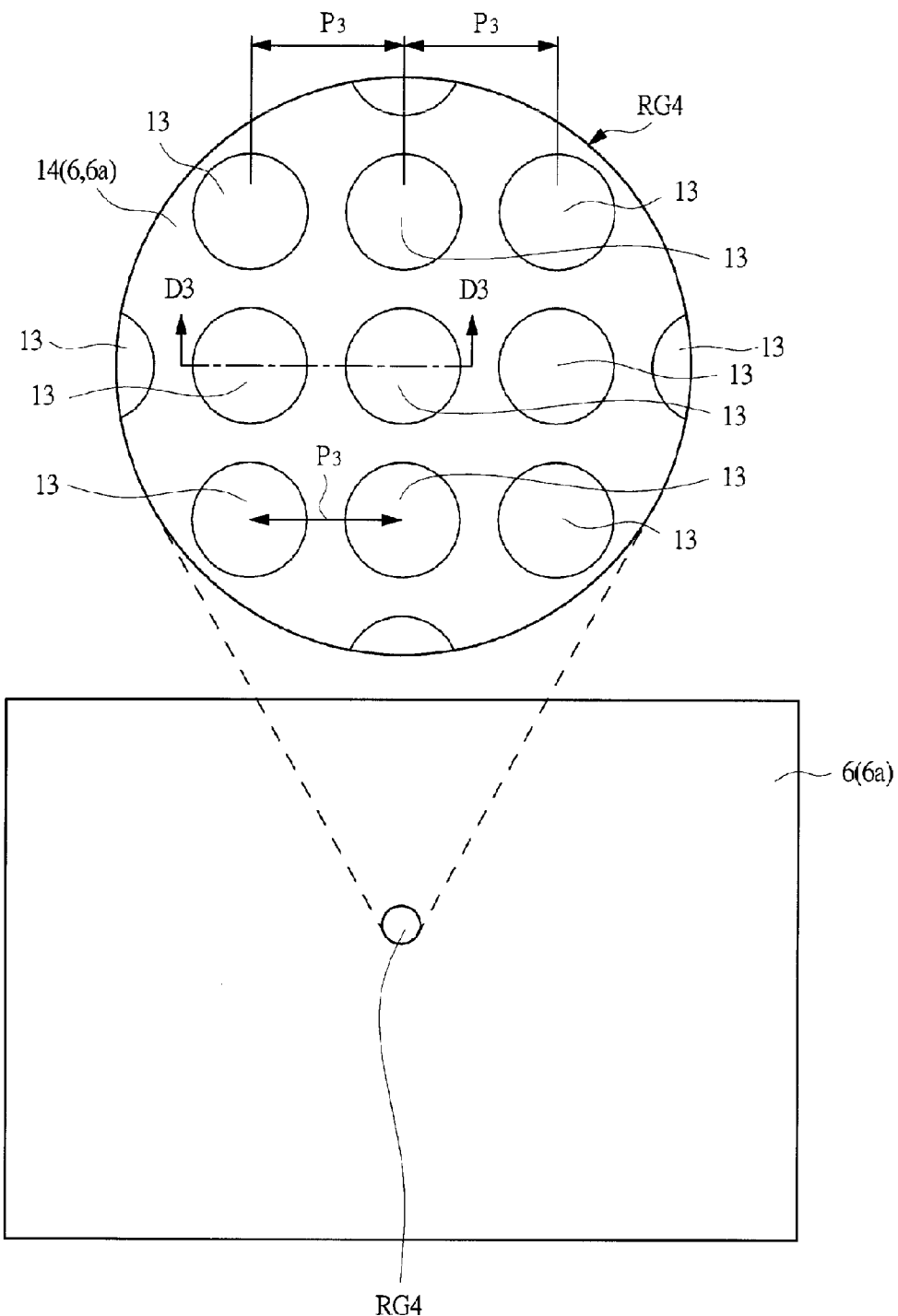
FIG. 9 is a plan view of an optical component used in a sensor module in accordance with an embodiment of the present invention.
Figure 10A:
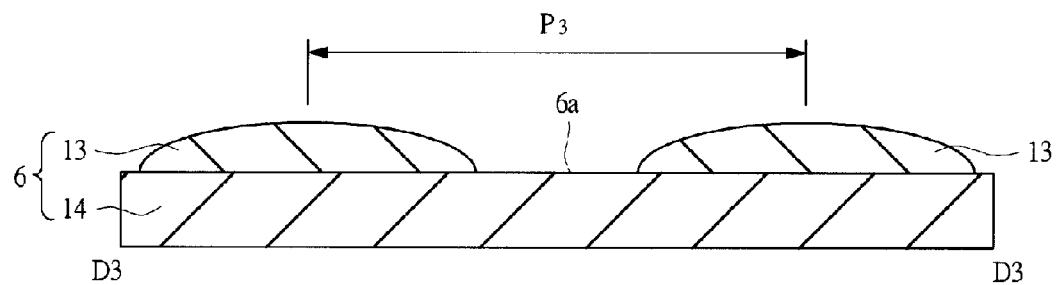
FIGS. 10(a) to 10(c) are partial enlarged cross-sectional views of a sensor chip and optical components used in a sensor module in accordance with an embodiment of the present invention.
Figure 10B:
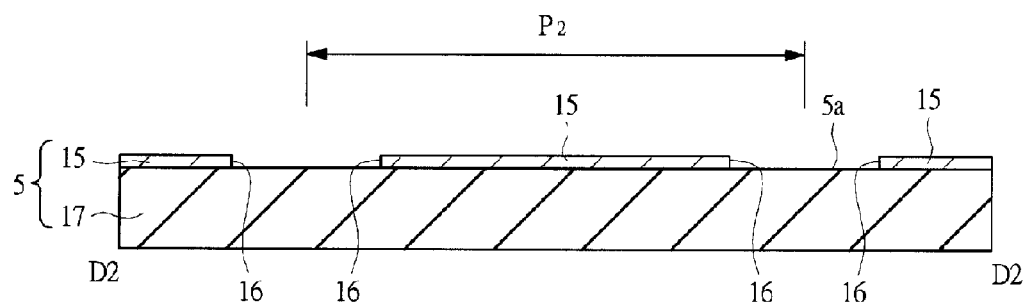
Figure 10C:
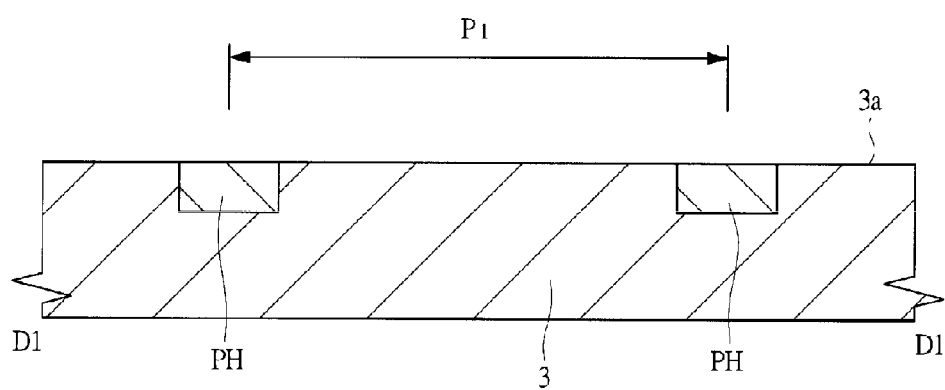
Figure 11:
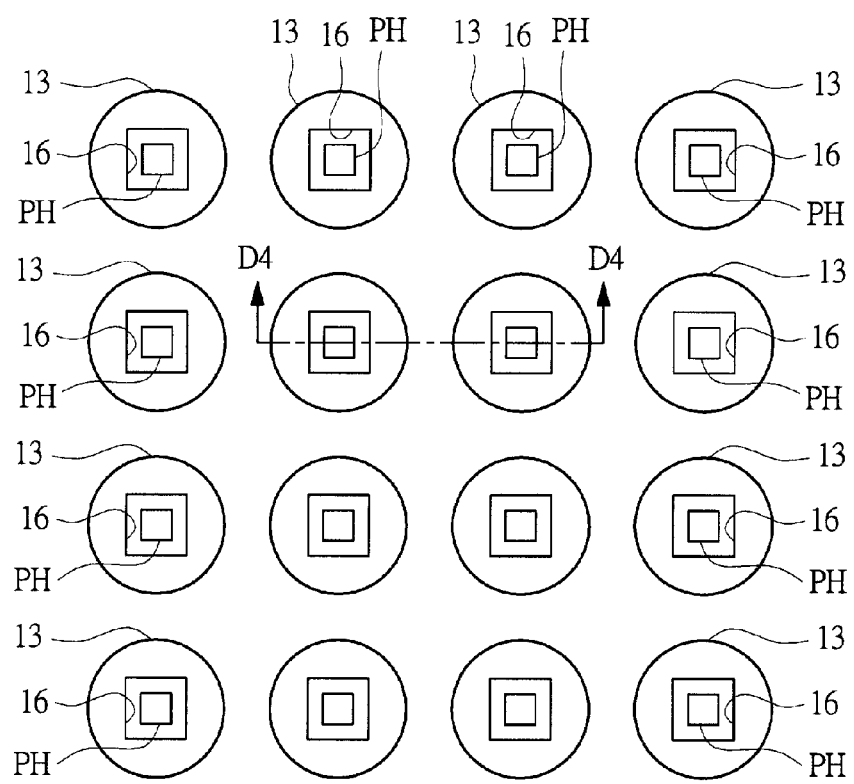
FIG. 11 is an explanatory diagram showing a planar positional relationship among a light receiving element of a sensor chip, an opening portion in a light blocking layer of an optical component, and a lens portion of the optical component.

<Structure of a Sensor Module> FIG. 1 is a plan view of a sensor module (semiconductor device or electronic device) MJ1 in accordance with an embodiment of the present invention. FIG. 2 is a perspective plan view of the sensor module MJ1. FIG. 3 to FIG. 5 are cross-sectional views of the sensor module MJ1 (side cross-sectional views). FIG. 6 is a partial enlarged cross-sectional view (relevant part cross-sectional view) of the sensor module MJ1. FIG. 7 is a plan view (top view) of a sensor chip 3 used for the sensor module MJ1. FIG. 8 is a plan view (top view) of an optical component 5 used for the sensor module MJ1. FIG. 9 is a plan view (top view) of an optical component 6 used for the sensor module MJ1. FIGS. 10(*a*) to 10(*c*) are partial enlarged cross-sectional views (relevant part cross-sectional views) of the sensor chip 3 and the optical components 5 and 6 used for the sensor module MJ1. FIG. 11 is an explanatory diagram (plan view) showing a planar positional relationship among a light receiving element PH of the sensor chip 3, an opening portion 16 in a light blocking layer 15 of the optical component 5, and a lens portion 13 of the optical component 6. FIG. 2 shows a plan view of the sensor module MJ1 viewed through (removing) the optical components 5 and 6 and a sealing portion 7. Further, FIG. 3 corresponds to a cross-sectional view at the position of the A1-A1 line in FIG. 1 and FIG. 2. FIG. 4 corresponds to a cross-sectional view at the position of B1-B1 line in FIG. 1 and FIG. 2. FIG. 5 corresponds to a cross-sectional view at the position of the C1-C1 line in FIG. 1 and FIG. 2. FIG. 6 is a partial enlarged cross-sectional view of FIG. 3 and shows an enlarged view of the region RG1 surrounded by the dotted line in FIG. 3, and also corresponds to a cross-sectional view at the position of the D4-D4 line in FIG. 11. Further, FIG. 7 shows a plan view (top view) of the sensor chip 3 and shows an enlarged view of the region RG2 therein together. Further, FIG. 8 shows a plan view (top view) of the optical component 5 and also shows an enlarged view of the region RG3. Further, FIG. 9 shows a plan view (top view) of the optical component 6 and also shows an enlarged view of the region RG4. Further, FIG. 10(c) shows a partial enlarged cross-sectional view (relevant part cross-sectional view) of the sensor chip 3. FIG. 10(b) shows a partial enlarged cross-sectional view (relevant part cross-sectional view) of the optical component 5. FIG. 10(a) shows a partial enlarged cross-sectional view (relevant part cross-sectional view) of the optical component 6. FIG. 10(c) corresponds to a cross-sectional view at the position of the D1-D1 line in FIG. 7. FIG. 10(b) corresponds to a cross-sectional view at the position of the D2-D2 line in FIG. 8. FIG. 10(a) corresponds to a cross-sectional view at the position of the D3-D3 line in FIG. 9. Further, the cross-sectional views of FIGS. 10(a) to 10(c) show cross sections also corresponding to FIG. 6. Further, while the part of the enlarged view of the region RG3 in FIG. 8 is a plan view, dot hatching is attached to a region where the light blocking layer 15 is formed for easy understanding.

As shown in FIGS. 1 to 10(c), the sensor module MJ1 in the embodiment includes a wiring substrate 2, the sensor chip 3 and an electronic component 4 mounted on the upper surface 2a of the wiring substrate 2, and the optical components 5 and 6 mounted on the sensor chip 3. Further, the sensor module MJ1 in the embodiment includes a plurality of bonding wires BW electrically connecting a plurality of pad electrodes PD of the sensor chip 3 and a plurality of bonding leads BL of the wiring substrate 2, the sealing portion 7 covering the bonding wires BW, and a connector CNT mounted on the upper surface 2a of the wiring substrate 2.

The wiring substrate (base material) 2 has the upper surface (major surface, front surface, or sensor chip mounting surface) 2a and the lower surface (rear surface) 2b which are two major surfaces opposite to each other, and the upper surface 2a is a major surface on a side mounting the sensor chip 3 and the electronic component 4 (sensor chip mounting surface). The wiring substrate 2 is a resin substrate of a glass-epoxy series and can have a multilayer wiring structure (multilayer wiring substrate) alternately stacking an insulating layer composed of a resin material layer (glass-epoxy series resin material layer) or the like and a wiring layer (conductor layer or conductor pattern layer). On the upper surface 2a of the wiring substrate 2, the plurality of bonding leads (electrodes or terminals) BL and a plurality of terminals (electrodes, conductive lands, or bonding leads) TE1 and TE2 are formed (disposed) as electrodes. A pad electrode (bonding pad, electrode, or terminal) PD of the sensor chip 3 mounted over the upper surface 2a of the wiring substrate 2 is electrically connected to the bonding lead BL formed over the upper surface 2a of the wiring substrate 2 via the bonding wire BW. The bonding wire BW is made of a metal fine wire such as a gold (Au) wire.

One or more electronic components 4 are mounted (assembled) on the upper surface 2a of the wiring substrate and these electronic components 4 include a passive component (chip component), such as a chip resistor and a chip capacitor, and a memory chip (semiconductor chip for a memory) in which a non-volatile memory circuit such as an EEPROM (Electrically Erasable Programmable Read-Only Memory) is formed. Among the electronic components 4, the passive component, such as a chip resistor and a chip capacitor, is assembled over the upper surface 2a of the wiring substrate 2 by solder bonding and the memory chip is assembled over the upper surface 2a of the wiring substrate 2 via a solder bump (bump electrode) by flip chip bonding. Each electrode of the electronic components 4 is connected mechanically and electrically to each of the terminals TE1 on the upper surface 2a of the wiring substrate 2. Each of FIG. 1, FIG. 2, and FIG. 4 shows a state in which the passive component, such as a chip resistor and a chip capacitor, is connected as the electronic component 4 to the terminal TE1 on the upper surface 2a of the wiring substrate 2 via bonding material 10b such as solder. The number and kind of the electronic components 4 mounted on the upper surface 2a of the wiring substrate 2 can be changed as needed. The plurality of terminals TE1 being terminals for connecting the electronic component 4 is formed on the upper surface 2a of the wiring substrate 2 and each of the terminals TE1 is formed by a conductor pattern (wiring pattern) which is formed in the same layer as that of the bonding lead BL formed on the upper surface 2a of the wiring substrate 2.

The sensor chip (imaging element, solid-state imaging element, or semiconductor imaging element) 3 is a semiconductor chip for an optical sensor in which a sensor circuit (light receiving circuit), such as a CMOS image sensor circuit, is formed and has a front surface which is a major surface on a side where the sensor circuit is formed (light receiving surface or light receiving element formation surface) 3a and a rear surface 3b which is a major surface on the opposite side of the front surface 3a. The sensor chip 3 is mounted (disposed, assembled, or face-up-bonded) over the upper surface 2a of the wiring substrate 2 via bonding material (die bonding material) 10a so that the rear surface 3b of the sensor chip 3 becomes the side facing (mounted on or bonded to) the wiring substrate 2. The sensor chip 3 is a semiconductor chip. The sensor module MJ1 can be considered to be a semiconductor device.

The CMOS image sensor circuit formed in the sensor chip 3 is formed by a CMOS process which is used typically in the manufacturing step of a semiconductor device, and includes a sensor array (light receiving element region). In the front surface 3a of the sensor chip 3, a sensor plane (sensor region, light receiving portion, or sensor array region) SE, which is a region (sensor region) where the sensor array is formed, is provided as a light receiving portion. The sensor plane SE can be considered to be a sensor region. The planar shape of the sensor chip 3 is quadrangular (more specifically, rectangular) and the planar shape of the sensor plane SE is also quadrangular (more specifically, rectangular).

In the sensor plane SE of the sensor chip 3, a plurality of light receiving elements PH is formed as a plurality of pixels. Specifically, in the sensor plane SE of the sensor chip 3, as apparent also from FIG. 7 and FIG. 10(c), the light receiving elements (pixels) PH are disposed to be arranged regularly vertically and horizontally (in an array) along the major surface of the sensor chip 3. Each of the light receiving elements PH is a portion forming a pixel of the CMOS image sensor circuit and has a photoelectrical conversion function which converts an input optical signal into an electrical signal. The light receiving element PH can be considered to be a pixel. A photo-diode or a photo-transistor can be used for the light receiving element PH. Further, the sensor chip 3 also can include an analog circuit, a DSP (Digital Signal Processor) circuit, and the like, for processing the electrical signal obtained by the sensor plane SE.

In the sensor plane SE of the sensor chip 3, 15,000 light receiving elements PH are arranged (disposed) in an array (matrix) of 100 rows×150 columns. Note that the numbers of the rows and the columns in the arrangement of these light receiving elements PH can be changed as needed.

Further, while not shown in the drawing, on the front surface 3a of the sensor chip 3, a surface protection film (protection insulating film) is formed as an insulating film of the top layer in the sensor chip 3. An opening portion for the light receiving element PH and an opening portion for the pad electrode PD are formed in this surface protection film. The opening portion for the light receiving element PH in this surface protection film is formed to expose each of the light receiving elements PH in the upper direction of this light receiving element PH and is configured to allow light to enter the light receiving element PH through the opening portion for the light receiving element PH. Further, the opening portion for the pad electrode PD in the surface protection film is formed to expose each of the pad electrodes PD in the upper direction of this pad electrode PD and is configured to allow the bonding wire BM to be coupled to the pad electrode PD.

On the front surface 3a of the sensor chip 3, the plurality of pad electrodes PD is formed (disposed) in a region except the sensor plane SE and this pad electrode PD is an extraction electrode of the CMOS image sensor circuit of the sensor chip 3 and connected electrically to the bonding lead BL of the wiring substrate 2 via the bonding wire BW. The pad electrode PD is disposed in an outer peripheral part of the front surface 3a of the sensor chip 3. In FIG. 2 and FIG. 7, the pad electrodes PD are disposed (arranged) in a line along a side SD1 of the front surface 3a of the sensor chip 3.

On the upper surface 2a of the wiring substrate 2, the connector (connector portion) CNT, which functions as external terminals (external connection terminals) of the sensor module MJ1 is mounted (assembled or disposed) via bonding material 10c. The connector CNT functions as the external terminals for electrically connecting (the circuit included in) the sensor module MJ1 to external apparatuses. Specifically, the plurality of terminals TE2 which are terminals for connecting the connector CNT is formed at a position along a side SD2 on the upper surface 2a of the wiring substrate 2, and the connector CNT is connected electrically to these terminals TE2. Each of the terminals TE2 on the upper surface 2a of the wiring substrate 2 is formed by a conductor pattern (wiring pattern) which is formed in the same layer as that of the bonding lead BL and the terminal TE1 formed on the upper surface 2a of the wiring substrate 2.

Each of the bonding leads BL and each of the terminals TE1 and terminals TE2 on the upper surface 2a of the wiring substrate 2 are connected electrically to each other as needed via a wiring of the wiring substrate 2 (including the bonding lead BL, a wiring pattern in the same layer as that of the terminals TE1 and TE2, an internal wiring pattern in the wiring substrate 2, and a via hole of the wiring substrate 2).

The connector CNT has a plurality of terminals TE3 and each of the terminals TE3 in the connector CNT is connected electrically to each of the terminals TE2 of the wiring substrate 2. Each of the terminals TE3 in the connector CNT is coupled electrically to the circuit in the sensor module MJ1 (each electrode of the sensor chip 3 or the electronic component 4) via the wiring of the wiring substrate 2. Each of the terminals TE3 of the connector CNT is connected electrically to each of the terminals TE2 on the upper surface 2a of the wiring substrate 2 and further connected electrically to the pad electrode PD of the sensor chip 3, the electrode of the electronic component 4 via the wiring of the wiring substrate 2, the bonding wire BW, or the solder.

Over the upper surface 2a of the wiring substrate 2, the sealing portion 7 is formed to cover the plurality of bonding wires BW. The sealing portion 7 is made of resin material, such as heat curable resin material, and also can include a filler. Epoxy resin and silicone resin can be used as the resin material for the sealing portion 7. A connection portion between the pad electrode PD of the sensor chip 3 and the bonding wire BW, a connection portion between the bonding lead BL on the wiring substrate 2 and the bonding wire BW, and the bonding wire BW are sealed and protected by the sealing portion 7.

Further, while the sealing portion 7 is formed to cover the bonding wire BW (to expose the bonding wire BW), it is preferable not to dispose the resin material for the sealing portion 7 over the sensor plane SE of the sensor chip 3. Thus, it is possible to prevent the resin material for the sealing portion 7 from disturbing (blocking) input of light to the sensor plane SE of the sensor chip 3.

The optical components 5 and 6 are mounted over the front surface 3a of the sensor chip 3. The optical component 5 is mounted (disposed) to be fixed over the front surface 3a of the sensor chip 3 via an adhesive (adhesive layer, adhesive agent, or adhesive agent layer) 11 and the optical component is mounted (disposed) to be fixed over this optical component 5 via an adhesive (adhesive layer, adhesive agent, or adhesive agent layer) 12. The adhesives 11 and 12 are translucent adhesives which transmit light (transparent adhesive) and are cured. Since the adhesives 11 and 12 are the translucent adhesive (transparent adhesive), it is possible to prevent the adhesives 11 and 12 from disturbing (blocking) the input of light to the sensor plane SE of the sensor chip 3. The adhesives 11 and 12 and adhesives 11a and 12a to be described have translucency (light transmissivity) and are almost transparent.

Out of the optical components 5 and 6, the optical component (micro lens) 6 on the upper side (on the side farther from the front surface 3a of the sensor chip 3) is an optical component functioning as a lens. Note that the optical component 6 of the embodiment does not function to be one lens as a whole but has a plurality of lens portions 13. The optical component 6 has a front surface (lens portion formation surface) 6a which is a major surface on the side where the lens portions 13 are formed and a rear surface which is a major surface on the opposite side of the front surface 6a, and the rear surface of the optical component 6 is bonded to the optical component 5 via the adhesive 12.

The optical component 6 is formed by translucent material which transmits light (transparent material). As apparent also from FIG. 9 and FIG. 10(a), on the front surface 6a of the optical component 6, the lens portions 13 are formed (disposed) to be arranged regularly in vertical and horizontal directions (in an array) along the major surface of the optical component 6. The lens portions 13 disposed in an array on the front surface 6a of the optical component 6 correspond (one to one) to the light receiving elements PH disposed in an array in the sensor plane SE of the sensor chip 3, and the arrangement pitch (arrangement interval) $P_1$ of the light receiving elements PH in the sensor plane SE of the sensor chip 3 and the arrangement pitch (arrangement interval) $P_3$ of the lens portions 13 on the front surface 6a of the optical component 6 are the same ($P_1=P_3$).

Each of the lens portions 13 formed on the front surface 6a of the optical component 6 functions as one lens. The lens portions 13 formed on the front surface 6a of the optical component 6 function as separated lenses. Each of the lens portions 13 is made by forming translucent material (transparent material) such as acryl resin into a convex lens shape.

The optical component 6 can be made by means of using a glass member (glass base material or glass plate) including a flat plate shape as a base layer (base material layer) 14 and forming the lens portions 13 using the acryl resin or the like on the front surface (front surface of the base layer 14) out of a front surface and a rear surface of this base layer 14 having translucency (these front surface and rear surface are major surfaces opposite to each other). In this case, the thickness of the base layer 14 can be set to approximately 0.25 mm and that of the lens portion 13 (that of the lens portion 13 at the center part thereof) can be set to approximately 40 μm. Further, as another embodiment, it is also possible to replace the base layer 14 with acryl resin and form the whole optical component 6 combining the base layer 14 and the lens portion 13, with the acryl resin. By forming the lens portion 13 with the acryl resin, the lens portion 13 can be formed easily. Although the acryl resin is preferable for the material of the lens portion 13, its heat-proof temperature is comparatively as low as approximately 90° C.

Out of the optical components 5 and 6, the optical component (light blocking material) 5 on the lower side (on the side nearer to the front surface 3a of the sensor chip 3) is an optical component functioning as a light blocking material to prevent (block) input of light which is unnecessary for the plurality of light receiving elements PH formed on the sensor plane SE of the sensor chip 3. The optical component 5 has a front surface (light blocking film formation surface) 5a which is a major surface on the side where a light blocking layer (light blocking film) 15 is formed and a rear surface which is a major surface opposite to the front surface 5a, and the rear surface of the optical component 5 is bonded to the front surface 3a of the sensor chip 3 via the adhesive 11 and the front surface 5a of the optical component 5 is bonded to the rear surface of the optical component 6 via the adhesive 12.

Although the light blocking layer 15 is formed on the front surface 5a of the optical component 5 and this light blocking layer 15 is formed over the whole front surface 5a of the optical component 5, the light blocking layer 15 is provided with a plurality of opening portions (optical regions) 16 to form optical regions. The optical component 5 is formed with translucent material (transparent material) which transmits light in a part except the light blocking layer 15 (base layer 17), whereas the light blocking layer 15 is formed with light blocking material which does not transmit light (prevents light transmission or reflects light). Each of the opening portions 16 can function as the optical region and function as a region transmitting light. The optical component 5 provided with the light blocking layer 15 having the plurality of opening portions 16 as the optical regions can function to prevent light from entering the light receiving element PH in an oblique direction.

Specifically, the optical component 5 can be made by using a glass member (glass base material or glass plate) having a flat plate shape as the base layer (base material layer) 17 and forming the light blocking layer 15 with a metal film such as a chromium (Cr) film on the front surface (front surface of the base layer 17) out of a front surface and a rear surface of this base layer 17 having translucency (these front surface and the rear surface are major surfaces opposite to each other). The thickness of the base layer 17 can be set to approximately 150 μm and that of the light blocking layer 15 can be set to approximately several microns.

Each of the optical components 5 and 6 has a planar shape and a planar size slightly larger than the sensor plane SE, and each of the optical components 5 and 6 includes the sensor plane SE and also exposes the pad electrodes PD in a planar view in a state in which the optical components 5 and 6 are mounted over the sensor chip 3 from the bottom. The whole sensor plane SE is covered by the optical component 5 in a planar view and also the whole sensor plane SE is covered by the optical component 6 in a planar view, whereas the pad electrodes PD are in a state not overlapping the optical components 5 and 6 in a planar view (not covered by the optical components 5 and 6).

The optical component 5 and the optical component 6 can have approximately the same planar shape and planar size as each other. Further, the planar shapes of the sensor chip 3 and the sensor plane SE are quadrangular (more specifically, rectangular). Each of the optical components 5 and 6 can have a quadrangular shape (more specifically, rectangular shape) slightly larger than that of the sensor plane SE. Further, each of the optical components 5 and 6 can have a planar shape and a planar size in which three sides of the optical component (three sides except a side on the pad electrode PD side) approximately match three sides of the sensor chip 3 (three sides except a side on the pad electrode PD side). This is advantageous for reducing the area of the sensor module while keeping a disposition area for spacers SP1 and SP2.

In the sensor module MJ1, the optical component 5 is mounted over the front surface 3a of the sensor chip 3 via the adhesive 11 and the optical component 6 is mounted over the optical component 5 via the adhesive 12, and, as apparent also from FIG. 6 and FIG. 11, the optical components 5 and 6 are mounted so that each of the light receiving elements PH in the sensor plane SE of the sensor chip 3, each of the opening portions 16 in the light blocking layer 15 of the optical component 5, and each of the lens portions 13 of the optical component 6 overlap with one another in a planar configuration (in the planar view). Light collected by each of the lens portions 13 of the optical component 6 is input to each of the light receiving elements PH of the sensor plane SE in the front surface 3a of the sensor chip 3 via (through) each of the opening portions 16 in the light blocking layer 15 of the optical component 5.

Each of the opening portions 16 in the light blocking layer 15 of the optical component 5 can function to transmit light collected by each of the lens portions 13 of the optical component 6 and to input the light to each of the light receiving elements PH of the sensor plane SE in the front surface 3a of the sensor chip 3. On the other hand, the light blocking layer 15 of the optical component 5 can function to prevent light from entering each of the light receiving elements PH of the sensor plane SE in the front surface 3a of the sensor chip 3 in an oblique direction (direction inclined from a direction perpendicular to the front surface 3a of the sensor chip 3 in an angle of a predetermined angle or larger). Light transmitted through any of the lens portions 13 of the optical component 6 can pass through the opening portion 16 located directly under the lens portion 13 and can enter the light receiving element PH located directly under the lens portion 13, but cannot enter the light receiving element PH which is not located directly under the lens portion 13. Light entering one of the light receiving elements PH can be limited to light collected by one of the lens portions 13.

The arrangement (arrangement method) of the light receiving elements PH in the sensor plane SE of the sensor chip 3, the arrangement (arrangement method) of the opening portions 16 in the light blocking layer 15 on the front surface 5a of the optical component 5, and the arrangement (arrangement method) of the lens portions 13 on the front surface 6a of the optical component 6 are basically the same. The arrangement pitch (arrangement interval) $P_1$ of the light receiving elements PH in the sensor plane SE of the sensor chip 3, the arrangement pitch (arrangement interval) $P_2$ of the opening portions 16 in the light blocking layer 15 on the front surface 5a of the optical component 5, and the arrangement pitch (arrangement interval) $P_3$ of the lens portions 13 on the front surface 6a of the optical component 6 are the same ($P_1=P_2=P_3$). These arrangement pitches $P_1$ $P_2$ and $P_3$ can be set to be approximately 100 μm ($P_1=P_2=P_3=100$ μm). Further, when the 15,000 light receiving elements PH (100 rows×150 columns) are arranged (disposed) in the sensor plane SE of the sensor chip 3, accordingly the 15,000 opening portions 16 (100 rows×150 columns) are provided in the light blocking layer 15 on the front surface 5a of the optical component 5 and the 15,000 lens portions 13 (100 rows×150 columns) are provided on the front surface 6a of the optical component 6.

In the sensor module MJ1 in which the sensor chip 3 is mounted over the wiring substrate 2, the optical component 5 is mounted over the sensor chip 3, and the optical component 6 is mounted over the optical component 5, each of the light receiving elements PH in the sensor plane SE of the sensor chip 3, each of the opening portions 16 in the light blocking layer 15 of the optical component 5, and the lens portion 13 of the optical component 6 are arranged in a line in the up and down direction (direction perpendicular to the front surface 3a of the sensor chip 3). Preferably, the center line of each of the light receiving elements PH in the sensor plane SE of the sensor chip 3, the center line of each of the opening portions 16 in the light blocking layer 15 of the optical component 5, and the center line of the lens portion 13 of the optical component 6 approximately coincide with one another. Light collected by each of the lens portions 13 of the optical component 6 is allowed to enter properly each of the light receiving elements PH in the sensor plane SE on the front surface 3a of the sensor chip 3 via each of the opening portions 16 in the light blocking layer 15 of the optical component 5.

Further, in the sensor module MJ1 in which the optical component 5 is mounted over the sensor chip 3, as shown also in FIG. 6 and FIG. 11, each of the light receiving elements PH in the sensor plane SE of the sensor chip 3 is preferably included within each of the opening portions 16 in the light blocking layer 15 of the optical component 5 in a planar configuration (in the planar view). This purpose is to prevent the light blocking layer 15 from blocking light which should enter each of the light receiving elements PH. The size of each of the opening portions 16 in the light blocking layer 15 on the front surface 5a of the optical component 5 is preferably larger than the size of each of the opening portions for the light receiving element PH in the surface protection film on the front surface 3a of the sensor chip 3 (opening portion formed in the surface protection film of the sensor chip 3 and formed on the upper portion of the light receiving element PH to allow light to enter the light receiving element PH). The size of the opening portion corresponds to the length of its side when the opening portion has a square shape and corresponds to a diameter thereof when the opening portion has a circular shape. Each of the opening portions 16 in the light blocking layer 15 on the front surface 5a of the optical component 5 can have a circular shape with a diameter of approximately 27 μm or a rectangular shape with a side length of approximately 27 μm, and each of the opening portions for the light receiving element PH in the surface protection film of the sensor chip 3 can have a circular shape with a diameter of approximately 10 μm or a rectangular shape with a side length of approximately 10 μm.

Further, in the sensor module MJ1 in which the optical components 5 and 6 are mounted over the sensor chip 3, as shown also in FIG. 6 and FIG. 11, each of the light receiving elements PH in the sensor plane SE of the sensor chip 3 and each of the opening portions 16 in the light blocking layer 15 of the optical component 5 are preferably included in each of the lens portions 13 of the optical component 6 in a planer configuration (in the planar view).

Further, in the sensor module MJ1 of the embodiment, although the optical component 5 is bonded to the front surface 3a of the sensor chip 3 via the adhesive 11, not only the adhesive 11 but also the plurality of spacers SP1 is between the front surface 3a of the sensor chip 3 and the rear surface of the optical component 5. Further, although the optical component 6 is bonded to the front surface 5a of the optical component 5 via the adhesive 12, not only the adhesive 12 but also the plurality of spacers SP2 is between the front surface 5a of the optical component 5 and the rear surface of the optical component 6.

As described below, the spacer SP1, which is provided for defining a spacing between the front surface 3a of the sensor chip 3 and the rear surface of the optical component and for temporarily fixing the optical component 5 in manufacturing, is made of cured adhesive but formed in a step different from that of the adhesive 11. Further, the spacer SP2, which is provided for defining a spacing between the front surface 5a of the optical component 5 and the rear surface of the optical component 6 and for temporarily fixing the optical component 6 in manufacturing, is made of cured adhesive but formed in a step different from that of the adhesive 12.

<Sensor Module Manufacturing Step> Next, manufacturing steps for the sensor module MJ1 of the embodiment will be explained.

Figure 12:
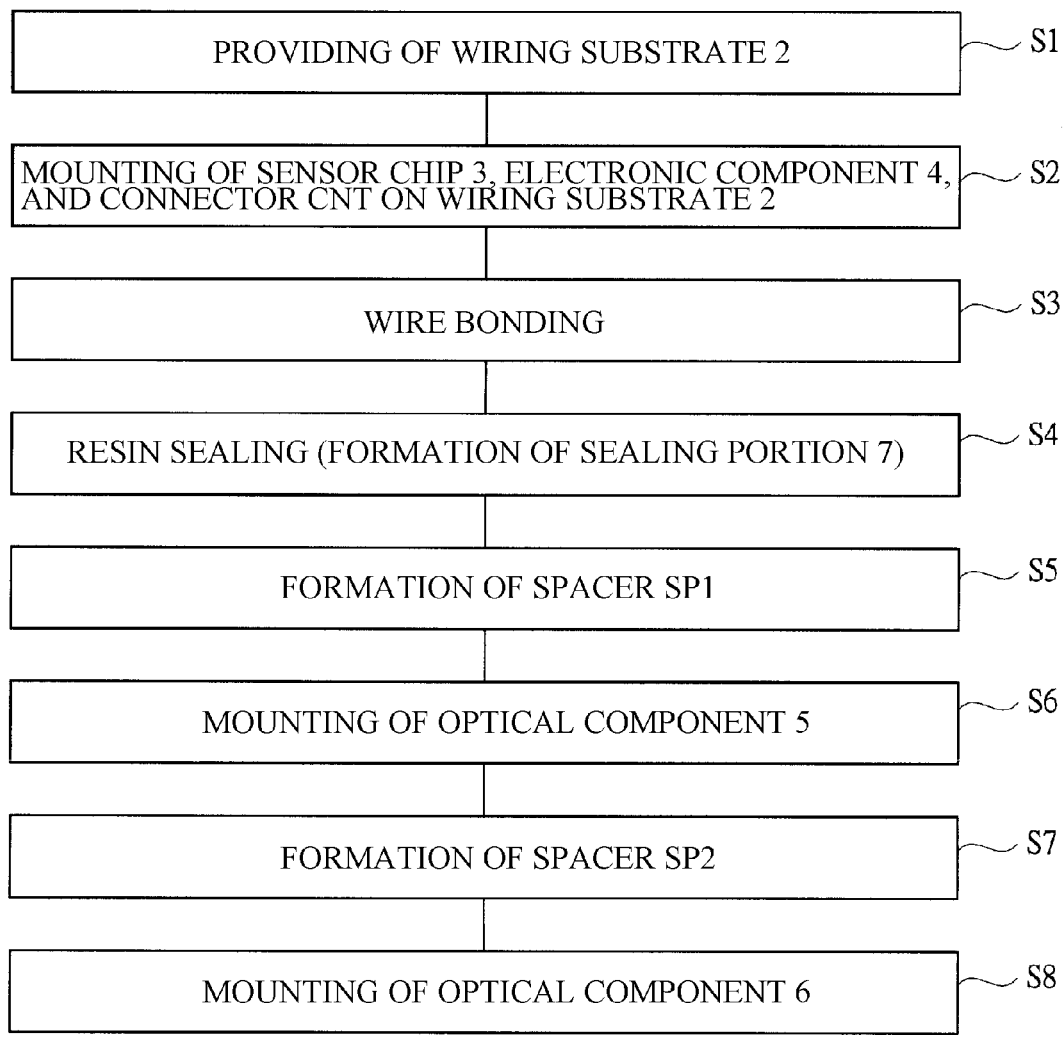
FIG. 12 is a manufacturing process flow chart showing manufacturing steps for a sensor module in accordance with an embodiment of the present invention.
Figure 13:
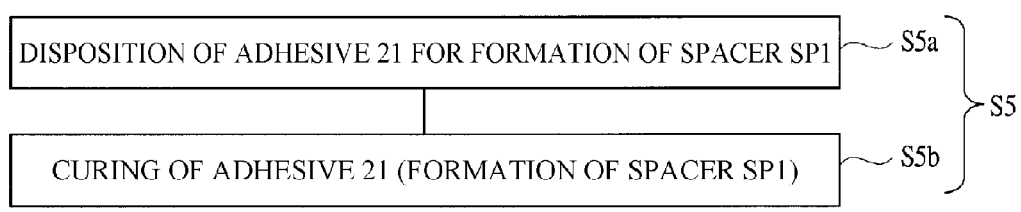
FIG. 13 is a process flowchart showing details of a spacer formation step of Step S5 among manufacturing steps for a sensor module in accordance with an embodiment of the present invention.
Figure 14:
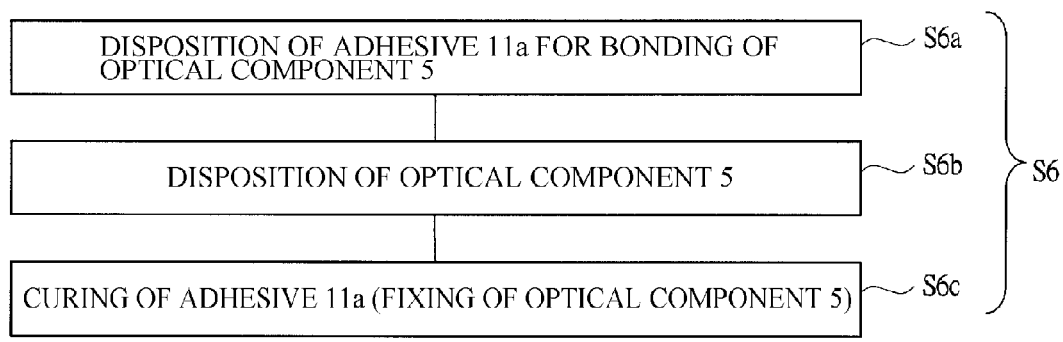
FIG. 14 is a process flow chart showing details of an optical component mounting step of Step S6 among manufacturing steps for a sensor module in accordance with an embodiment of the present invention.
Figure 15:
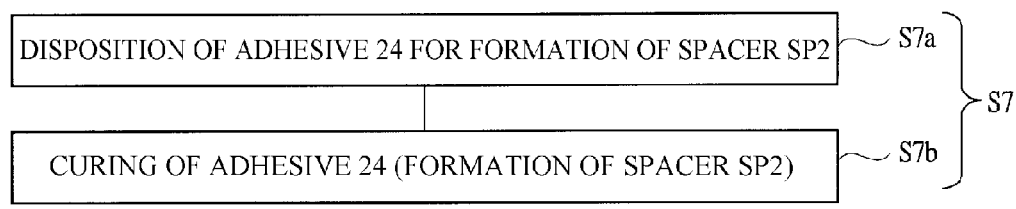
FIG. 15 is a process flow chart showing details of a spacer formation step of Step S7 among manufacturing steps for a sensor module in accordance with an embodiment of the present invention.
Figure 16:
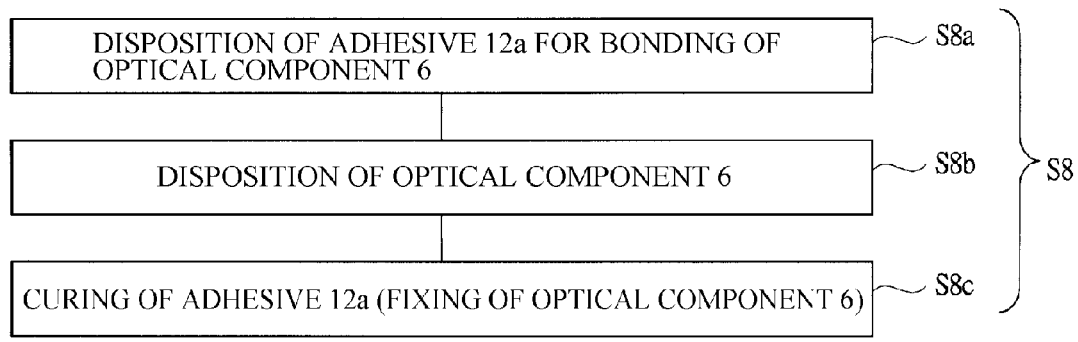
FIG. 16 is a process flow chart showing details of an optical component mounting step of Step S8 among manufacturing steps for a sensor module in accordance with an embodiment of the present invention.
Figure 17:
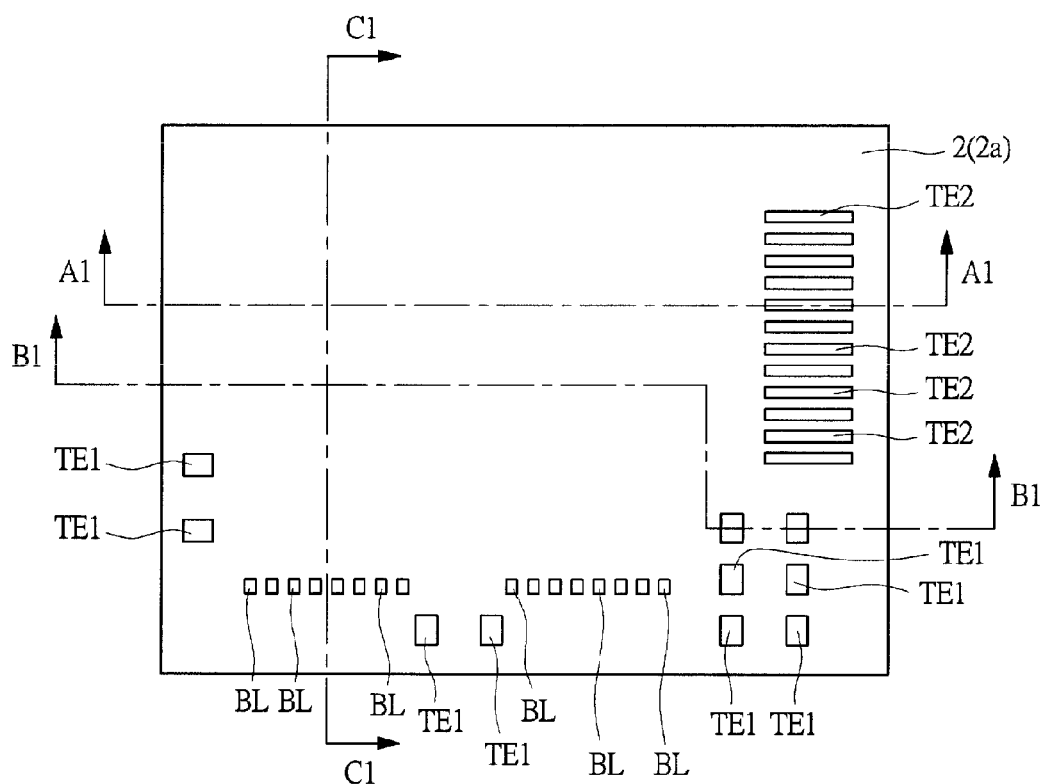
FIG. 17 is a top view of a wiring substrate used for manufacturing of a sensor module in accordance with an embodiment of the present invention.
Figure 18:
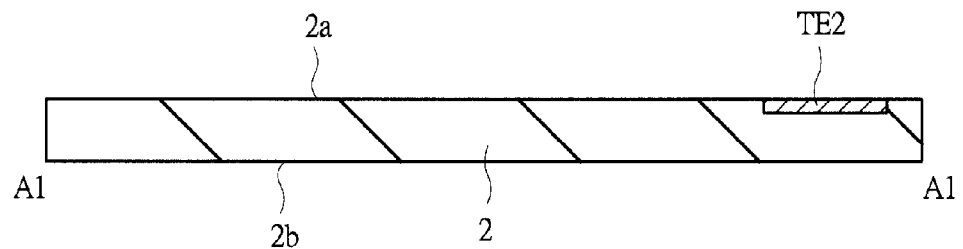
FIG. 18 is a cross-sectional view (A1-A1 cross-sectional view) of a wiring substrate used for manufacturing of a sensor module in accordance with an embodiment of the present invention.
Figure 19:
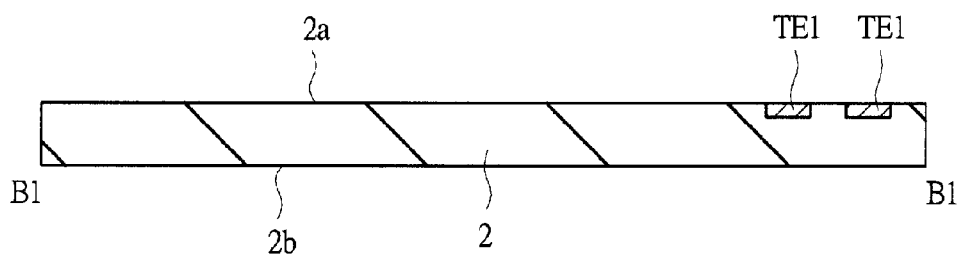
FIG. 19 is a cross-sectional view (B1-B1 cross-sectional view) of a wiring substrate used for manufacturing of a sensor module in accordance with an embodiment of the present invention.
Figure 20:
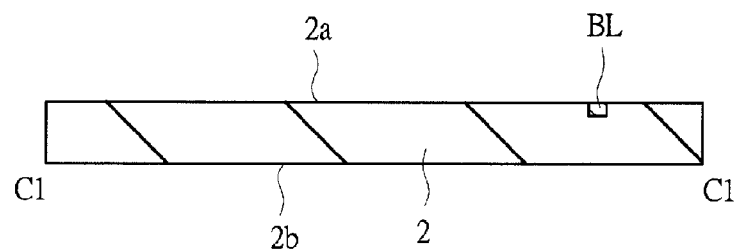
FIG. 20 is a cross-sectional view (C1-C1 cross-sectional view) of a wiring substrate used for manufacturing of a sensor module in accordance with an embodiment of the present invention.

FIG. 12 is a process flow chart showing manufacturing steps for the sensor module MJ1 in accordance with the embodiment. FIG. 13 is a process flow chart showing details of a spacer SP1 formation step of Step S5 among the manufacturing steps of the sensor module MJ1. FIG. 14 is a process flow chart showing details of an optical component mounting step of Step S6 among the manufacturing steps of the sensor module MJ1. FIG. 15 is a process flow chart showing details of a spacer SP2 formation step of Step S7 among the manufacturing steps of the sensor module MJ1. FIG. 16 is a process flow chart showing details of an optical component mounting step of Step S8 among the manufacturing steps of the sensor module MJ1. FIG. 17 is a top view of the wiring substrate 2 to be used for the manufacturing of the sensor module MJ1, and FIG. 18 to FIG. 20 are its cross-sectional views. A cross section at the A1-A1 line of FIG. 17 corresponds approximately to FIG. 18 (A1-A1 cross-sectional view). A cross section at the B1-B1 line of FIG. 17 corresponds approximately to FIG. 19 (B1-B1 cross-sectional view). A cross section at the C1-C1 line of FIG. 17 corresponds approximately to FIG. 20 (C1-C1 cross-sectional view). The positions of the A1-A1 line, the B1-B1 line, and the C1-C1 line of FIG. 17 correspond to those of the A1-A1 line, the B1-B1 line, and the C1-C1 line of FIG. 1, respectively. Further, each of FIG. 21 to FIG. 70 is a plan view, a cross-sectional view, or an explanatory diagram in the manufacturing step of the sensor module MJ1 in accordance with the embodiment.

To manufacture the sensor module MJ1, the wiring substrate 2 as shown in FIG. 17 to FIG. 20 is provided (Step S1 of FIG. 12) first. The basic configuration of the wiring substrate 2 has been described above and its detailed explanation is omitted.

To explain briefly, as shown in FIG. 17 to FIG. 20, the wiring substrate 2 has the upper surface 2a and the lower surface 2b opposite to the upper surface 2a, and the plurality of bonding leads BL for wire bonding, the plurality of terminals TE1 for coupling the electronic component 4, and the plurality of terminals TE2 for connecting the connector CNT are formed as electrodes on the upper surface 2a of the wiring substrate 2.

After the wiring substrate 2 has been provided (prepared) as shown in FIG. 17 to FIG. 20, the sensor chip 3, the electronic component 4, and the connector CNT are assembled (mounted) on the upper surface 2a of the wiring substrate 2 as shown in FIG. 21 to FIG. 24 (Step S2 of FIG. 12). Note that the specific configuration of the sensor chip 3 has been explained above and its repeated explanation is omitted.

Figure 21:
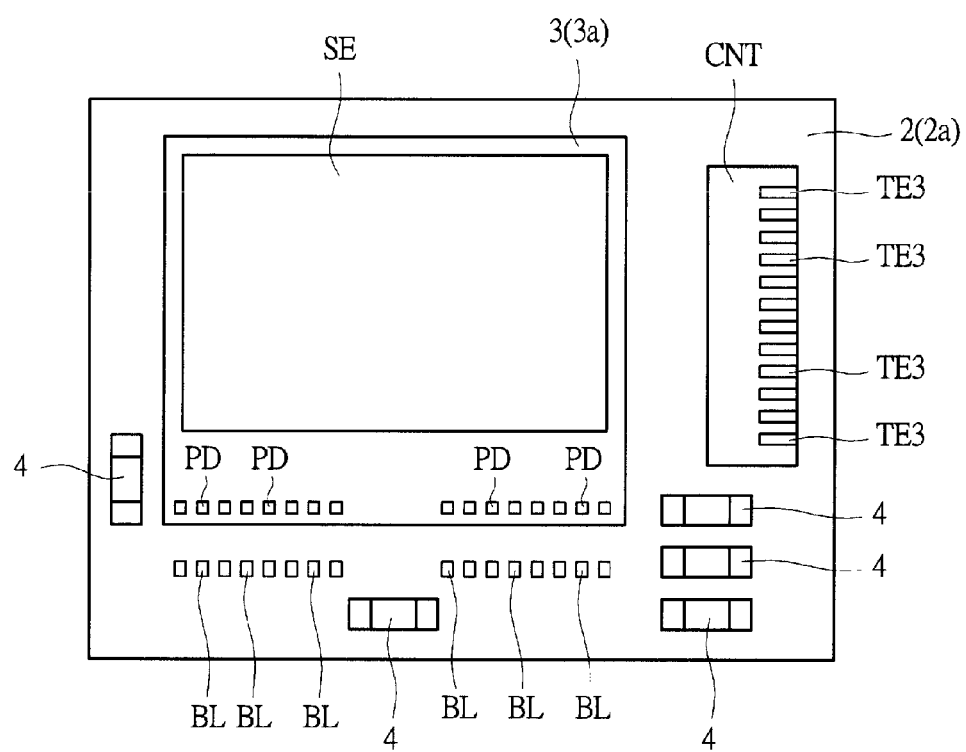
FIG. 21 is a plan view (top view) of a sensor module in accordance with an embodiment of the present invention, in a manufacturing step.
Figure 22:
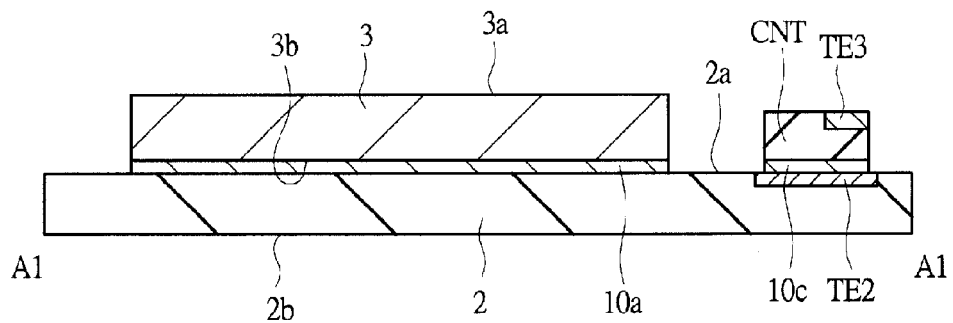
FIG. 22 is a cross-sectional view (A1-A1 cross-sectional view) of the same sensor module as that in FIG. 21 in a manufacturing step.
Figure 23:
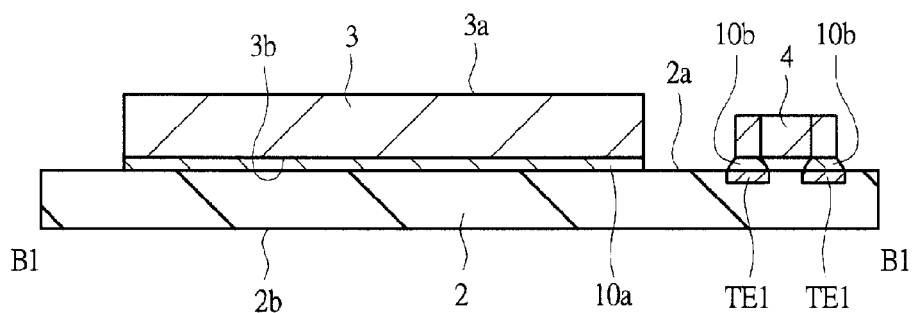
FIG. 23 is a cross-sectional view (B1-B1 cross-sectional view) of the same sensor module as that in FIG. 21 in a manufacturing step.
Figure 24:
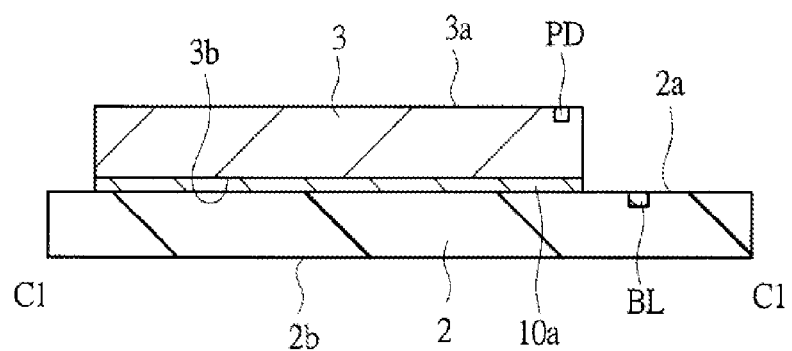
FIG. 24 is a cross-sectional view (C1-C1 cross-sectional view) of the same sensor module as that in FIG. 21 in a manufacturing step.

FIG. 21 (top view), FIG. 22 (A1-A1 cross-sectional view), FIG. 23 (B1-B1 cross-sectional view), and FIG. 24 (C1-C1 cross-sectional view) are a top view and cross-sectional views corresponding to FIG. 17, FIG. 18, FIG. 19, and FIG. 20, respectively, and show a step (state) after Step S2 (assembly step) has been performed.

An assembly step of components (sensor chip 3, electronic component 4, and connector CNT) in Step S2 is specifically explained as follows.

First, bonding material (solder or the like) is coated or printed on the upper surface 2a of the wiring substrate 2 in regions where the sensor chip 3, the electronic component 4, and the connector CNT are to be mounted (more specifically, in a region facing the rear surface 3b of the sensor chip 3 in the mounting of the sensor chip 3, and in regions over the terminals TE1 and TE2). Then, the sensor chip 3, the electronic component 4, and the connector CNT are mounted on the upper surface 2a of the wiring substrate 2. At this time, the sensor chip 3 is mounted on the upper surface 2a of the wiring substrate 2 so that the rear surface 3b side is directed downward (to the wiring substrate 2 side) and the front surface 3a side is directed upward (face-up bonding). In Step S2, the sensor chip 3 is mounted on the upper surface 2a of the wiring substrate 2 so that the rear surface 3b of the sensor chip 3 faces the upper surface 2a of the wiring substrate 2. Further, when the electronic component 4 includes a semiconductor chip, such as a memory chip, the semiconductor chip is disposed over the upper surface 2a of the wiring substrate 2 so that a solder pad (bump electrode) of the semiconductor chip faces the terminal TE1. Then, by solder reflow processing, the sensor chip 3, the electronic component 4, and the connector CNT are adhered (fixed) to the wiring substrate 2 via the bonding material, such as solder. Thus, the sensor chip 3, the electronic component 4, and the connector CNT can be assembled (mounted) on the upper surface 2a of the wiring substrate 2.

Further, the sensor chip 3 assembly step (die bonding step) and the electronic component 4 assembly step can be separated steps. Different bonding materials can be also used as the bonding materials (die bonding material) to assembly the sensor chip 3 and as the bonding material to assemble the electronic component 4 and the connector CNT. Heat curable paste material, such as conductive paste type bonding material (silver paste) or insulating paste type bonding material, can be used as the die bonding material for the sensor chip 3. Solder can be used as the bonding material for the electronic component 4 and the connector CNT.

In the assembly step of Step S2, the sensor chip 3 is fixed (adhered) to the wiring substrate 2 (upper surface 2a thereof) by the bonding material (die bonding material) 10a. Further, for the passive component (chip component) out of the electronic components 4, the electrode of the passive component (chip component) is electrically and mechanically connected (fixed) to the terminal TE1 of the wiring substrate 2 via the bonding material 10b (solder). Further, if a semiconductor chip, such as a memory chip, is used as the electronic component 4, a solder bump of the semiconductor chip is electrically and mechanically connected (fixed) to the terminal TE1 of the wiring substrate 2. Further, the connector CNT is electrically and mechanically connected (fixed) to the terminal TE2 of the wiring substrate 2 via the bonding material 10c (solder).

The sensor chip 3, the electronic component 4, and the connector CNT are assembled and fixed on the upper surface 2a of the wiring substrate 2, and also each of the electrodes in each of the electronic components 4 is connected electrically to each of the terminals TE1 to be connected with the electronic components on the upper surface 2a of the wiring substrate 2 and each of the terminals TE3 of the connector CNT is connected electrically to each of the terminals TE2 of the wiring substrate 2.

After the assembly step of the various components (sensor chip 3, electronic component 4, and connector CNT) in Step S2, as shown in FIG. 25 to FIG. 28, the pad electrodes PD on the front surface 3a of the sensor chip 3 and the bonding leads BL on the upper surface 2a of the wiring substrate 2 are connected electrically to each other via the bonding wires BW by a wire bonding step (Step S3 of FIG. 12). A first end of each of the bonding wires BW is connected to the pad electrode PD of the sensor chip 3 at a first end of the wire. A second end of each of the bonding wires BW is connected to the bonding lead BL of the wiring substrate 2.

Figure 25:
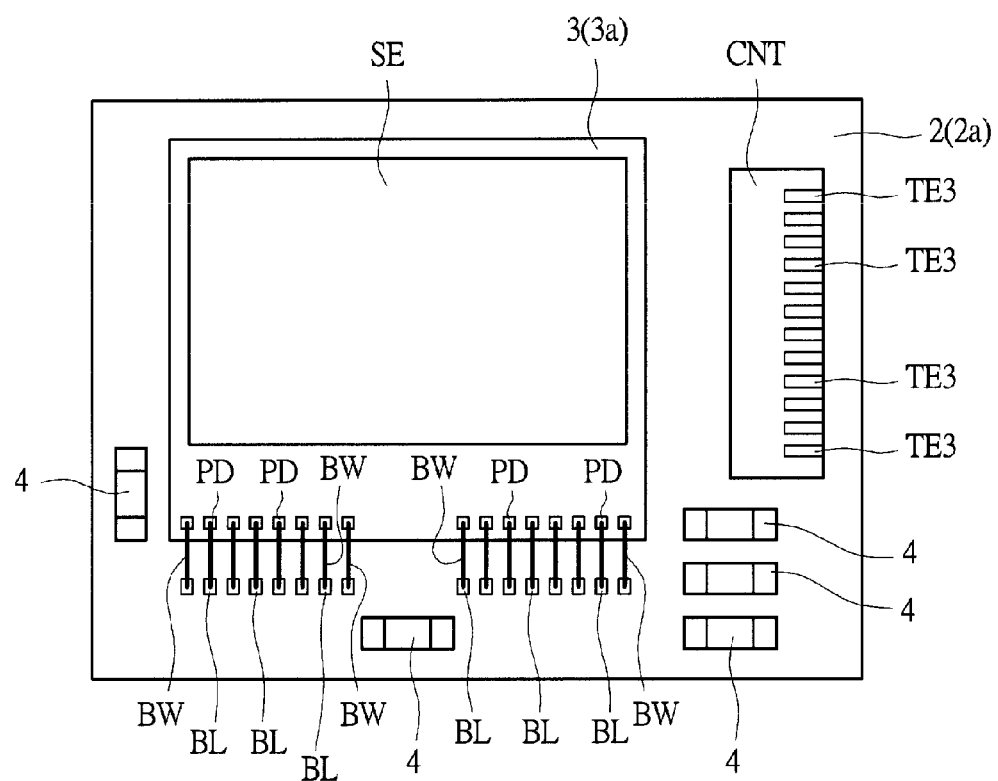
FIG. 25 is a plan view (top view) of a sensor module in a manufacturing step following FIG. 21.
Figure 26:
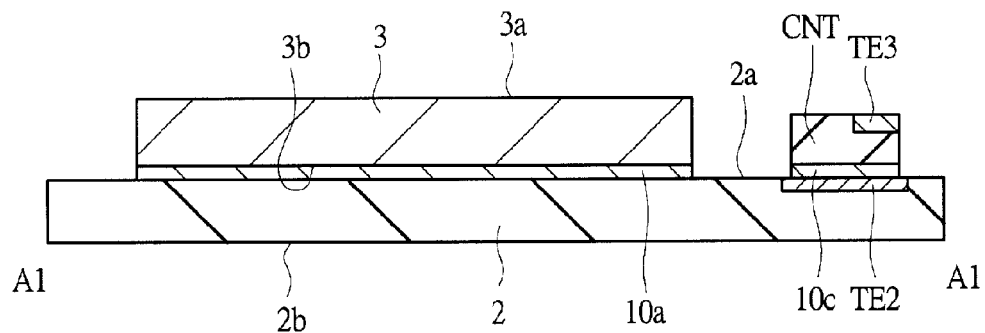
FIG. 26 is a cross-sectional view (A1-A1 cross-sectional view) of the same sensor module as that in FIG. 25 in a manufacturing step.
Figure 27:
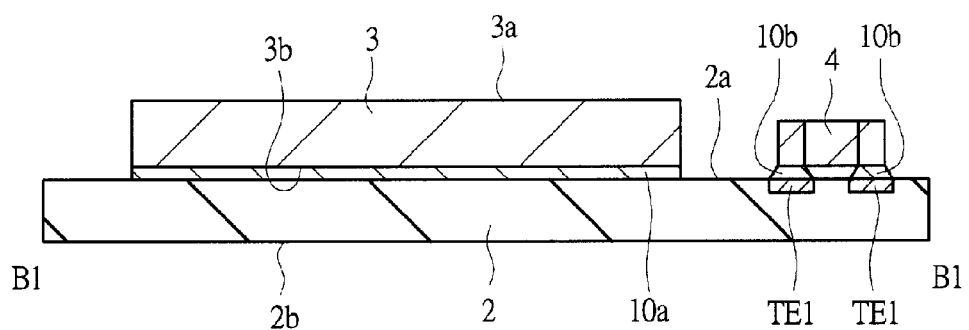
FIG. 27 is a cross-sectional view (B1-B1 cross-sectional view) of the same sensor module as that in FIG. 25 in a manufacturing step.
Figure 28:
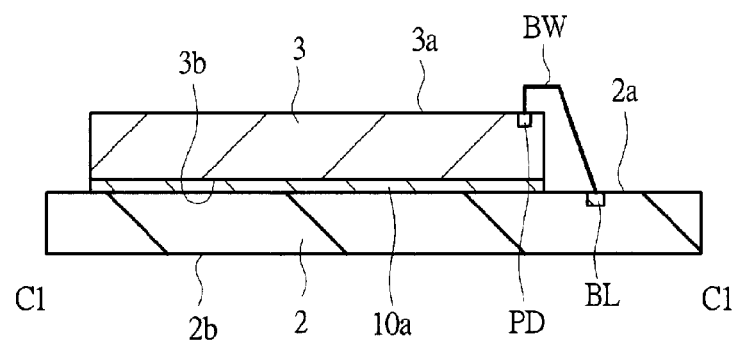
FIG. 28 is a cross-sectional view (C1-C1 cross-sectional view) of the same sensor module as that in FIG. 25 in a manufacturing step.

FIG. 25 (top view), FIG. 26 (A1-A1 cross-sectional view), FIG. 27 (B1-B1 cross-sectional view), and FIG. 28 (C1-C1 cross-sectional view) are a top view and cross-sectional views corresponding to FIG. 17, FIG. 18, FIG. 19, and FIG. 20, respectively, and show a step (state) after Step S3 (wire bonding step) has been performed.

After the wire bonding step of Step S3, as shown in FIG. 29 to FIG. 32, the sealing portion 7 is formed over the upper surface 2a of the wiring substrate 2 (Step S4 of FIG. 12).

Figure 29:
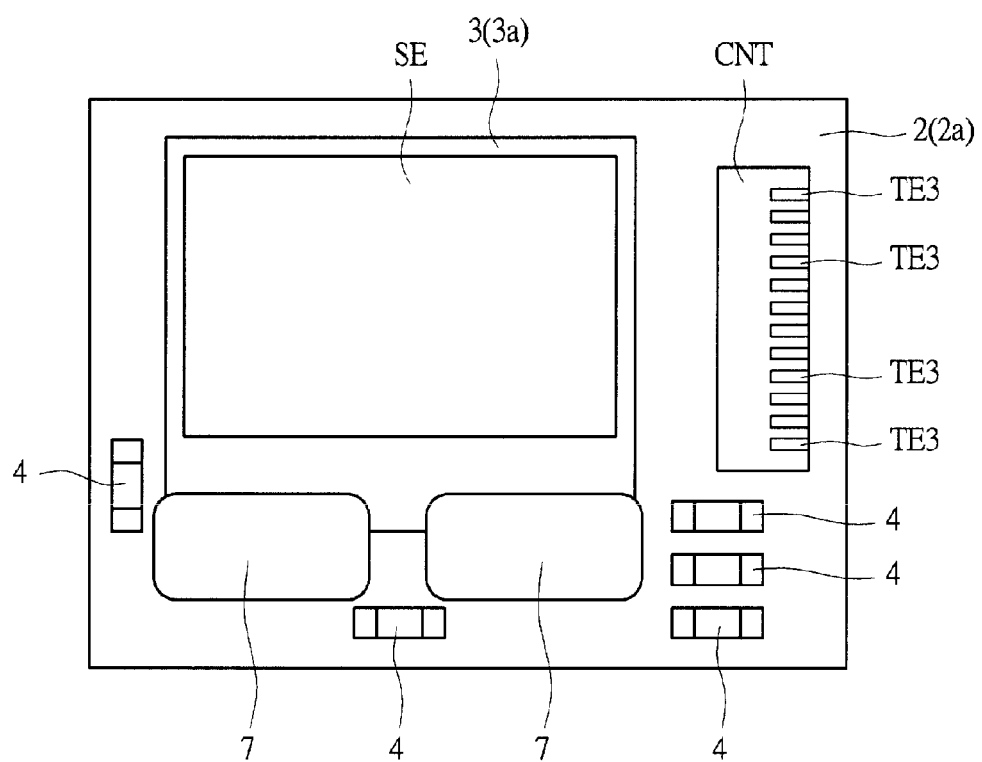
FIG. 29 is a plan view (top view) of a sensor module in a manufacturing step following FIG. 25.
Figure 30:
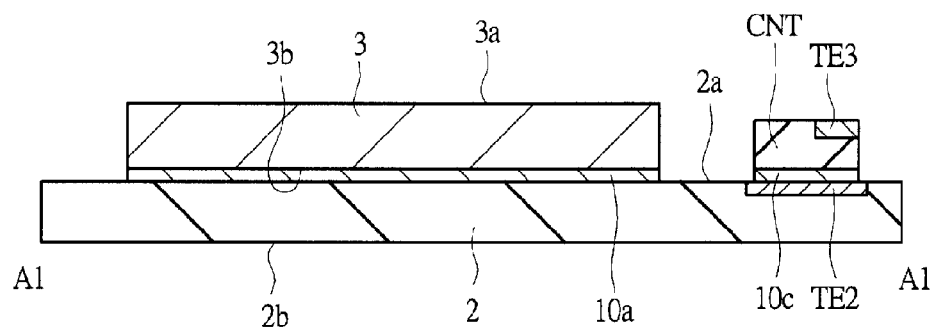
FIG. 30 is a cross-sectional view (A1-A1 cross-sectional view) of the same sensor module as that in FIG. 29 in a manufacturing step.
Figure 31:
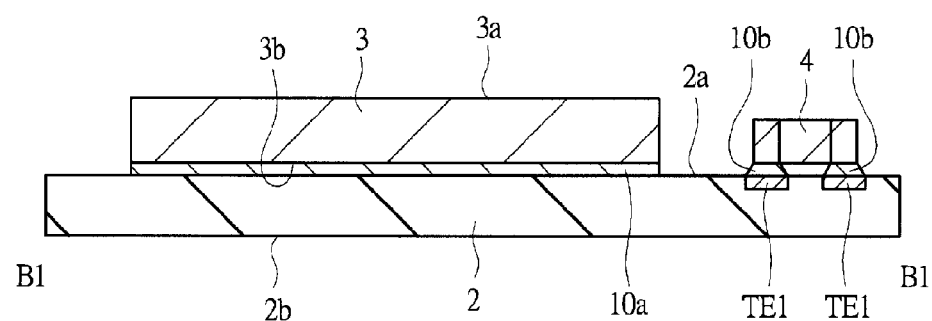
FIG. 31 is a cross-sectional view (B1-B1 cross-sectional view) of the same sensor module as that in FIG. 29 in a manufacturing step.
Figure 32:
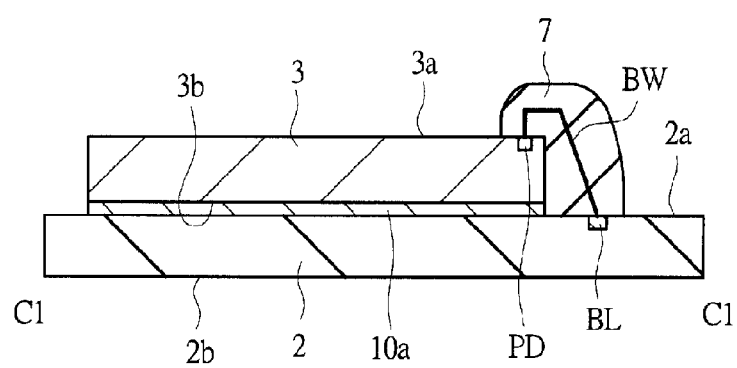
FIG. 32 is a cross-sectional view (C1-C1 cross-sectional view) of the same sensor module as that in FIG. 29 in a manufacturing step.

FIG. 29 (top view), FIG. 30 (A1-A1 cross-sectional view), FIG. 31 (B1-B1 cross-sectional view), and FIG. 32 (C1-C1 cross-sectional view) are a top view and cross-sectional views corresponding to FIG. 17, FIG. 18, FIG. 19, and FIG. 20, respectively, and show a step (state) after Step S4 (sealing portion 7 formation step) has been performed.

The sealing portion 7 formation step of Step S4 can be performed as follows. First, material (resin material) for forming the sealing portion 7 is supplied (disposed) over the upper surface 2a of the wiring substrate 2 to cover the bonding wires BW. This material (resin material) for forming the sealing portion 7 is made of resin material, such as heat curable resin material, and also can include a filler. Epoxy resin, silicone resin or the like can be used for the material (resin material) for forming the sealing portion 7. Then, the material (resin material) for forming the sealing portion 7 is cured. When the material (resin material) for forming the sealing portion 7 is heat curable resin, the material (resin material) for forming the sealing portion 7 can be cured by performing heat treatment (heating processing). Thus, the sealing portion 7 made of the cured resin material (resin material for forming the sealing portion 7) is formed.

In Step S4, the sealing portion 7 is formed to cover the bonding wire BW (not to expose the bonding wire BW). Thus, the connection portion between the pad electrode PD of the sensor chip 3 and the bonding wire BW, the connection portion between the bonding leads BL of the wiring substrate 2 and the bonding wire BW, and the bonding wire BW are sealed and protected by the sealing portion 7.

Further, although the sealing portion 7 is formed to cover the bonding wire BW (not to expose the bonding wire BW), it is preferable not to dispose the resin material for the sealing portion 7 over the sensor plane SE of the sensor chip 3, and it is possible to prevent the resin material for the sealing portion 7 from disturbing (blocking) the input of light to the sensor plane SE of the sensor chip 3.

After the sealing portion 7 formation step of Step S4, as shown in FIG. 33 to FIG. 37, the spacer SP1 is formed on the front surface 3a of the sensor chip 3 (Step S5 of FIG. 12).

Figure 33:
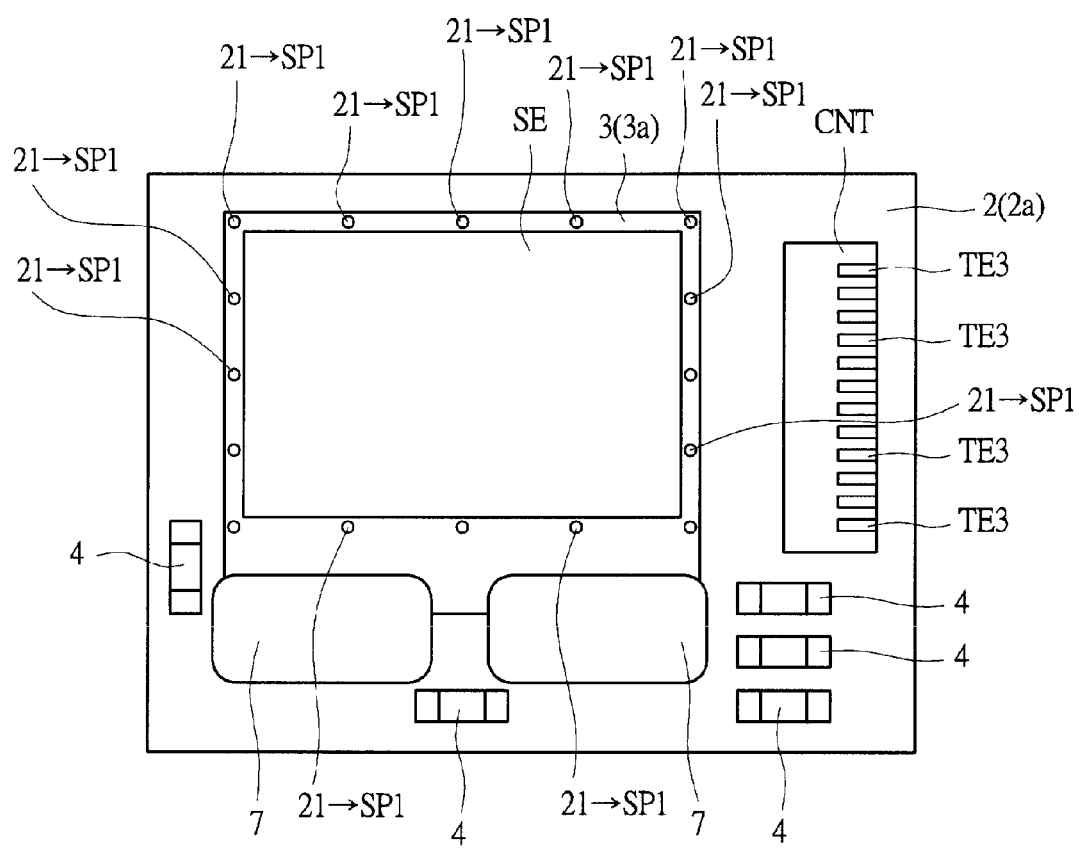
FIG. 33 is a plan view (top view) of a sensor module in a manufacturing step following FIG. 29.
Figure 34:
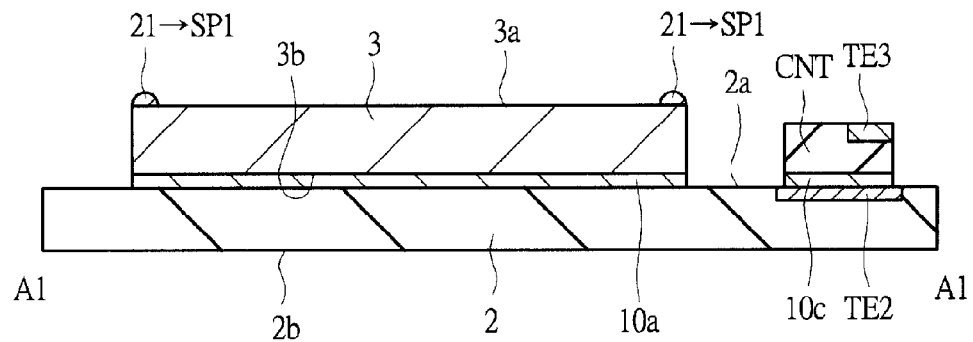
FIG. 34 is a cross-sectional view (A1-A1 cross-sectional view) of the same sensor module as that in FIG. 33 in a manufacturing step.
Figure 35:
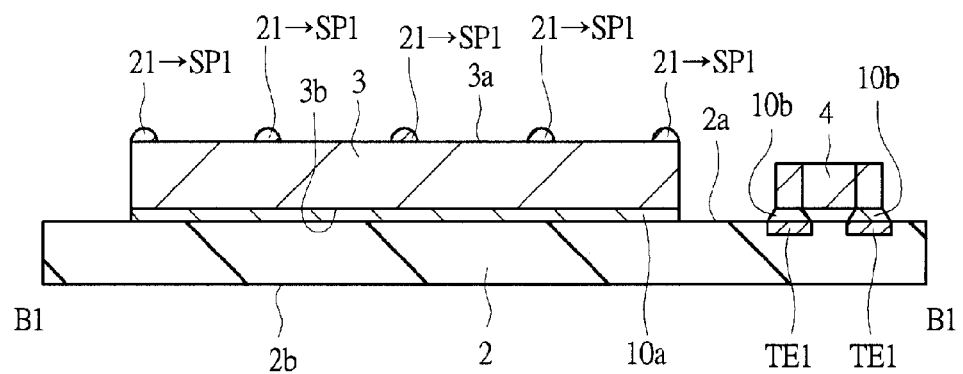
FIG. 35 is a cross-sectional view (B1-B1 cross-sectional view) of the same sensor module as that in FIG. 33 in a manufacturing step.
Figure 36:
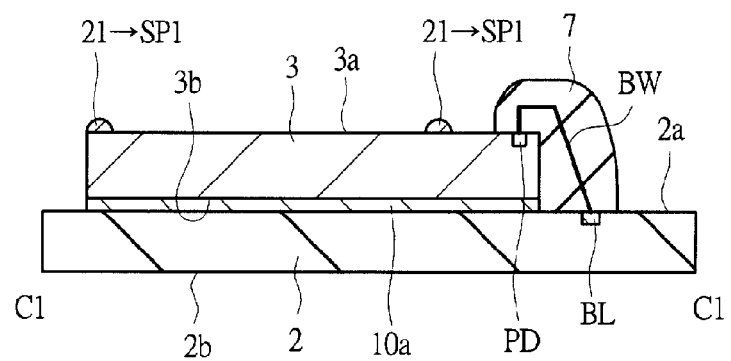
FIG. 36 is a cross-sectional view (C1-C1 cross-sectional view) of the same sensor module as that in FIG. 33 in a manufacturing step.
Figure 37:
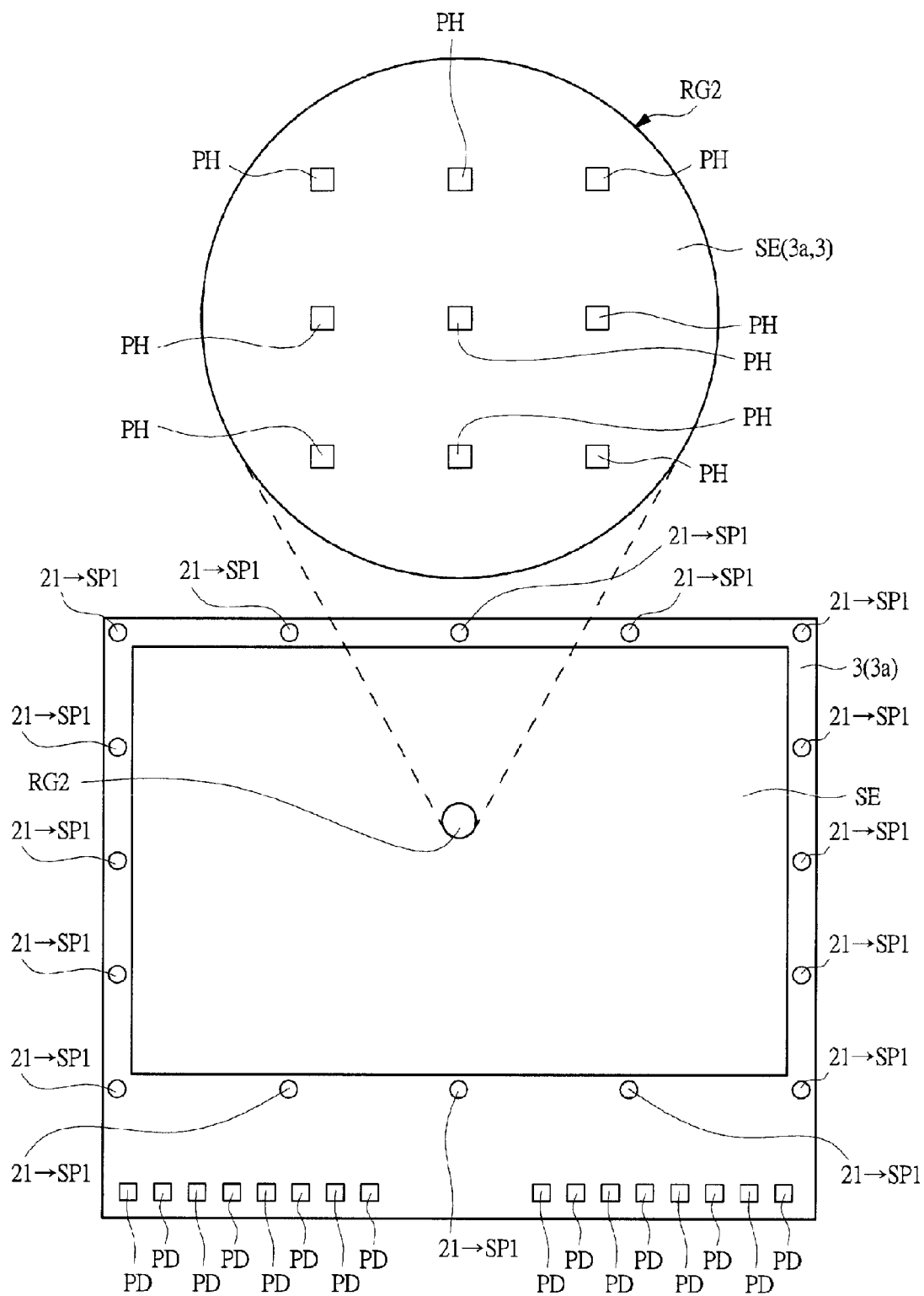
FIG. 37 is a plan view showing a sensor chip in the same process step as that of FIG. 33 to FIG. 36.

FIG. 33 (top view), FIG. 34 (A1-A1 cross-sectional view), FIG. 35 (B1-B1 cross-sectional view), and FIG. 36 (C1-C1 cross-sectional view) are a top view and cross-sectional views corresponding to FIG. 17, FIG. 18, FIG. 19, and FIG. 20, respectively, and show a step (state) after Step S5 (spacer SP1 formation step) has been performed. Further, FIG. 37 is a plan view (top view) showing the sensor chip 3 in the same process step as that of FIG. 33 to FIG. 36, and corresponds to FIG. 7. FIG. 37 is a view through the sealing portion 7 and the bonding wire BW.

The spacer SP1 formation step of Step S5 can be performed as follows. First, an adhesive (adhesive agent) 21 for forming the spacer SP1 is disposed (supplied or coated) on the front surface 3a of the sensor chip 3 at a plurality of positions (step S5a in FIG. 13). Then, by curing this adhesive 21, the plurality of spacers SP1 is formed on the front surface 3a of the sensor chip 3 (Step S5b in FIG. 13).

The spacer SP1 is the cured adhesive 21. The spacers SP1 are formed at the plurality of positions in the region where the optical component 5 is to be mounted on the front surface 3a of the sensor chip 3.

The spacer SP1 is provided for defining the spacing between the rear surface of the optical component 5, which is to be mounted over the sensor chip 3 later, and the front surface 3a of the sensor chip 3, and for fixing the optical component 5 temporarily until an adhesive 11a to be described below is cured. The spacer SP1 is required to have adherence (viscosity or tackness) for temporarily fixing the optical component 5.

The adhesive 21 has a higher viscosity by the curing step of Step S5b. Accordingly, the curing step of the adhesive 21 in Step S5b also can be considered to be processing for increasing the viscosity of the adhesive 21. When the viscosity of the adhesive 21 in the disposition step of Step S5a, in which the adhesive 21 is disposed on the front surface 3a of the sensor chip 3 at the plurality of positions, is denoted by a viscosity (first viscosity) $V_1$ and the viscosity of the adhesive 21 after the curing in Step S5b (the viscosity of the spacer SP1) is denoted by a viscosity (second viscosity) $V_2$, the viscosity (second viscosity) $V_2$ becomes higher than the viscosity (first viscosity) $V_1$ ($V_2 > V_1$). Accordingly, the spacer SP1 formed in Step S5b (adhesive 21 cured by Step S5b) has the viscosity $V_2$ higher than the viscosity $V_1$ of the adhesive 21 disposed on the front surface 3a of the sensor chip 3 in Step S5a and also has adherence (viscosity or tackness).

As the adhesive 21 to be disposed on the front surface 3a of the sensor chip 3 in Step S5a, ultraviolet curable adhesive is preferred. In Step S5b, the spacer SP1 is formed by curing the adhesive 21 by irradiating the adhesive 21 on the front surface 3a of the sensor chip 3 with ultraviolet light.

Further, the ultraviolet curable adhesive is not cured completely and tends to have a state keeping adherence (viscosity or tackness) at its surface exposed to air (contacting air) even when irradiated with ultraviolet light. Accordingly, it is preferable to use the ultraviolet curable adhesive as the adhesive 21 for forming the spacer SP1 and to cure the adhesive 21 by irradiating the adhesive 21 with ultraviolet light in a state in which the surface of the adhesive 21 disposed over the front surface 3a of the sensor chip 3 contacts air (is exposed to air), for forming the spacer SP1 in Step S5b. The spacer SP1 can be formed easily and appropriately to have adherence (viscosity or tackness) which is necessary for temporarily fixing the optical component 5.

Further, as the adhesive 21 to be disposed on the front surface 3a of the sensor chip 3 in Step S5a, preferably adhesive having a somewhat high viscosity (viscosity higher than that of the adhesives 11a and 12a to be described below) is used. It is possible to cause the adhesive 21 disposed on the front surface 3a of the sensor chip 3 not to spread easily in a lateral direction (planar direction or direction parallel to the front surface 3a of the sensor chip 3) and easily to form the spacer SP1 having a predetermined shape (height).

Further, the spacer SP1 is preferably formed at a position avoiding the sensor plane (sensor region) SE on the front surface 3a of the sensor chip 3 (outside the sensor plane SE). This can be realized by setting the disposition position of the adhesive 21 to a position avoiding the sensor plane SE on the front surface 3a of the sensor chip 3 (outside the sensor plane SE) in Step S5a. The spacer SP1 does not affect the input of light to the light receiving element PH in the sensor plane SE. The spacer SP1 can use adhesive which easily forms the spacer SP1 appropriately, as the adhesive 21 without consideration of translucency.

Further, the spacer SP1 is more preferably formed in the periphery of the sensor plane SE on the front surface 3a of the sensor chip 3 (further preferably, along each side of the sensor plane SE (each of the four sides)) in a planar view. When the optical component 5 is disposed later over the front surface 3a of the sensor chip 3, it becomes possible appropriately to define the spacing between the front surface 3a of the sensor chip 3 and the rear surface of the optical component 5 by the spacer SP1 and it becomes possible appropriately to define the layer thickness of the adhesive 11 by the height of the spacer SP1.

When the plurality of spacers SP1 is connected (integrated) with one another in a plane and formed as an integrated object to surround the sensor plane SE perfectly on the front surface 3a of the sensor chip 3, it may be impossible to keep a flow path (route) for ejecting air caught during the disposition of the optical component 5 in Step S6b to be described below from a space between the sensor chip 3 and the optical component 5 to the outside. Although the plurality of spacers SP1 is formed on the front surface 3a of the sensor chip 3, the plurality of spacers SP1 is preferably formed for each of the sides (each of the four sides) of the sensor plane SE which has a planar shape of a quadrangle. At this time, each of the spacers SP1 is preferably formed locally. Thus, the flow path (route) ejecting air and the like from the space between the sensor chip 3 and the optical component 5 to the outside can be kept at not only a corner part but also each side of the sensor plane SE, and it is possible to control or prevent the generation of a void between the sensor chip 3 and the optical component 5.

After the spacer SP1 formation step of Step S5, the optical component 5 is mounted on the front surface 3a of the sensor chip 3 (Step S6 in FIG. 12). The specific configuration of the optical component 5 has been described above and its repeated explanation is omitted.

Figure 38:
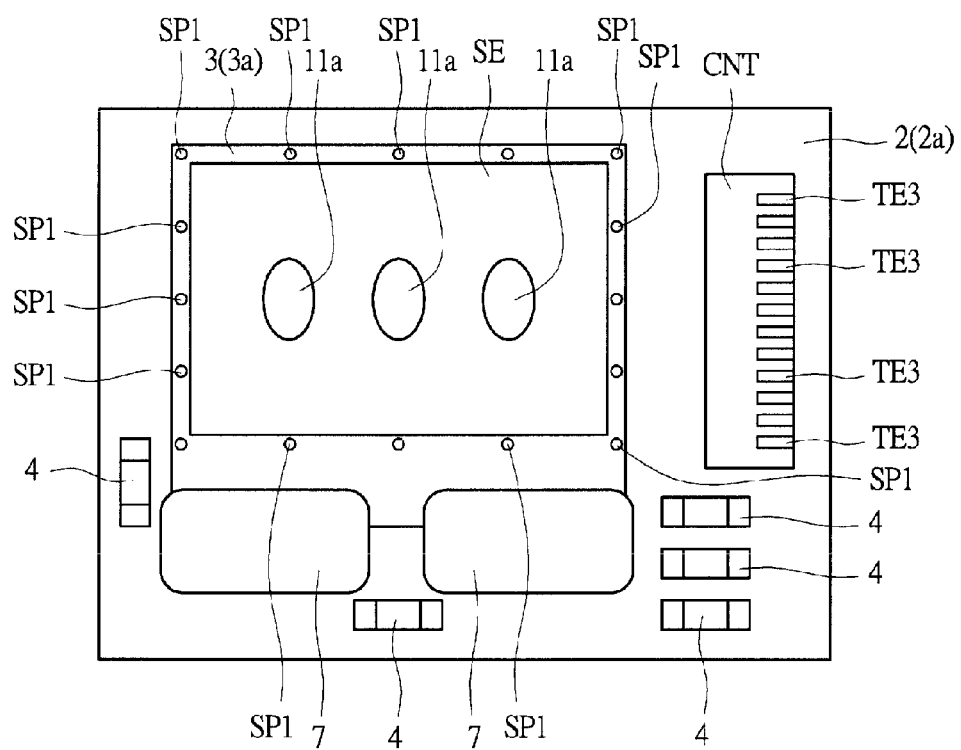
FIG. 38 is a plan view (top view) of a sensor module in a manufacturing step following FIG. 33.
Figure 39:
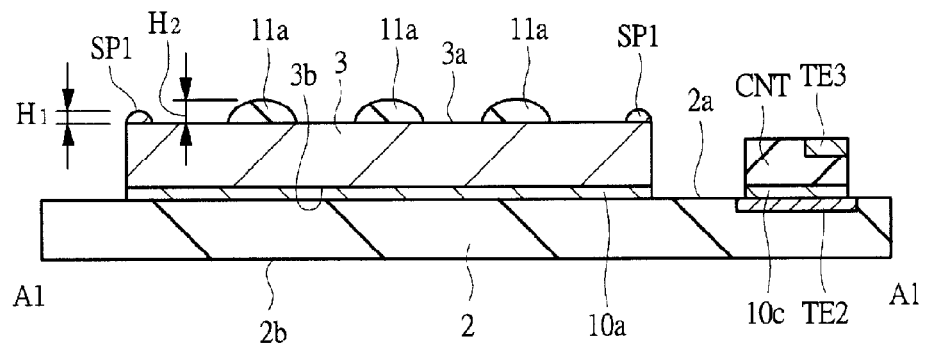
FIG. 39 is a cross-sectional view (A1-A1 cross-sectional view) of the same sensor module as that in FIG. 38 in a manufacturing step.
Figure 40:
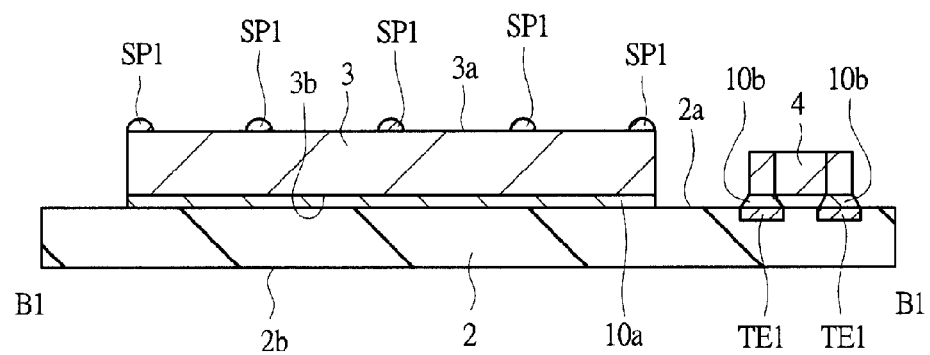
FIG. 40 is a cross-sectional view (B1-B1 cross-sectional view) of the same sensor module as that in FIG. 38 in a manufacturing step.
Figure 41:
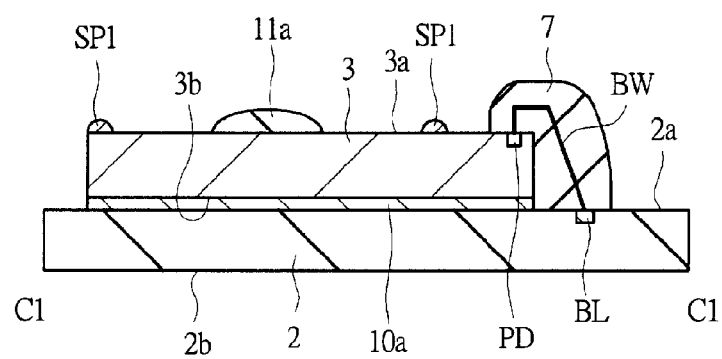
FIG. 41 is a cross-sectional view (C1-C1 cross-sectional view) of the same sensor module as that in FIG. 38 in a manufacturing step.
Figure 42:
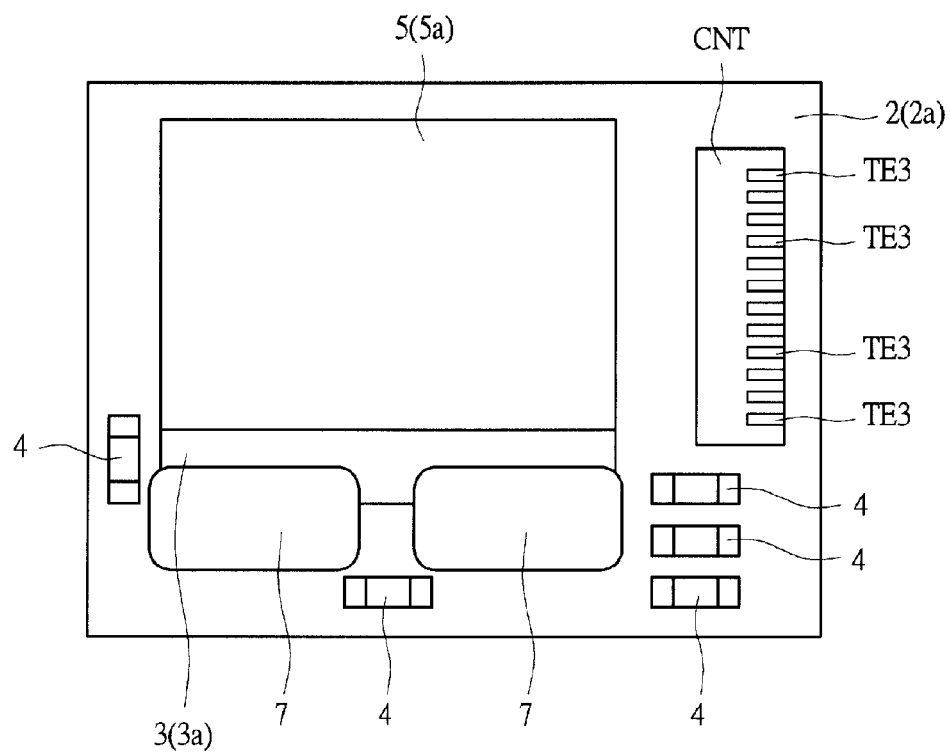
FIG. 42 is a plan view (top view) of a sensor module in a manufacturing step following FIG. 38.
Figure 43:
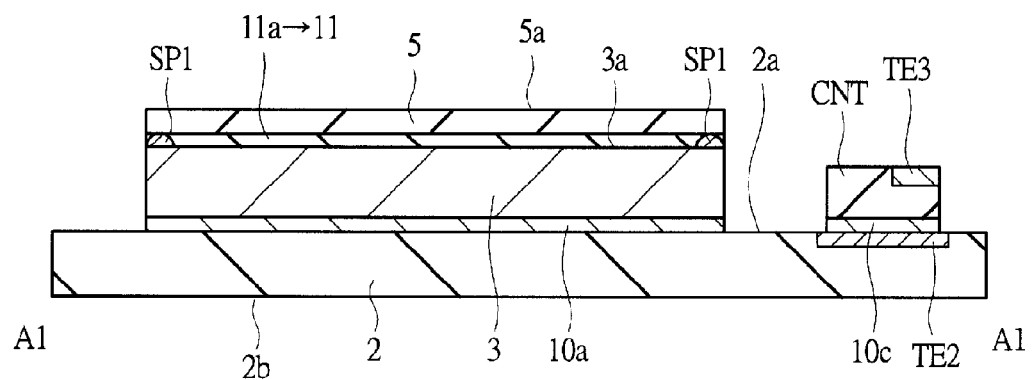
FIG. 43 is a cross-sectional view (A1-A1 cross-sectional view) of the same sensor module as that in FIG. 42 in a manufacturing step.
Figure 44:
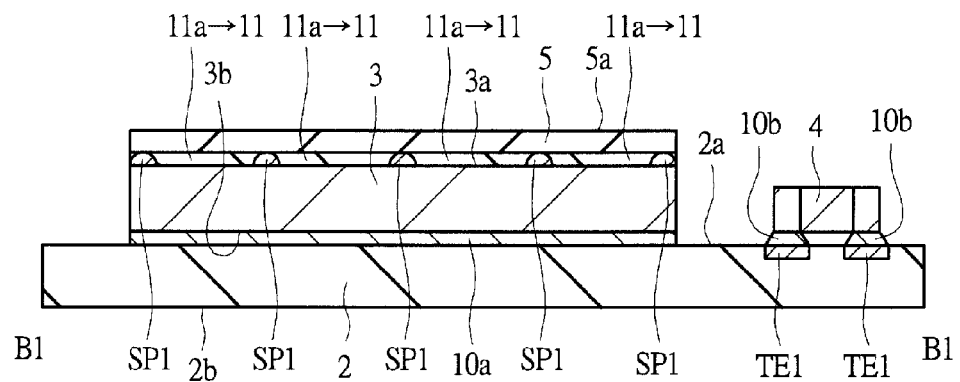
FIG. 44 is a cross-sectional view (B1-B1 cross-sectional view) of the same sensor module as that in FIG. 42 in a manufacturing step.
Figure 45:
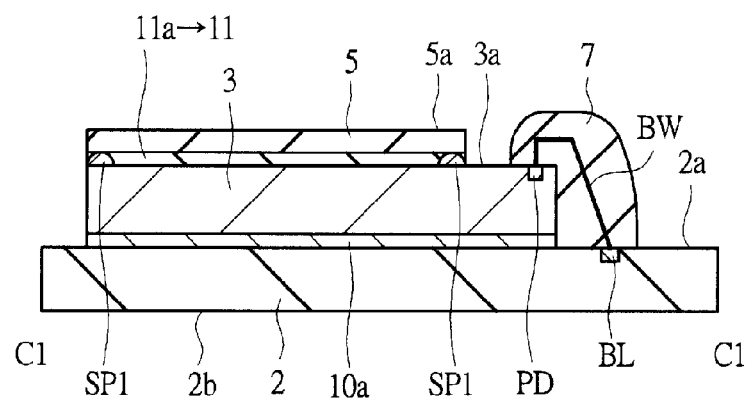
FIG. 45 is a cross-sectional view (C1-C1 cross-sectional view) of the same sensor module as that in FIG. 42 in a manufacturing step.
Figure 46:
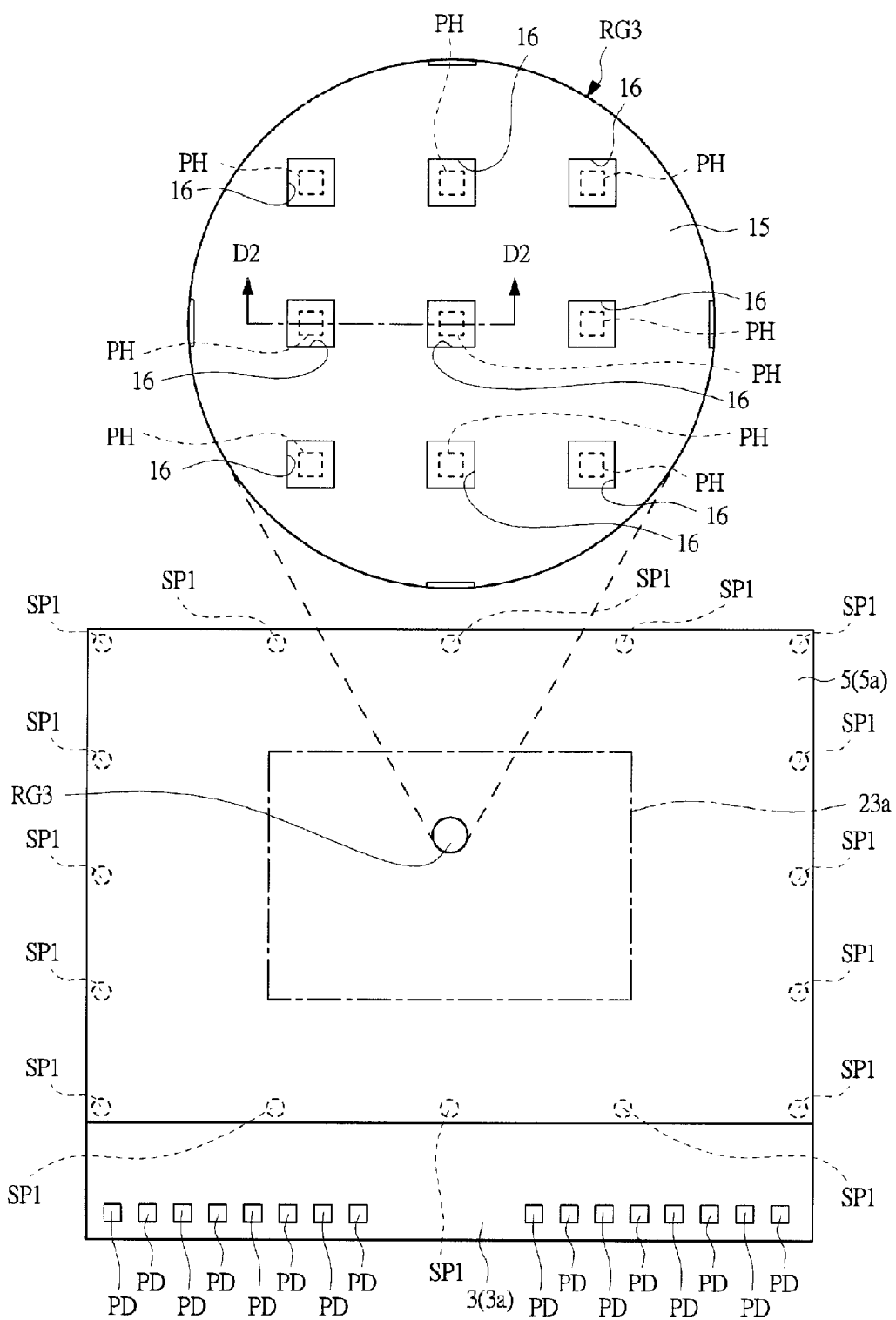
FIG. 46 is a plan view (top view) showing a sensor chip and an optical component over the sensor chip in the same process step as that of FIG. 42 to FIG. 45.

FIG. 38 (top view), FIG. 39 (A1-A1 cross-sectional view), FIG. 40 (B1-B1 cross-sectional view), and FIG. 41 (C1-C1 cross-sectional view) are a top view and cross-sectional views corresponding to FIG. 17, FIG. 18, FIG. 19, and FIG. 20, respectively, and show a step (state) after Step S6a (adhesive 11a disposition step) has been performed. Further, FIG. 42 (top view), FIG. 43 (A1-A1 cross-sectional view), FIG. 44 (B1-B1 cross-sectional view), and FIG. 45 (C1-C1 cross-sectional view) are a top view and cross-sectional views corresponding to FIG. 17, FIG. 18, FIG. 19, and FIG. 20, respectively, and show a step (state) after Step S6b (optical component 5 disposition step) has been performed. Further, FIG. 46 is a plan view (top view) showing the sensor chip 3 and the optical component 5 over the sensor chip 3 in the same process step as that of FIG. 42 to FIG. 45 and corresponds to FIG. 37. FIG. 46 is a view through the sealing portion 7 and the bonding wire BW. Further, FIG. 47 is a partial enlarged cross-sectional view (relevant cross-sectional view) of the stacked structure of the sensor chip 3 and the optical component 5 over the sensor chip 3 in the same process step as that of FIG. 42 to FIG. 45 and corresponds to the cross-sectional view at the position of the D2-D2 line in the region RG3 in FIG. 46.

The optical component 5 mounting step of Step S6 can be performed as follows. First, as shown in FIG. 38 to FIG. 41, the adhesive (adhesive agent) 11a for bonding the optical component 5 is disposed (supplied or coated) in a region where the optical component 5 is to be mounted on the front surface 3a of the sensor chip 3 (Step S6a in FIG. 14). At this time, when a foreign particle is deposited or attached to the front surface 3a of the sensor chip 3, wettability for the disposed adhesive 11a may degrade (the adhesive 11a does not wet the sensor plane SE to be spread over approximately the whole region of the sensor plane SE), and the sensor plane SE is preferably cleaned before the disposition of the adhesive 11a by irradiating this sensor plane SE with plasma. When the plasma is used more than necessary in the irradiation, the sensor plane SE may be damaged. If a foreign particle may, not be deposited or attached, this plasma cleaning step is not necessary. This adhesive 11a is an adhesive in a paste state (having flowability). As shown in FIG. 42 to FIG. 47, the optical component 5 is disposed (mounted) over the front surface 3a of the sensor chip 3 via the spacer SP1 and the adhesive 11a (Step S6b in FIG. 14). In Step S6b, the optical component 5 is disposed (mounted) over the front surface 3a of the sensor chip 3 via the spacer SP1 and the adhesive 11a so that the rear surface of the optical component 5 faces the front surface 3a of the sensor chip 3. The optical component 5 is fixed (adhered) to the sensor chip 3 by curing this adhesive 11a (Step S6c in FIG. 14). The cured adhesive 11a is the adhesive 11.

Figure 47:
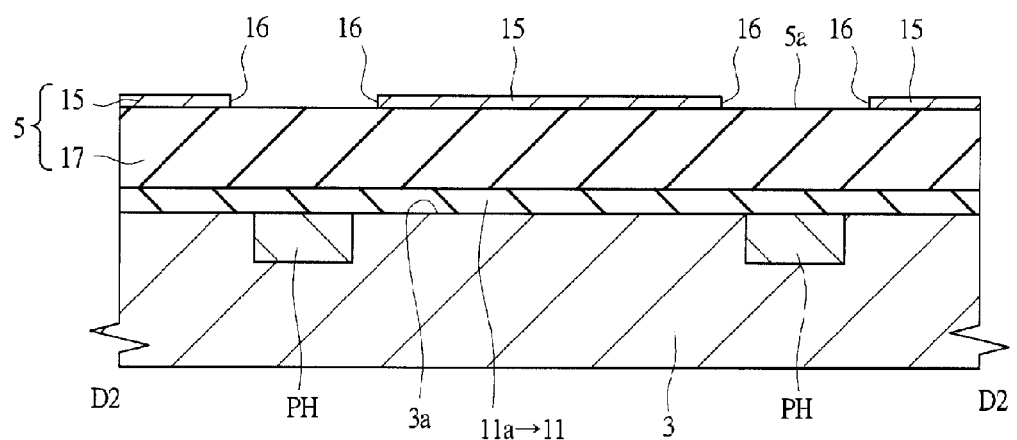
FIG. 47 is a partial enlarged cross-sectional view of a stacked structure of a sensor chip and an optical component over the sensor chip in the same process step as that of FIG. 42 to FIG. 45.

As apparent also from FIG. 46 and FIG. 47, in Step S6b, the optical component 5 is disposed over the front surface 3a of the sensor chip 3 via the plurality of spacers SP1 and the adhesive 11a so that the plurality of opening portions 16 in the light blocking layer 15 of the optical component 5 overlaps the plurality of light receiving elements PH on the front surface 3a (in the sensor plane SE) of the sensor chip 3 (overlap in a planar view).

The optical component 5 disposition step of Step S6b and the adhesive 11a curing step of Step S6c will be more specifically explained with reference to FIG. 48 to FIG. 51. FIG. 48 to FIG. 51 are explanatory diagrams of the optical component 5 disposition step of Step S6b and the adhesive 11a curing step of Step S6c, and show cross sections corresponding to FIG. 39 and FIG. 43 (A1-A1 cross-sectional views).

Figure 48:
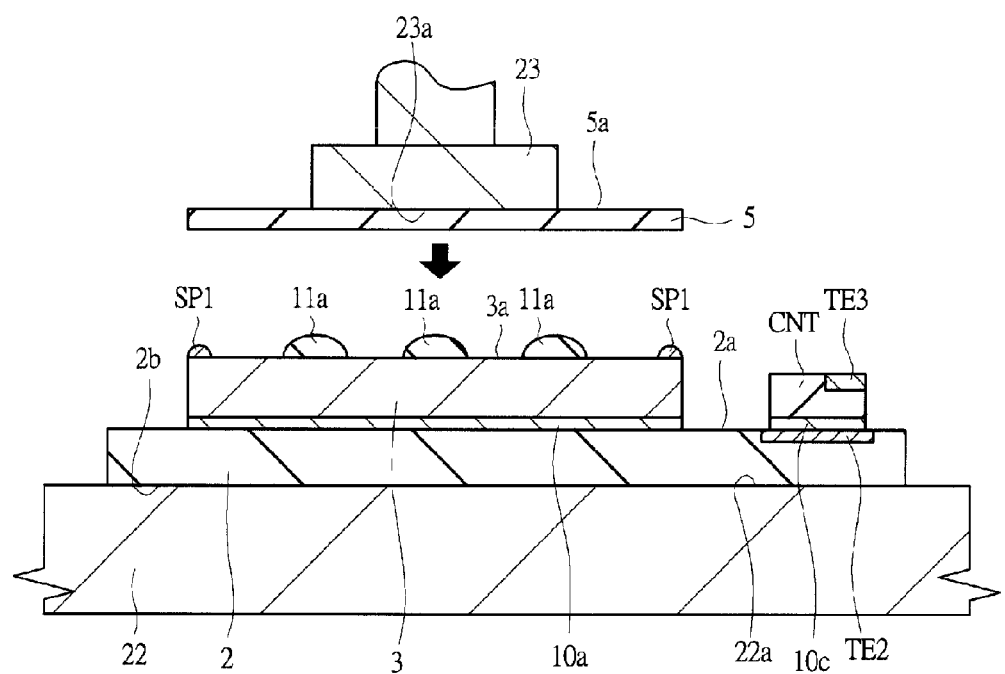
FIG. 48 is an explanatory diagram of an optical component disposition step of Step S6b and an adhesive curing step of Step S6c.

As shown in FIG. 48, the wiring substrate 2 which has been provided with the steps up to the adhesive 11a disposition step of Step S6a is mounted (disposed) over a stage (mounting stage) 22 in the step of performing Step S6b. The adhesive 11a disposition step of Step S6a may be performed in a state in which the wiring substrate 2 is mounted (disposed) over the stage 22 or the wiring substrate 2 may be mounted (disposed) over the stage 22 after the adhesive 11a disposition step of Step S6a has been performed. The wiring substrate 2 is mounted (disposed) over the upper surface 22a of the stage 22 while the upper surface 2a of the wiring substrate 2 is directed upward so that the lower surface 2b of the wiring substrate 2 faces the upper surface 22a of the stage 22.

Figure 49:
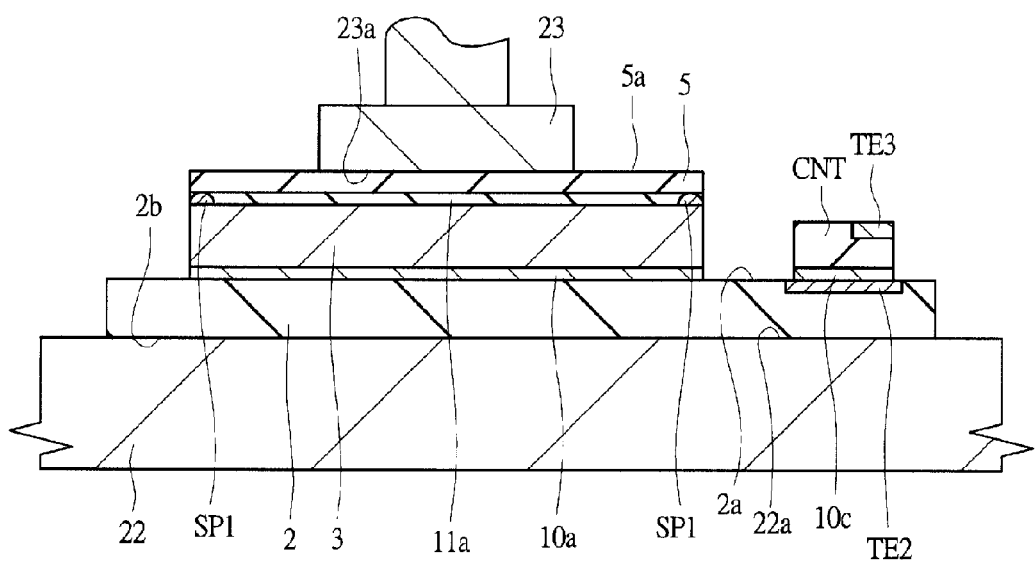
FIG. 49 is an explanatory diagram of an optical component disposition step of Step S6b and an adhesive curing step of Step S6c.
Figure 50:
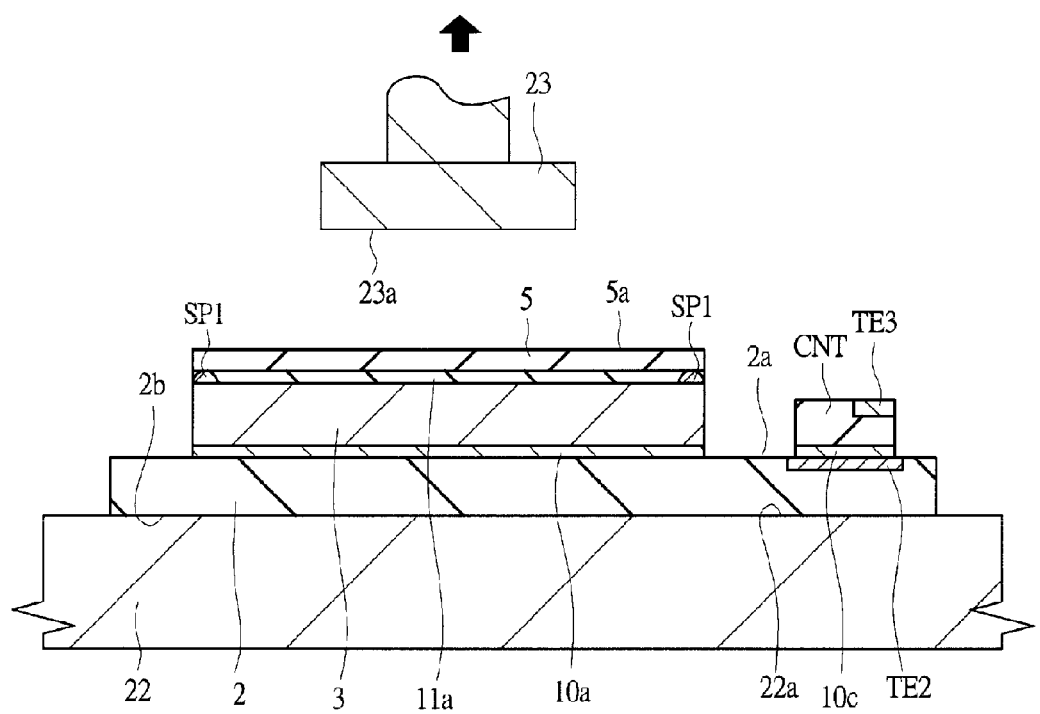
FIG. 50 is an explanatory diagram of an optical component disposition step of Step S6b and an adhesive curing step of Step S6c.
Figure 51:
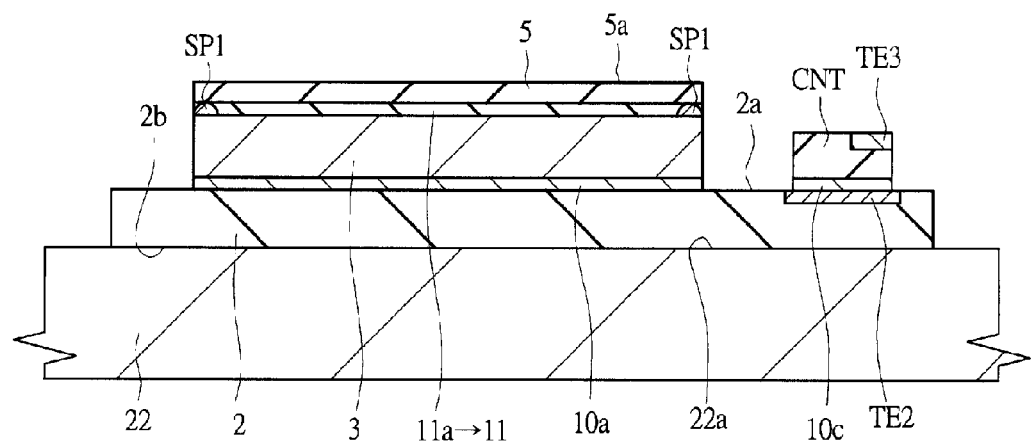
FIG. 51 is an explanatory diagram of an optical component disposition step of Step S6b and an adhesive curing step of Step S6c.

To perform Step S6b, as shown in FIG. 48, a bonding tool 23 holds (holds by adsorption) the optical component 5, and the optical component 5 held by the bonding tool 23 is descended from above toward the front surface 3a of the sensor chip 3 (this sensor chip 3 is fixed to the wiring substrate 2 by the bonding material 10a). Then, as shown in FIG. 49, the optical component 5 held by the bonding tool 23 is disposed over the front surface 3a of the sensor chip 3. The adhesive 11a disposed over the sensor plane SE wets the sensor plane SE to be spread over approximately the whole region of the sensor plane SE. Then, the holding (holding by adsorption) of the optical component 5 by the bonding tool 23 is stopped (terminated), and only the bonding tool 23 is elevated (the optical component 5 is not elevated together with the bonding tool 23) leaving the optical component 5 as disposed over the sensor chip 3 as shown in FIG. 50. After that, as shown in FIG. 51, the curing step of the adhesive 11a of Step S6c is performed and the adhesive 11a becomes the cured adhesive 11.

In accordance with the embodiment, the optical component 5 is disposed over the front surface 3a of the sensor chip 3 while a load is applied to the optical component 5 in Step S6b. In Step S6c, the adhesive 11a is cured while a load is not applied to the optical component 5. Specifically, the optical component 5 held by the bonding tool 23 is disposed over the front surface 3a of the sensor chip 3 via the plurality of spacers SP1 and the adhesive 11a in Step S6b. In Step S6b, the optical component 5 is disposed over the front surface 3a of the sensor chip 3 while a load is applied to the optical component 5 by the bonding tool 23. In Step S6c, the adhesive 11a is cured in a state in which the bonding tool 23 is separated from the optical component 5. So, the adhesive 11a is cured in a state in which a load is not applied to the optical component 5.

The spacer SP1 formed in Step S5 has adherence. The optical component 5 disposed over the front surface 3a of the sensor chip 3 in Step S6b is fixed temporarily by the spacer SP1 (adherence of the spacer SP1) and the adhesive 11a curing step of Step S6c is performed in a state of this temporary fixing. In the adhesive 11a curing step of Step S6c, the optical component 5 can be prevented from moving in a horizontal direction even if the optical component 5 is not pressed (held) by the bonding tool 23 or the like. Then, by curing the adhesive 11a in Step S6c in a state in which the optical component 5 is not pressed (held) by the bonding tool 23 or the like and a load is not applied to the optical component 5, it is possible to control or prevent the generation of interference patterns in the cured adhesive 11 and to control or prevent degradation in the transmittance of the adhesive 11.

As described above, the adhesive 11 is required to have translucency (light transmissivity, or light transmitting property), and it is possible to prevent the adhesive 11 from disturbing (blocking) the input of light to the light receiving element PH of the sensor chip 3. Accordingly, it is necessary to use adhesive having translucency as the adhesive 11a to be disposed (supplied) on the front surface 3a of the sensor chip 3 in Step S6a. Since ultraviolet curable adhesive has translucency, the ultraviolet curable adhesive can be preferably used as the adhesive 11a to be disposed on the front surface 3a of the sensor chip 3 in Step S6a, heat-curable type adhesive may be used if translucency can be kept.

The processing of curing the adhesive 11a in Step S6c can be performed by heat treatment (when the adhesive 11a is heat-curable) or by ultraviolet light irradiation processing (when the adhesive 11a is ultraviolet curable). Further, adhesive provided with both of the ultraviolet curability and the heat-curability can be used as the adhesive 11a. In this case, the processing of curing the adhesive 11a in Step S6c may be performed by either the heat treatment or the ultraviolet light irradiation processing.

In Step S6c, the adhesive 11a can be cured by heating at approximately 120° C. for approximately 30 minutes. This processing can be performed by disposing the wiring substrate 2 on which up to Step S6b has been performed in a heating furnace (baking furnace) and then heating it.

Further, in Step S6a, the adhesive 11a is preferably disposed over the front surface 3a of the sensor chip 3 to protrude from the spacer SP1 in a side view. The height $H_2$ of the adhesive 11a disposed on the front surface 3a of the sensor chip 3 in Step S6a is preferably larger than the height $H_1$ of the spacer SP1 ($H_2 > H_1$). The height $H_1$ of the spacer SP1 and the height $H_2$ of the adhesive 11a are indicated also in FIG. 39 and correspond to the heights in the direction perpendicular to the front surface 3a of the sensor chip 3. In Step S6b (optical component 5 disposition step), the rear surface of the optical component 5 presses down the adhesive 11a and the adhesive 11a can be spread uniformly between the front surface 3a of the sensor chip 3 and the rear surface of the optical component 5. The height $H_1$ of the spacer SP1 can be set to approximately 20 to 40 μm. Further, the difference between the height $H_2$ of the adhesive 11a and the height $H_1$ of the spacer SP1 ("$H_2 - H_1$") can be set to approximately 100 to 200 μm.

Further, more preferably, the adhesive 11a is disposed at the center part of the sensor plane SE on the front surface 3a of the sensor chip 3 in Step S6a and the adhesive 11a is pressed to be spread by the rear surface of the optical component 5 in Step S6b (optical component 5 disposition step). At this time, the adhesive 11a is disposed not over the whole surface of the sensor plane SE but in an area (region) smaller than the sensor plane SE, and the disposition region of the adhesive 11a has a state included in the sensor plane SE (the disposition region of the adhesive 11a is smaller than the sensor plane SE). Accordingly, the disposition region of the adhesive 11a is limited to the center part in Step S6a, and it becomes possible to reduce time required in Step S6a (adhesive 11a disposition step) and easily to control the supply amount of the adhesive 11a. The adhesive 11a is pressed to be spread when the optical component 5 is disposed in Step S6b, and the adhesive 11a can be spread uniformly between the front surface 3a of the sensor chip 3 and the rear surface of the optical component 5.

Further, adhesive having a comparatively low viscosity is preferably used as the adhesive 11a to spread the adhesive 11a easily and uniformly by the rear surface of the optical component 5 between the front surface 3a of the sensor chip 3 and the rear surface of the optical component 5 in Step S6b (optical component 5 disposition step). Adhesive having a comparatively high viscosity is preferably used as the adhesive 21 for forming the spacer SP1 not easily to flow until the curing processing of Step S5b is performed, as described above. Accordingly, the viscosity of the adhesive 11a to be disposed on the front surface 3a of the sensor chip 3 in Step S6a is preferably lower than the viscosity of the adhesive 21 to be disposed on the front surface 3a of the sensor chip 3 in Step S5a. Thus, the adhesive 11a flows easily in Step S6b, and the adhesive 21 does not flow, easily during the time after Step S5a until the curing processing of Step S5b.

The viscosity of the adhesive 11a to be disposed on the front surface 3a of the sensor chip 3 in Step S6a can be set to approximately 3,000 milli-Pascal/second (mPa/sec). The viscosity of the adhesive 21 to be disposed on the front surface 3a of the sensor chip 3 in Step S5a can be set to approximately 30,000 milli-Pascal/second (mPa/sec). These viscosity values are measured by a rotating viscometer.

Further, the spacer SP1 is preferably formed at a position which does not overlap a head portion 23a of the bonding tool 23 (portion contacting the optical component 5 in the bonding tool 23 or portion holding the optical component 5 in the bonding tool 23) in a planar view when the optical component 5 held by the bonding tool 23 is disposed over the front surface 3a of the sensor chip 3 in Step S6b. In FIG. 46, the position of the head portion 23a in the bonding tool 23 holding the optical component 5 is indicated by a chain line. A load by the bonding tool 23 is not easily transferred to the spacer SP1, and it becomes possible to prevent more appropriately the space SP1 from being deformed in Step S6b (optical component 5 disposition step). Then, it becomes possible to appropriately define the spacing between the front surface 3a of the sensor chip 3 and the rear surface of the optical component 5 by the spacer SP1 when the adhesive 11a is cured in Step S6c and it becomes possible to form more appropriately a layer of the adhesive 11 having a predetermined thickness.

After the optical component 5 mounting step of Step S6, as shown in FIG. 52 to FIG. 56, the spacer SP2 is formed on the front surface 5a of the optical component 5 (Step S7 in FIG. 12). The Spacer SP2 formation step of Step S7 is basically the same as the spacer SP1 formation step of Step S5 except that the spacer SP2 is formed on the front surface 5a of the optical component 5.

Figure 52:
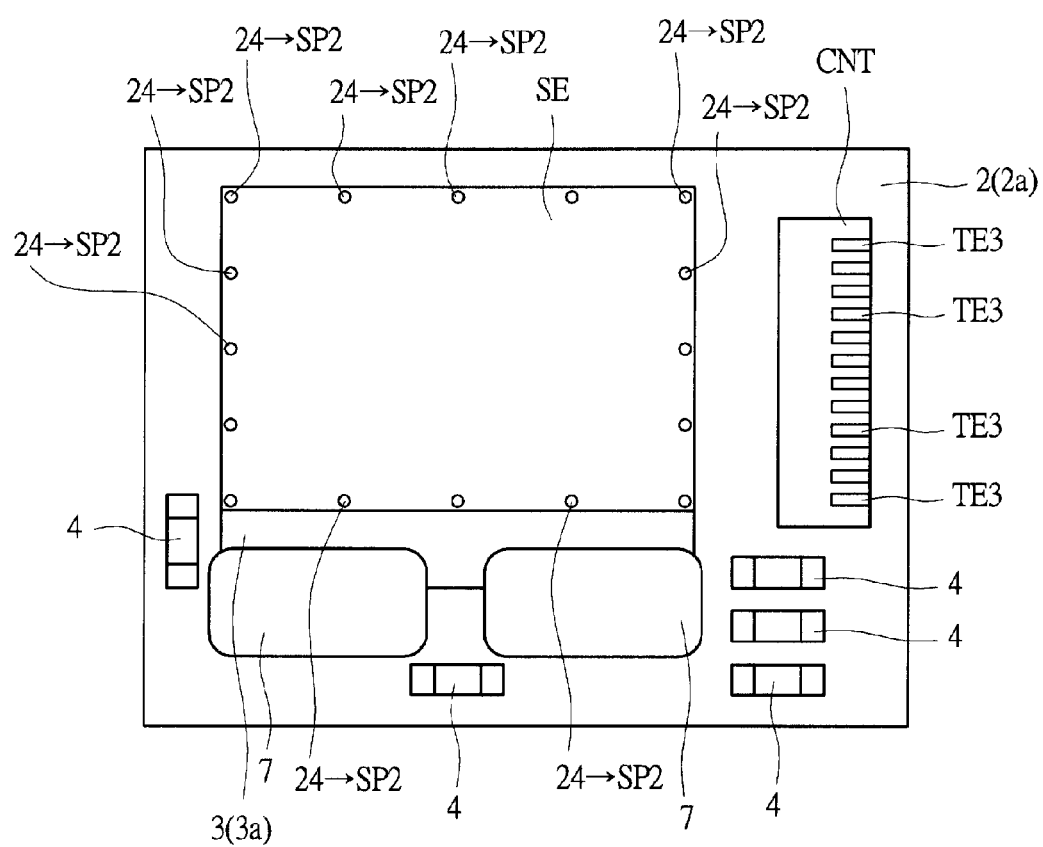
FIG. 52 is a plan view (top view) of a sensor module in a manufacturing step following FIG. 42.
Figure 53:
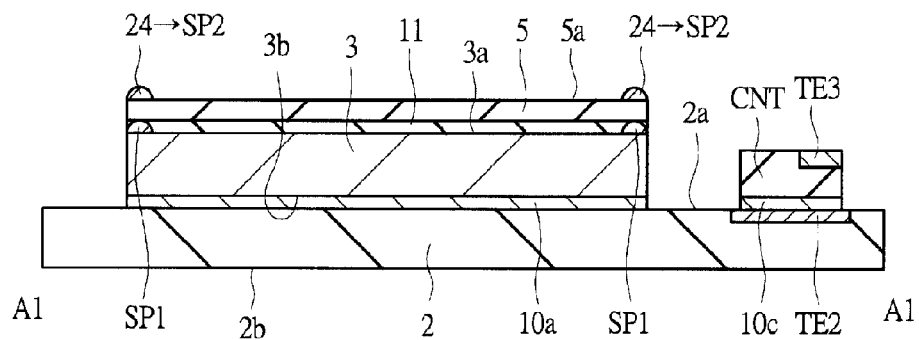
FIG. 53 is a cross-sectional view (A1-A1 cross-sectional view) of the same sensor module as that in FIG. 52 in a manufacturing step.
Figure 54:
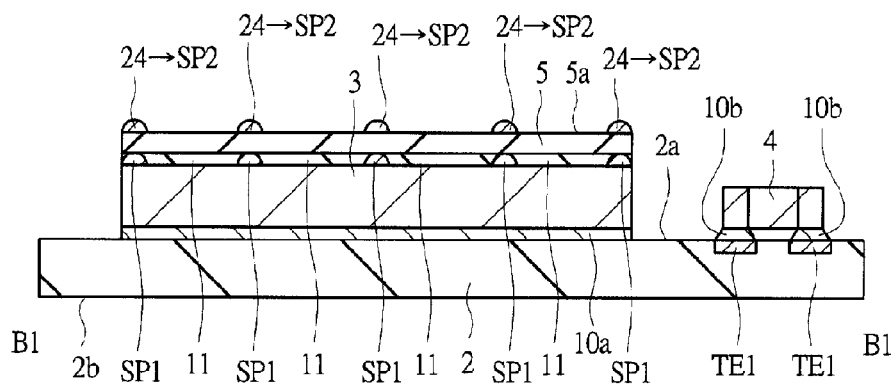
FIG. 54 is a cross-sectional view (B1-B1 cross-sectional view) of the same sensor module as that in FIG. 52 in a manufacturing step.
Figure 55:
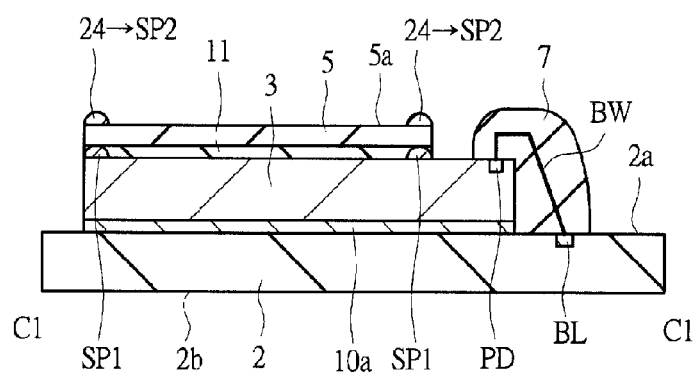
FIG. 55 is a cross-sectional view (C1-C1 cross-sectional view) of the same sensor module as that in FIG. 52 in a manufacturing step.
Figure 56:
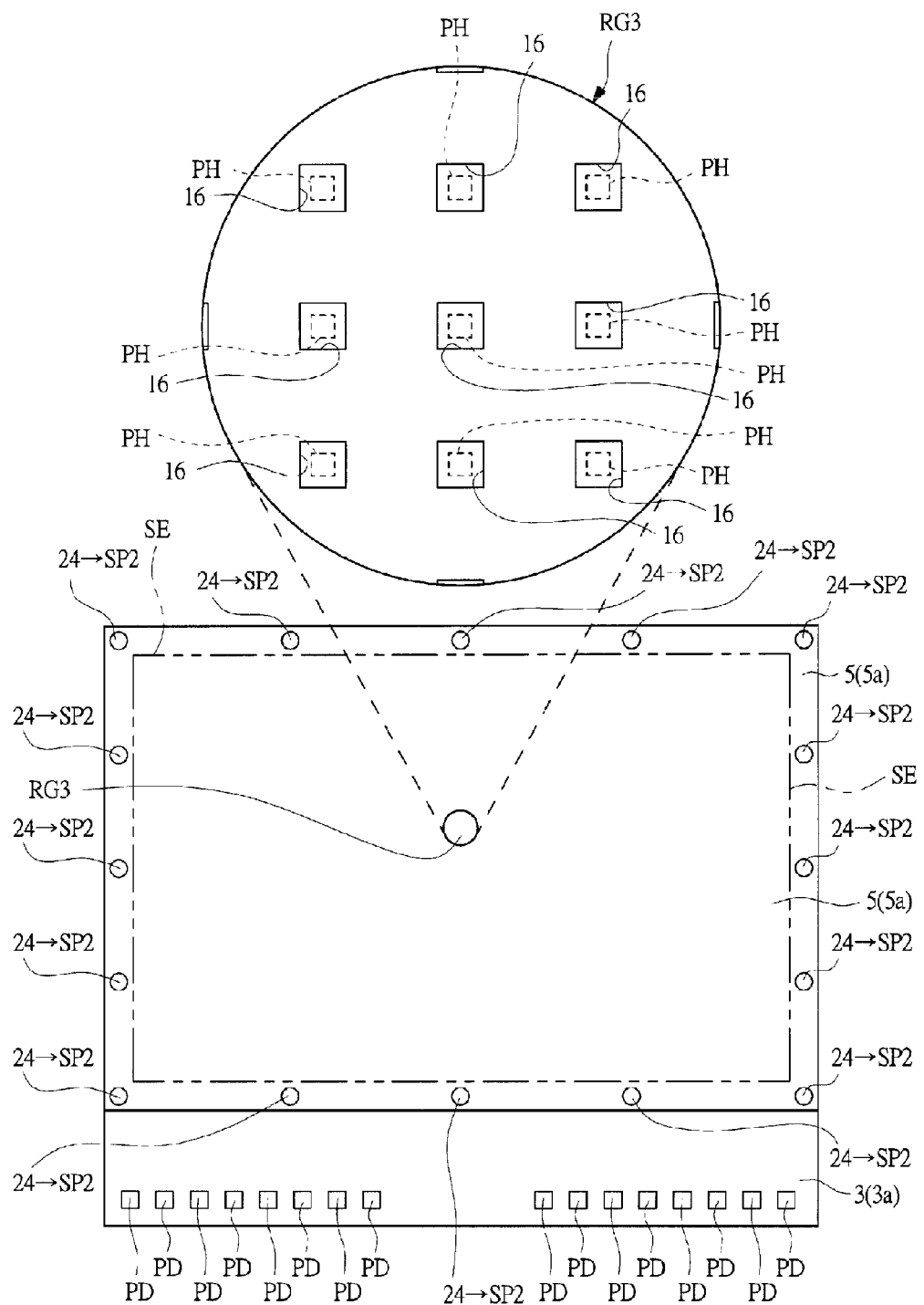
FIG. 56 is a plan view (top view) showing a sensor chip and an optical component over the sensor chip in the same process step as that of FIG. 52 to FIG. 55.

FIG. 52 (top view), FIG. 53 (A1-A1 cross-sectional view), FIG. 54 (B1-B1 cross-sectional view), and FIG. 55 (C1-C1 cross-sectional view) are a top view and cross-sectional views corresponding to FIG. 17, FIG. 18, FIG. 19, and FIG. 20, respectively, and show a step (state) after Step S7 (spacer SP1 formation step) has been performed. Further, FIG. 56 is a plan view (top view) showing the sensor chip 3 and the optical component 5 on the sensor chip 3 in the same step as that of FIG. 52 to FIG. 55, and corresponds to FIG. 37 and FIG. 46. FIG. 56 is a view through the sealing portion 7 and the bonding wire BW.

The spacer SP2 formation step of Step S7 can be performed as follows. First, an adhesive (adhesive agent) 24 for forming the spacer SP2 is disposed (supplied or coated) at a plurality of positions on the front surface 5a of the optical component 5 (Step S7a in FIG. 15). Then, the plurality of spacers SP2 is formed on the front surface 5a of the optical component 5 by curing this adhesive 24 (Step S7b in FIG. 15). The spacer SP2 is the cured adhesive 24. The spacers SP2 are formed at the plurality of positions in a region where the optical component 6 is to be mounted on the front surface 5a of the optical component 5.

The spacer SP2 is provided to define a spacing between the rear surface of the optical component 6, which is to be mounted later over the optical component 5, and the front surface 5a of the optical component 5, and to fix the optical component 6 temporarily until an adhesive 12a to be described below is cured. Accordingly, the spacer SP2 is required to have adherence (viscosity or tackness) to fix the optical component 6 temporarily.

The adhesive 24 has a higher viscosity by the curing step of Step S7b. Accordingly, the curing step of the adhesive 24 in Step S7b can be also considered to be processing for increasing the viscosity of the adhesive 24. When the viscosity of the adhesive 24 in the disposition step of Step S7a, in which the adhesive 24 is disposed on the front surface 5a of the optical component 5 at the plurality of positions, is denoted by a viscosity (third viscosity) $V_3$ and the viscosity of the adhesive 24 after the curing in Step S7b (the viscosity of the spacer SP2) is denoted by a viscosity (fourth viscosity) $V_4$, the viscosity (fourth viscosity) $V_4$ becomes higher than the viscosity (third viscosity) $V_3$ ($V_4 > V_3$). Accordingly, the spacer SP2 formed in Step S7b (adhesive 24 cured by Step S7b) has the viscosity $V_4$ higher than the viscosity $V_3$ of the adhesive 24 disposed on the front surface 5a of the optical component 5 in Step S7a and also has adherence (viscosity or tackness).

For the adhesive 24 to be disposed on the front surface 5a of the optical component 5 in Step S7a, ultraviolet curable adhesive is preferred the same as for the adhesive 21. In this case, in Step S7b, the spacer SP2 is formed by curing the adhesive 24 by irradiating the adhesive 24 on the front surface 5a of the optical component 5 with ultraviolet light.

Further, the ultraviolet curable adhesive is not cured completely and tends to have a state keeping adherence (viscosity or tackness) at a surface exposed to air (contacting air) even when irradiated with ultraviolet light. Accordingly, it is preferable to use the ultraviolet curable adhesive as the adhesive 24 to form the spacer SP2 and, in Step S7b, to cure the adhesive 24 by irradiating the adhesive 24 with ultraviolet light in a state in which the surface of the adhesive 24 disposed over the front surface 5a of the optical component 5 contacts air (is exposed to air), for forming the spacer SP2. The spacer SP2 can be formed easily and appropriately to have adherence (viscosity or tackness) which is necessary to temporarily fix the optical component 6.

Further, for the adhesive 24 to be disposed on the front surface 5a of the optical component 5 in Step S7a, preferably adhesive having a high viscosity (viscosity higher than that of the adhesives 11a and 12a) is used the same as for the adhesive 21. So, it is possible to cause the adhesive 24 disposed on the front surface 5a of the optical component 5 not to spread easily in a lateral direction (planar direction or direction parallel to the front surface 5a of the optical component 5) and easily to form the spacer SP2 having a predetermined shape (height).

Further, the spacer SP2, while being formed on the front surface 5a of the optical component 5, is preferably formed in a position which does not overlap the sensor plane (sensor region) SE in a planar view (so that the spacer SP2 does not overlap the sensor plane SE in a planer configuration). This can be realized by setting the disposition position of the adhesive 24 to a position which does not overlap the sensor plane (sensor region) SE in a planar view in Step S7a. Then, the spacer SP1 does not affect the input of light to the light receiving element PH in the sensor plane SE. The spacer SP2 can use adhesive which easily forms the spacer SP2 appropriately, as the adhesive 24 without consideration of translucency. FIG. 56 shows the position of the sensor plane SE of the sensor chip 3 under the optical component 5 by a two-dot chain line.

The spacer SP2 is preferably formed along the outer periphery of the front surface 5a of the optical component 5 (more preferably, along each side of the front surface 5a of the optical component 5 (each of the four sides)) in a planar view. The spacer SP2 can be caused not to overlap the sensor plane SE in a planar configuration and it becomes possible to obtain the above effect appropriately. Further, when the optical component 6 is disposed later over the front surface 5a of the optical component 5, it becomes possible to appropriately define the spacing between the front surface 5a of the optical component 5 and the rear surface of the optical component 6 by the spacer SP2 and it becomes possible to appropriately define the layer thickness of the adhesive 12 by the height of the spacer SP2.

However, there is a problem that, when the plurality of spacers SP2 is connected (integrated) with one another in a plane and formed as an integrated object to surround the outer periphery of the front surface 5a of the optical component 5 perfectly on the front surface 5a of the optical component 5, it may be impossible to keep a flow path (route) for ejecting air caught during the disposition of the optical component 6 later in Step S8b from a space between the optical component 5 and the optical component 6 to the outside. Accordingly, while the plurality of spacers SP2 is formed on the front surface 5a of the optical component 5, the plurality of spacers SP2 is preferably formed for each of the sides (each of the four sides) of the optical component 5 which has a planar shape of a quadrangle. At this time, each of the spacers SP2 is preferably formed locally. The flow path (route) ejecting air and the like from the space between the optical component 5 and the optical component 6 to the outside can be kept at not only a corner part but also each side of the optical component 5, and it is possible to control or prevent the generation of a void between the optical component 5 and the optical component 6.

After the spacer SP2 formation step of Step S7, the optical component 6 is mounted on the front surface 5a of the optical component 5 (Step S8 in FIG. 12). The specific configuration of the optical component 6 has been described above and its repeated explanation is omitted.

Figure 57:
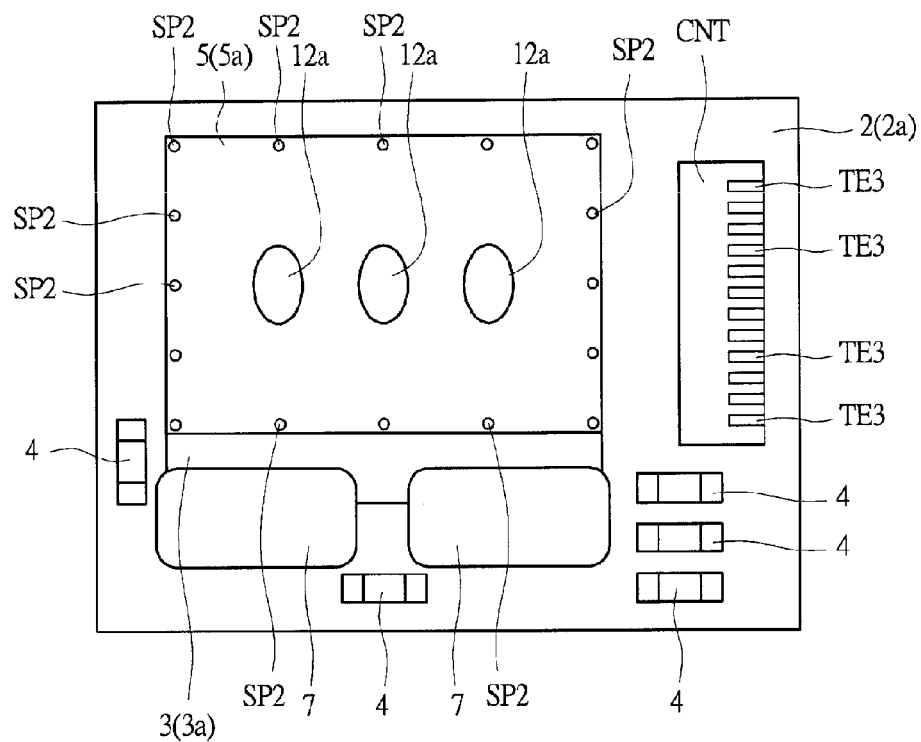
FIG. 57 is a plan view (top view) of a sensor module in a manufacturing step following FIG. 52.
Figure 58:
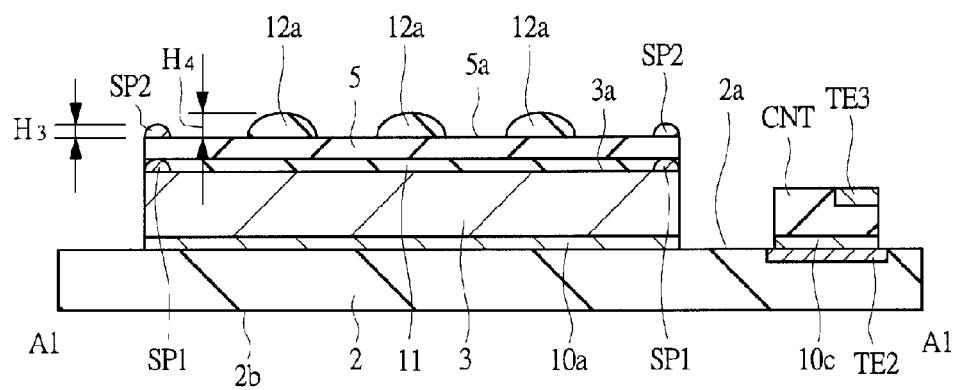
FIG. 58 is a cross-sectional view (A1-A1 cross-sectional view) of the same sensor module as that in FIG. 57 in a manufacturing step.
Figure 59:
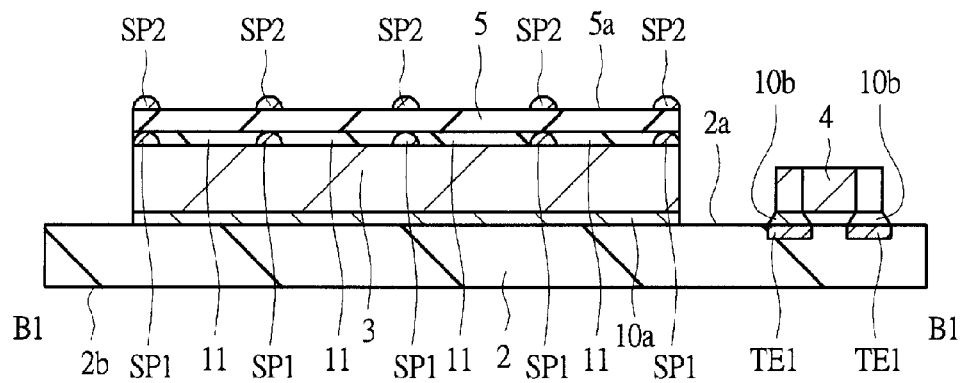
FIG. 59 is a cross-sectional view (B1-B1 cross-sectional view) of the same sensor module as that in FIG. 57 in a manufacturing step.
Figure 60:
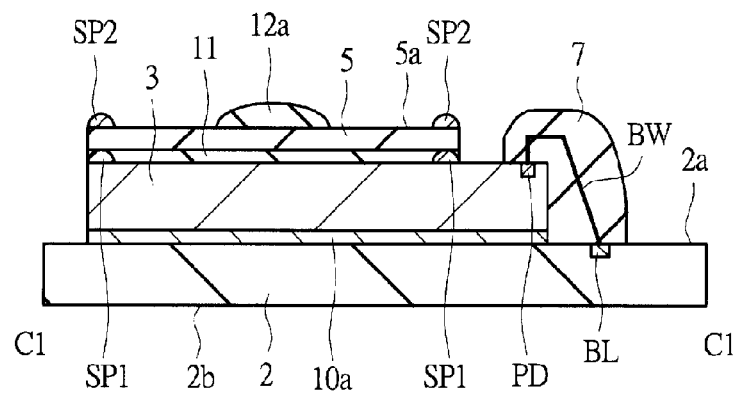
FIG. 60 is a cross-sectional view (C1-C1 cross-sectional view) of the same sensor module as that in FIG. 57 in a manufacturing step.
Figure 61:
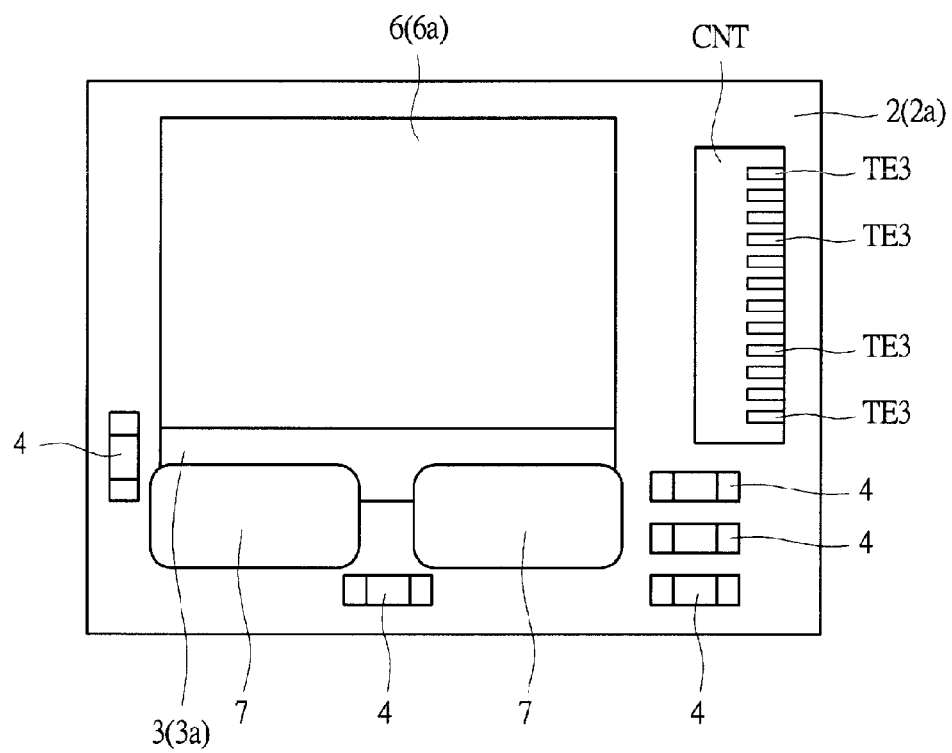
FIG. 61 is a plan view (top view) of a sensor module in a manufacturing step following FIG. 57.
Figure 62:
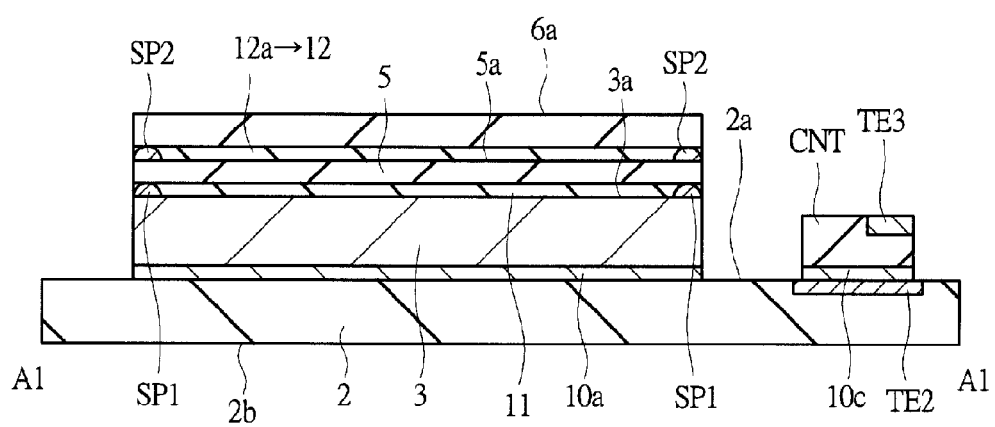
FIG. 62 is a cross-sectional view (A1-A1 cross-sectional view) of the same sensor module as that in FIG. 61 in a manufacturing step.
Figure 63:
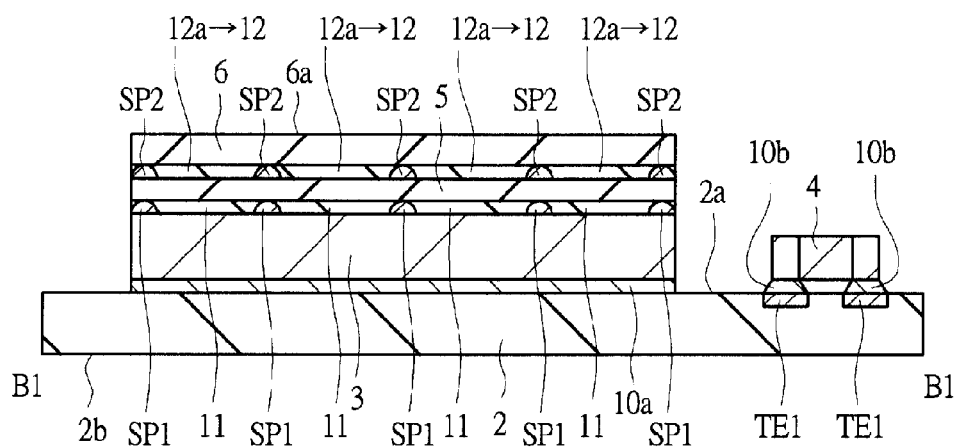
FIG. 63 is a cross-sectional view (B1-B1 cross-sectional view) of the same sensor module as that in FIG. 61 in a manufacturing step.
Figure 64:
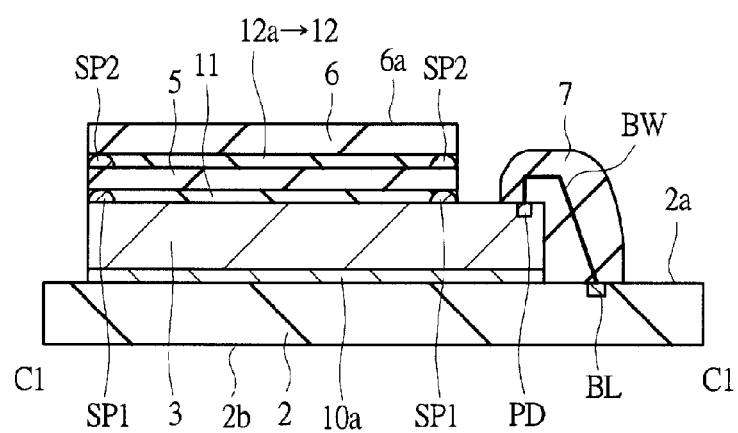
FIG. 64 is across-sectional view (C1-C1 cross-sectional view) of the same sensor module as that in FIG. 61 in a manufacturing step.
Figure 65:
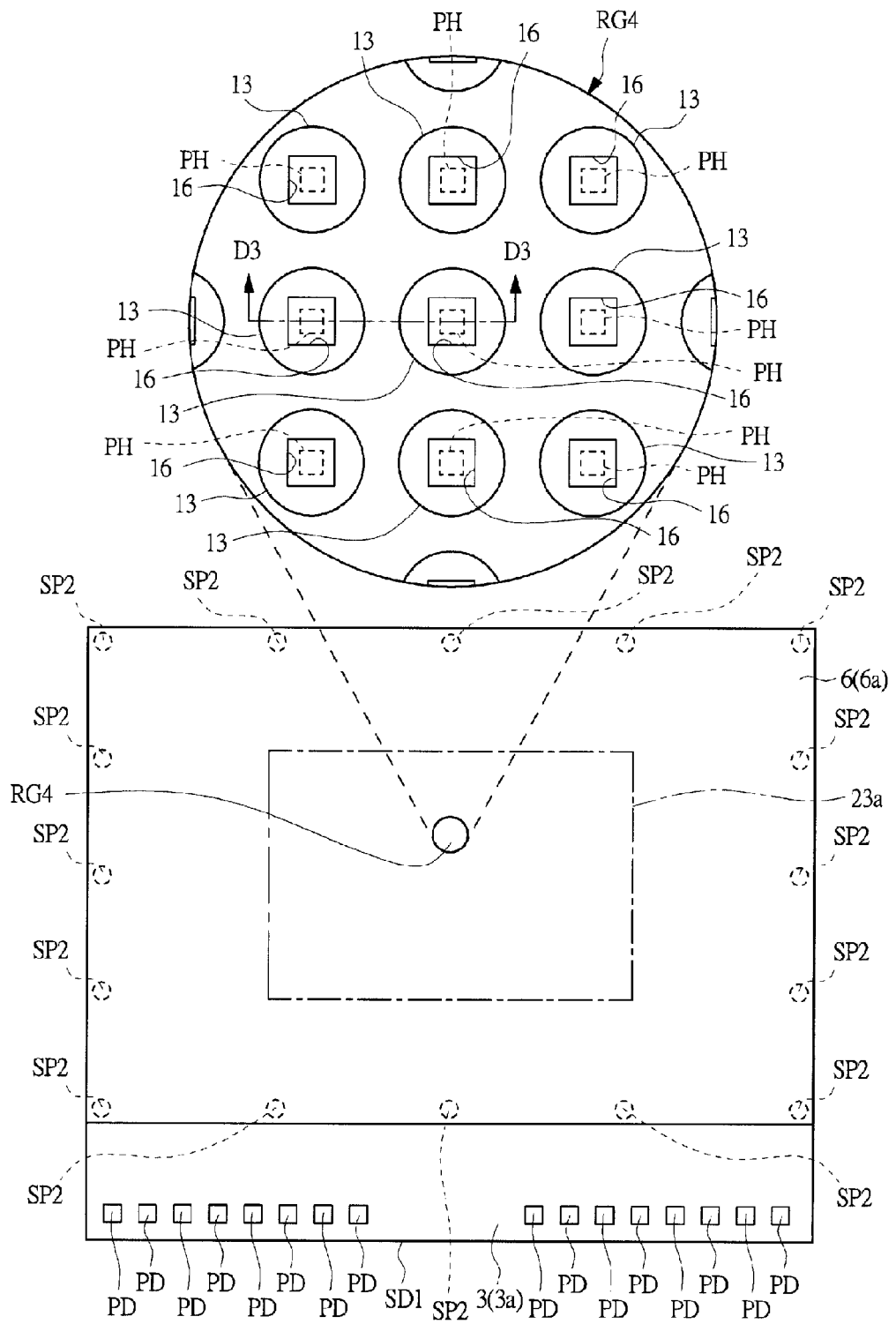
FIG. 65 is a plan view (top view) showing a sensor chip and an optical component over the sensor chip in the same process step as that of FIG. 61 to FIG. 64.

FIG. 57 (top view), FIG. 58 (A1-A1 cross-sectional view), FIG. 59 (B1-B1 cross-sectional view), and FIG. 60 (C1-C1 cross-sectional view) are a top view and cross-sectional views corresponding to FIG. 17, FIG. 18, FIG. 19, and FIG. 20, respectively, and show a step (state) after Step S8a (adhesive 12a disposition step) has been performed. Further, FIG. 61 (top view), FIG. 62 (A1-A1 cross-sectional view), FIG. 63 (B1-B1 cross-sectional view), and FIG. 64 (C1-C1 cross-sectional view) are a top view and cross-sectional views corresponding to FIG. 17, FIG. 18, FIG. 19, and FIG. 20, respectively, and show a step (state) after Step 8b (optical component 6 disposition step) has been performed. Further, FIG. 65 is a plan view (top view) showing the sensor chip 3 and the optical components 5 and 6 over the sensor chip 3 in the same process step as that of FIG. 61 to FIG. 64 and corresponds to FIG. 37, FIG. 46, and FIG. 56. FIG. 65 is a view through the sealing portion 7 and the bonding wire BW. Further, FIG. 66 is a partial enlarged cross-sectional view (relevant cross-sectional view) of the stacked structure of the sensor chip 3, the optical component 5 over the sensor chip 3, and the optical component 6 over the optical component 5 in the same process step as that of FIG. 61 to FIG. 64, and corresponds to the cross-sectional view at the position of the D3-D3 line in the region RG4 of FIG. 65.

The optical component 6 mounting step of Step S8 can be performed as follows. First, as shown in FIG. 57 to FIG. 60, the adhesive (adhesive agent) 12a for bonding the optical component 6 is disposed (supplied or coated) in a region where the optical component 6 is to be mounted on the front surface 5a of the optical component 5 (Step S8a in FIG. 16). When a foreign particle is deposited or attached to the front surface 5a of the optical component 5, the wettability for the disposed adhesive 12a may degrade (the adhesive 12a does not wet the surface 5a of the optical component 5 to be spread over approximately the whole region of the front surface 5a of the optical component 5), and therefore the front surface 5a of the optical component 5 is preferably cleaned before the disposition of the adhesive 12a by irradiating this front surface 5a of the optical component 5 with plasma. When the plasma, is used more than necessary in the irradiation, the front surface 5a of the optical component 5 may be damaged, and, if a foreign particle is not deposited or attached, this plasma cleaning step is unnecessary. This adhesive 12a is an adhesive in a paste state (having flowability). Then, as shown in FIG. 61 to FIG. 66, the optical component 6 is disposed (mounted) over the front surface 5a of the optical component 5 via the spacer SP2 and the adhesive 12a (Step S8b in FIG. 16). In Step S8b, the optical component 6 is disposed (mounted) over the front surface 5a of the optical component 5 via the spacer SP2 and the adhesive 12a so that the rear surface of the optical component 6 faces to the front surface 5a of the optical component 5. Then, the optical component 6 is fixed (caused to adhere) to the optical component 5 by curing this adhesive 12a (Step S8c in FIG. 16). The cured adhesive 12a is the adhesive 12.

Figure 66:
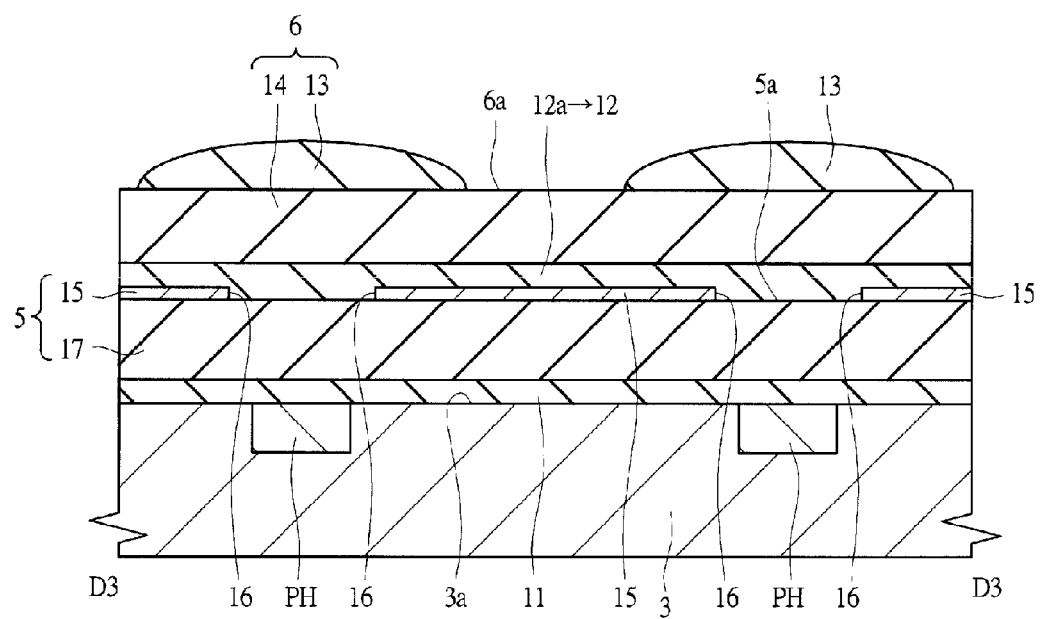
FIG. 66 is a partial enlarged cross-sectional view of a stacked structure of a sensor chip and an optical component over the sensor chip in the same process step as that of FIG. 61 to FIG. 64.

As apparent also from FIG. 65 and FIG. 66, in Step S8b, the optical component 6 is disposed over the front surface 5a of the optical component 5 via the plurality of spacers SP2 and the adhesive 12a so that the plurality of lens portions 13 of the optical component 6 overlaps the plurality of opening portions 16 in the light blocking layer 15 of the optical component 5 (overlap in a planar view). Because the opening portions 16 in the light blocking layer 15 of the optical component 5 overlap the light receiving elements PH on the front surface 3a (sensor plane SE) of the sensor chip 3 (overlap in a planar view), the lens portions 13 of the optical component 6 overlap the light receiving elements PH on the front surface 3a (sensor plane SE) of the sensor chip 3 (overlap in a planar view).

The optical component 6 disposition step of Step S8b and the adhesive 12a curing step of Step S8c will be more specifically explained with reference to FIG. 67 to FIG. 70. FIG. 67 to FIG. 70 are explanatory diagrams of the optical component 6 disposition step of Step S8b and the adhesive 12a curing step of Step S8c, and show cross sections corresponding to FIG. 58 and FIG. 62 (A1-A1 cross-sectional views).

Figure 67:
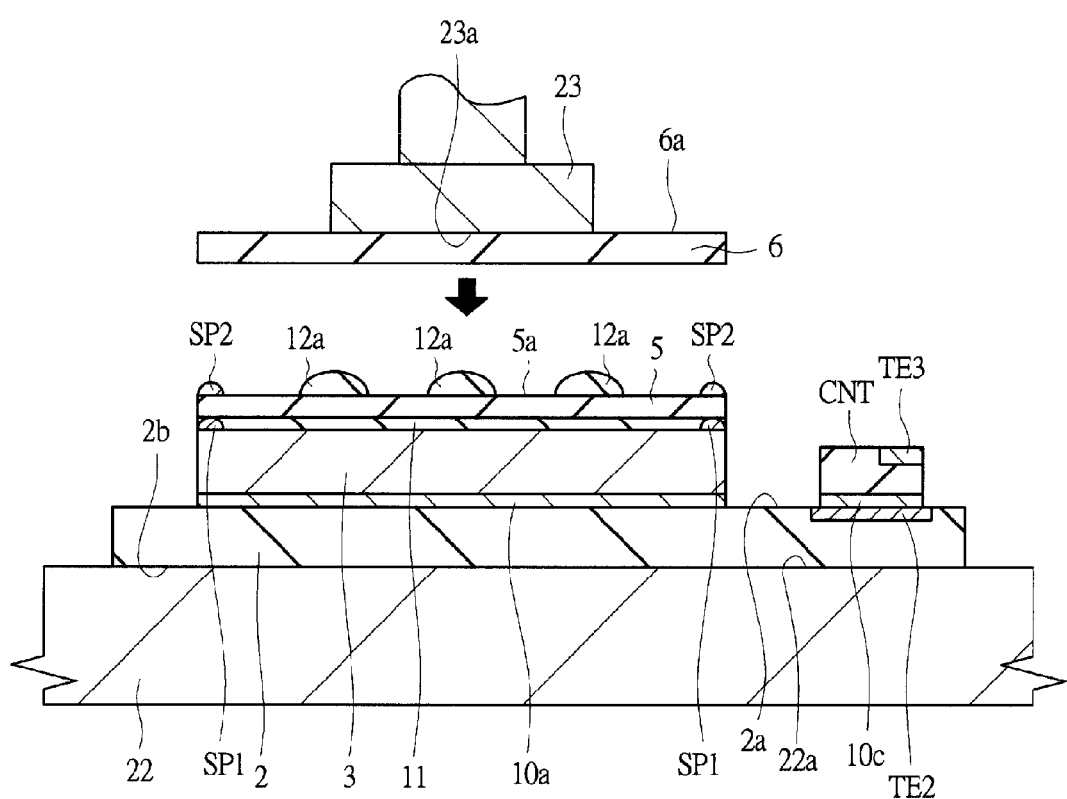
FIG. 67 is an explanatory diagram of an optical component disposition step of Step S8*b* and an adhesive curing step of Step S8*c*.

As shown in FIG. 67, the wiring substrate 2 which has been subjected to the steps up to the adhesive 12a disposition step of Step S8a is mounted (disposed) over a stage (mounting stage) 22 in the step performing Step S8b. The stage 22 used in Step S8 may be the same as the stage 22 used in Step S6 or may be different. Further, the adhesive 12a disposition step of Step S8a may be performed in a state in which the wiring substrate 2 is mounted (disposed) over the stage 22 or the wiring substrate 2 may be mounted (disposed) over the stage 22 after the adhesive 12a disposition step of Step S8a has been performed. The wiring substrate 2 is mounted (disposed) over the upper surface 22a of the stage 22 while the upper surface 2a of the wiring substrate 2 is directed upward so that the lower surface 2b of the wiring substrate 2 faces to the upper surface 22a of the stage 22.

Figure 68:
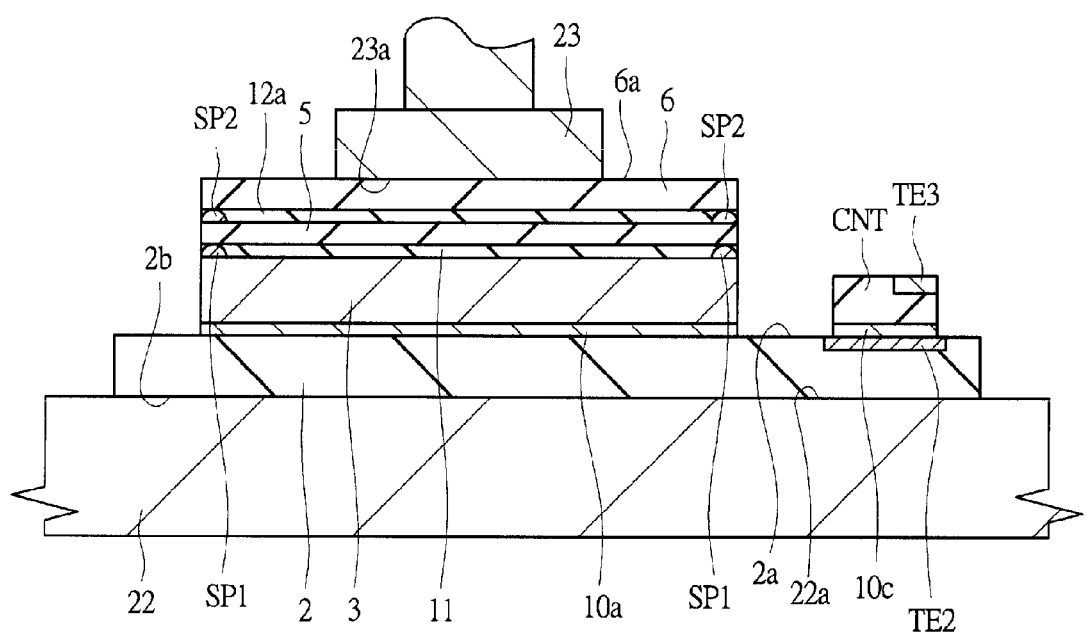
FIG. 68 is an explanatory diagram of an optical component disposition step of Step S8*b* and an adhesive curing step of Step S8*c*.
Figure 69:
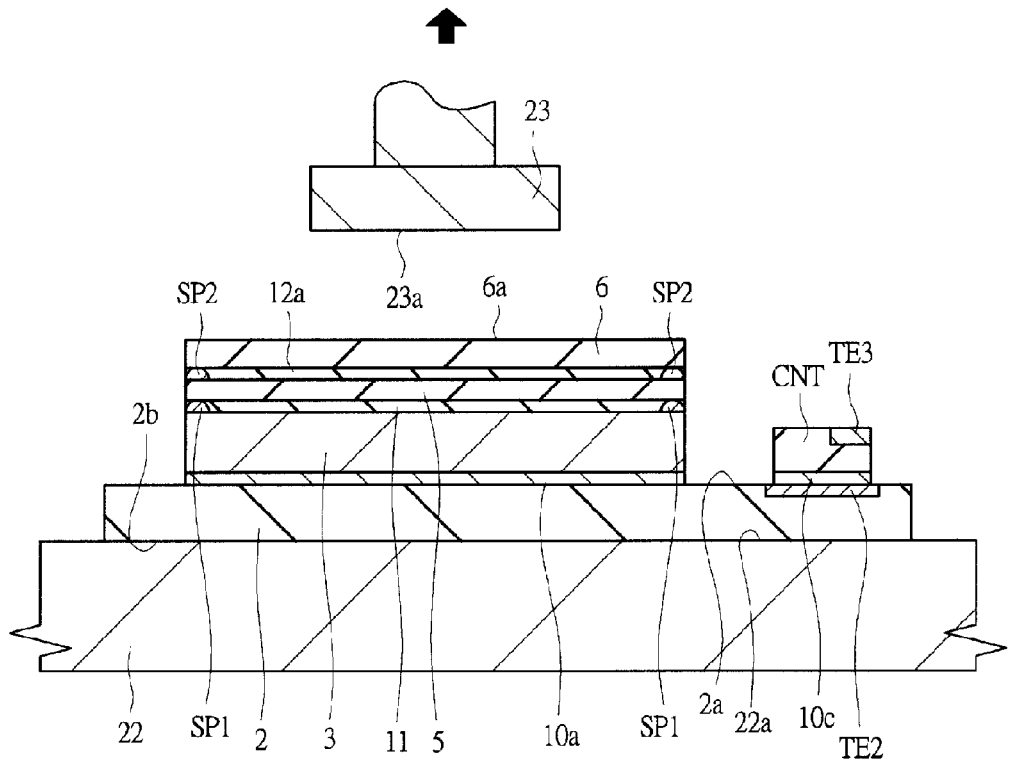
FIG. 69 is an explanatory diagram of an optical component disposition step of Step S8*b* and an adhesive curing step of Step S8*c*.
Figure 70:
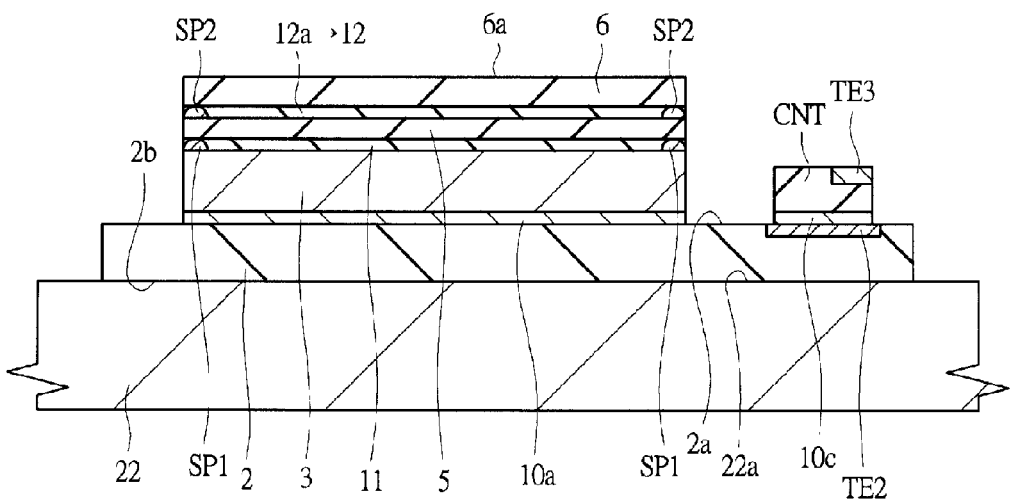
FIG. 70 is an explanatory diagram of an optical component disposition step of Step S8*b* and an adhesive curing step of Step S8*c*.

To perform Step S8b, as shown in FIG. 67, a bonding tool 23 holds (holds by adsorption) the optical component 6, and the optical component 6 held by the bonding tool 23 is descended from above toward the front surface 5a of the optical component 5 (this optical component 5 is fixed to the sensor chip 3 by the adhesive 11). Then, as shown in FIG. 68, the optical component 6 held by the bonding tool 23 is disposed over the front surface 5a of the optical component 5. After that, the adhesive 12a disposed over the front surface 5a of the optical component 5 wets the front surface 5a of the optical component 5 to be spread over approximately the whole region of the front surface 5a of the optical component 5. Then, the holding (holding by adsorption) of the optical component 6 by the bonding tool 23 is stopped (terminated), and only the bonding tool 23 is elevated (the optical component 6 is not elevated together with the bonding tool 23) leaving the optical component 6 as disposed over the optical component 5 as shown in FIG. 69. After that, as shown in FIG. 70, the curing step of the adhesive 12a of Step S8c is performed and the adhesive 12a becomes the cured adhesive 12.

In accordance with the embodiment, the optical component 6 is disposed over the front surface 5a of the optical component 5 in Step S8b while a load is applied to the optical component 6. In Step S8c, the adhesive 12a is cured while load is not applied to the optical component 6. Specifically, the optical component 6 held by the bonding tool 23 is disposed over the front surface 5a of the optical component 5 via the plurality of spacers SP2 and the adhesive 12a in Step S8b. In Step S8b, the optical component 6 is disposed over the front surface 5a of the optical component 5 while a load is applied to the optical component 6 by the bonding tool 23. In Step S8c, because the adhesive 12a is cured in a state in which the bonding tool 23 is separated from the optical component 6, the adhesive 12a is cured in a state in which a load is not applied to the optical component 6.

The spacer SP2 formed in Step S7 has adherence and thereby the optical component 6 disposed over the front surface 5a of the optical component 5 in Step S8b is fixed temporarily by the spacer SP2 (adherence of the spacer SP2) and the adhesive 12a curing step of Step S8c is performed in a state of this temporary fixing. In the adhesive 12a curing step of Step S8c, the optical component 6 can be prevented from moving in a horizontal direction even if the optical component 6 is not pressed (held) by the bonding tool 23 or the Like in the adhesive 12a curing step of Step S8c. By curing the adhesive 12a in Step 8c in a state in which the optical component 6 is not pressed (held) by the bonding tool 23 or the like and a load is not applied to the optical component 6, it is possible to control or prevent the generation of interference patterns in the cured adhesive and to control or prevent the degradation in the transmittance of the adhesive 12.

As described above, the adhesive 12 is required to have translucency (light transmissivity, or light transmitting property), and it is possible to prevent the adhesive 12 from disturbing (blocking) the input of light to the light receiving element PH of the sensor chip 3. Accordingly, it is necessary to use adhesive having translucency as the adhesive 12a disposed (supplied) on the front surface 5a of the optical component 5 in Step S8a. While, since ultraviolet curable adhesive has translucency, the ultraviolet curable adhesive can be preferably used as the adhesive 12a to be disposed on the front surface 5a of the optical component 5 in Step S8a, heat-curable type adhesive may be used if translucency can be kept.

The processing of curing the adhesive 12a in Step S8c can be performed by heat treatment (when the adhesive 12a is heat-curable) or by ultraviolet light irradiation processing (when the adhesive 12a is ultraviolet curable). When at least apart of the optical component 6 (lens portion 13) is formed with resin material (transparent resin) such as poly-acryl resin, more preferably not the heat treatment but the ultraviolet light irradiation processing is performed as the processing of curing the adhesive 12a in Step S8c from the viewpoint of avoiding an heat effect to the optical component 6. This is because the adhesive 12a cannot be cured sufficiently in the heat treatment at a temperature lower than the heatproof temperature (approximately 90° C. when the acryl resin is used as the lens portion 13 and the like) of the optical component 6 and it is better to cure the adhesive 12a by the ultraviolet light irradiation processing. Accordingly, more preferably, the ultraviolet curable adhesive is used as the adhesive 12a to be disposed on the front surface 5a of the optical component in Step S8a and the ultraviolet light irradiation processing is performed as the processing of curing the adhesive 12a in Step S8c.

Even when at least a part of the optical component 6 (lens portion 13) is formed with resin material (transparent resin) such as acryl resin, the optical component 6 is not yet mounted at the step of Step S6c and the adhesive 11a can be cured by heat treatment at a temperature higher than the heatproof temperature of the optical component 6 in Step S6c. Further, when the adhesive 11a is cured by the heat treatment in Step S6c, the adhesive 11a does not have a portion which would not be irradiated (not illuminated) with ultraviolet light. An advantage that stable curing processing can be performed is also obtained.

Accordingly, more preferably, the adhesive 11a is cured by the heat treatment in Step S6c. In Step S8c, the adhesive 12a is cured by the ultraviolet light irradiation processing in consideration of the heatproof temperature of the optical component 6. The heatproof temperature of the optical component 6 may be lower than the temperature of the heat treatment (heating temperature for curing the adhesive 11a) in Step S6c. Step S6c (curing step of the adhesive 11a) and Step S8c (curing step of the adhesive 12a) can be performed without being affected by the low heatproof temperature of the optical component 6.

Further, when the same (same kinds of) adhesive is used as the adhesive 11a used in Step S6a and the adhesive 12a used in Step S8a, common adhesive can be used as the adhesive 11a and the adhesive 12a to reduce labor hour for the manufacturing (assembly). Further, the adhesive 11a disposition step of Step S6a and the adhesive 12a disposition step of Step S8a can be performed by using the same manufacturing apparatus (adhesive coating apparatus) to simplify the manufacturing step (manufacturing line) and reduce manufacturing cost. Moreover, when common adhesive provided with both of the ultraviolet curability and the heat curability is used as the adhesive 11a and the adhesive 12a, the heat treatment can be performed in Step S6c as the curing processing of the adhesive 11a, and the ultraviolet light irradiation processing can be performed in Step S8c as the curing processing of the adhesive 12a.

Further, preferably in Step S8a, the adhesive 12a is disposed over the front surface 5a of the optical component 5 to protrude from the spacer SP2 in a side view. The height $H_4$ of the adhesive 12a disposed on the front surface 5a of the optical component 5 in Step S8a is preferably higher than the height $H_3$ of the spacer SP2 ($H_4>H_3$). The height $H_3$ of the spacer SP2 and the height $H_4$ of the adhesive 12a are also indicated in FIG. 58 and correspond to the heights in the direction perpendicular to the front surface 5a of the optical component 5. The adhesive 12a is pressed to be spread by the rear surface of the optical component 6 in Step S8b (optical component 6 disposition step) and the adhesive 12a can be spread uniformly between the front surface 5a of the optical component 5 and the rear surface of the optical component 6. The height $H_3$ of the spacer SP2 can be set to approximately 20 to 40 μm. Further, the difference between the height $H_4$ of the adhesive 12a and the height $H_3$ of the spacer SP2 ("$H_4-H_3$") can be set to approximately 100 to 200 μm.

Further, more preferably, the adhesive 12a is disposed at the center part of the front surface 5a of the optical component 5 in Step S8a and the adhesive 12a is pressed to be spread by the rear surface of the optical component 6 in Step S8b (optical component 6 disposition step). At this time, the adhesive 12a is disposed not over the whole front surface 5a of the optical component 5 but in a small area (region) smaller than the front surface 5a of the optical component 5. Accordingly, the disposition region of the adhesive 12a in Step S8a is limited to the center part and it becomes possible to reduce time required for Step S8a (adhesive 12a disposition step) and to easily control the supply amount of the adhesive 12a. Also, the adhesive 12a is pressed to be spread when the optical component 6 is disposed in Step S8b, and the adhesive 12a can be spread uniformly between the front surface 5a of the optical component 5 and the rear surface of the optical component 6.

Further, adhesive having a comparatively low viscosity is preferably used as the adhesive 12a to spread the adhesive 12a uniformly by the rear surface of the optical component 6 between the front surface 5a of the optical component 5 and the rear surface of the optical component 6 in Step S8b (optical component 6 disposition step). Adhesive having a comparatively high viscosity is preferably used as the adhesive 24 to form the spacer SP2 not to flow easily until the curing processing of Step S7b is performed as described above. Accordingly, the viscosity of the adhesive 12a disposed on the front surface 5a of the optical component 5 in Step S8a is preferably lower than the viscosity of the adhesive 24 disposed on the front surface 5a of the optical component 5 in Step S7a. Thus, the adhesive 12a flows easily in Step S8b, and the adhesive 24 does not flow easily during the time after Step S7a until the curing step of Step S7b.

The viscosity of the adhesive 12a disposed on the front surface 5a of the optical component 5 in Step S8a can be set to approximately 3,000 milli-Pascal/second (mPa/sec). The viscosity of the adhesive 24 disposed on the front surface 5a of the optical component 5 in Step S7a can be set to approximately 30,000 milli-Pascal/second (mPa/sec). These viscosity values are measured by the rotating viscometer.

Further, when the optical component 6 held by the bonding tool 23 is disposed over the front surface 5a of the optical component 5 in Step S8b, the spacer SP2 is preferably formed at a position which does not overlap the head portion 23a of the bonding tool 23 (portion contacting the optical component 6 in the bonding tool 23) in a planar view. In FIG. 65, the position of the head portion 23a of the bonding tool 23 holding the optical component 6 is indicated by a chain line. A load by the bonding tool 23 is not easily transferred to the spacer SP2, and it becomes possible to prevent more appropriately the SP2 from being deformed in Step S8b (optical component 6 disposition step). Accordingly, it becomes possible to appropriately define the spacing between the front surface 5a of the optical component 5 and the rear surface of the optical component 6 by the spacer SP2 when the adhesive 12a is cured in Step S8c, and to form more appropriately a layer of the adhesive 12a having a desired thickness.

In this manner, the sensor module MJ1 in accordance with the embodiment which has been explained with reference to above FIG. 1 to FIG. 11 is manufactured (assembled).

Figure 71:
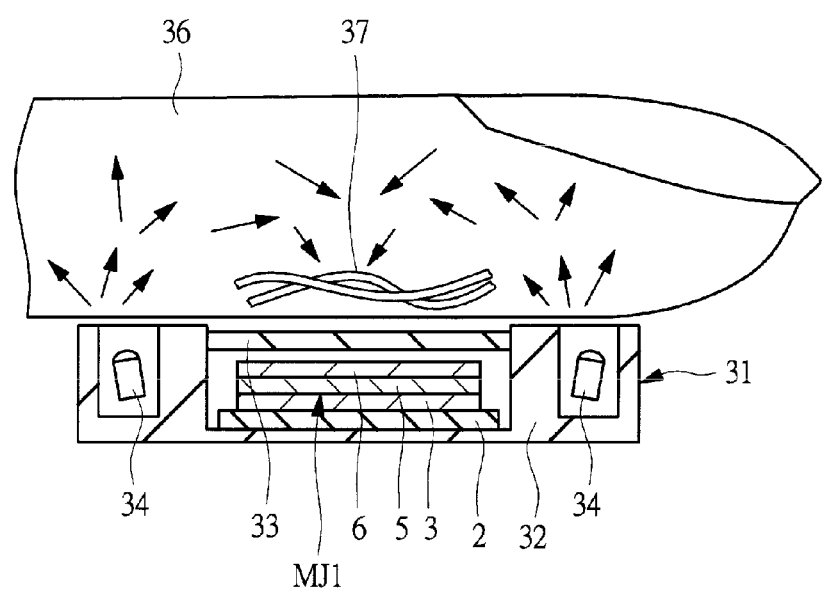
FIG. 71 is an explanatory diagram of a finger vein authentication device using a sensor module in accordance with an embodiment of the present invention.

<Application Example of the Sensor Module> FIG. 71 is an explanatory diagram of a finger vein authentication device (vein authentication sensor) 31 using the sensor module MJ1.

The finger vein authentication device 31 shown in FIG. 71 includes the above described sensor module MJ1, a case 32 accommodating the sensor module MJ1, an infrared filter 33 attached to the case 32 to be positioned over the sensor module MJ1, and a light source 34 attached to the case 32.

To briefly explain the operating principle of the finger vein authentication device 31, a finger 36 is placed (put) over the finger vein authentication device 31, the finger 36 is irradiated with infrared light from the light source 34, the light scattered from the light source 34 is received by the plurality of lens portion 13 of the optical component 6 in the sensor module MJ1, and the light collected by each of the lenses 13 is detected by each of the light receiving elements PH in the sensor chip 3. Thus, a vein 37 pattern of the finger 36 can be read.

<Major Features and Advantages of the Sensor Module> When, differently from the embodiment, a sensor module is configured by disposing only one lens in the upper direction of the sensor chip leaving a certain distance from the sensor chip instead of providing the optical components 5 and 6 over the sensor chip and by receiving light collected by this one lens using the sensor chip, the thickness of the sensor module increases by a thickness of the lens and a focal length of the lens. Forcibly reducing the thickness may cause image distortion and the like.

In the sensor module MJ1 in accordance with the embodiment, the sensor chip 3 does not receive light collected by one lens and the sensor chip 3 (its light receiving element PH) receives light collected by each of the plurality of lens portions 13 of the optical component 6. Accordingly, compared with the case in which the sensor chip 3 receives light collected by one lens, the embodiment can reduce the thickness and the focal length of the lens (corresponding to the lens portion 13 in the embodiment) and can reduce the distance from the surface of the lens (corresponding to the lens portion 13 in the embodiment) to the sensor chip 3. Accordingly, the sensor module MJ1 in accordance with the embodiment has a configuration in which the optical component 5 is bonded over the sensor chip 3 (further, the optical component 6 is bonded over the optical component 5), and it is possible to reduce the thickness of the sensor module MJ1 and to realize a thinner type of the sensor module MJ1.

Further, the sensor module MJ1 in accordance with the embodiment is provided with the optical component 5 disposed over the sensor chip 3 and provides this optical component 5 with the light blocking layer 15 having the plurality of opening portions 16 corresponding to the light receiving elements PH of the sensor chip 3 to receive only local light from directly above in each of the light receiving elements PH of the sensor chip 3. It is possible to prevent unnecessary light from entering the light receiving element PH of the sensor chip 3 and to increase sensitivity.

Further, the sensor module MJ1 of the embodiment, which can be used preferably as a sensor for a vein authentication (for vein recognition) such as the finger vein authentication device 31, can be used also as other various kinds of sensor, such as, a sensor for finger print recognition.

<Major Features and Advantages of the Sensor Module Manufacturing Step> In a sensor module having a configuration in which an optical component is bonded over a sensor chip with adhesive, the thickness of the whole sensor module can be reduced but it is necessary to provide an optical region (corresponding to the opening portion 16) in a light blocking layer and a lens portion (corresponding to the lens portion 13) for each pixel in the sensor chip. Accordingly, also in the sensor module MJ1 in accordance with the embodiment, it is necessary to dispose each of the opening portions 16 in the light blocking layer 15 of the optical component 5 and each of the lens portions 13 of the optical component 6 to be aligned with each of the pixels (each of the light receiving elements PH) of the sensor chip 3. Therefore the allowance in a positional shift for each of the optical components 5 and 6 with respect to the sensor chip 3 is reduced. Accordingly, it is desired to mount the optical components 5 and 6 over the sensor chip 3 precisely in the manufacturing of the sensor module MJ1.

Accordingly, in accordance with the embodiment, after the plurality of spacers SP1 having adherence has been formed on the front surface 3a of the sensor chip 3 in Step S5, the adhesive 11a in a paste state is disposed over the front surface 3a of the sensor chip 3 in Step S6a, the optical component 5 is disposed on the front surface 3a of the sensor chip 3 via the plurality of spacers SP1 and the adhesive 11a in Step S6b, and the adhesive 11a is cured in Step S6c.

The spacer SP1 formed in Step S5 has adherence and the optical component 5 is disposed over the front surface 3a of the sensor chip 3 via the spacers SP1 and the adhesive 11a in Step S6b. So, the optical component 5 disposed over the front surface 3a of the sensor chip 3 is fixed temporarily by the spacer SP1 (adherence of the Spacer SP1) and the curing step of the adhesive 11a of Step S6c is performed in a state of this temporal fixing. Accordingly, the optical component 5 can be fixed temporarily by the spacer SP1 until the adhesive 11a is cured in Step S6c, and thereby it is possible to control or prevent the optical component 5 from moving (moving in a horizontal direction) with respect to the sensor chip 3 during the time after the optical component 5 has been disposed over the sensor chip 3 in Step S6b until the adhesive 11a is cured in Step S6c.

In accordance with the embodiment, in Step S6b, the optical component 5 is disposed over the front surface 3a of the sensor chip 3 while a load is applied to the optical component 5. In step S6c, the adhesive 11a is cured while a load is not applied to the optical component 5.

Differently from the embodiment, when the spacer SP1 formation step of Step S5 is omitted, the optical component 5 may move before the adhesive 11a curing step of Step S6c is completed, because the spacer SP1 does not exist to fix the optical component 5 temporarily after the optical component 5 has been disposed over the front surface 3a of the sensor chip 3 in Step S6b. As described above, since the allowance in the positional shift for the optical component 5 with respect to the sensor chip 3 is small, it is necessary to prevent the phenomenon that the optical component 5 moves during the time after the optical component 5 disposition step of Step S6b until the adhesive 11a curing step of Step S6c is completed. Accordingly, differently from the embodiment, when the spacer SP1 formation step of Step S5 is omitted, it is considered to press the optical component 5 by the bonding tool 23 or the like for preventing the optical component 5 from moving after the optical component 5 has been disposed over the front surface 3a of the sensor chip 3 in Step S6b until the adhesive 11a curing step of Step S6c is completed. However, when the optical component 5 is pressed by the bonding tool 23 or the like after the optical component 5 has been disposed over the front surface 3a of the sensor chip 3 in Step S6b until the adhesive 11a curing step of Step S6c is completed, the thickness of the adhesive 11 between the optical component 5 and the sensor chip 3 is caused to become non-uniform due to a load applied to the optical component 5, and the interference patterns are generated in the adhesive 11 to cause a phenomenon that the transmittance of the adhesive 11 is degraded.

In accordance with the embodiment, in Step S6c, the adhesive 11a is cured in a state in which the optical component 5 is not pressed (held) by the bonding tool 23 or the like and a load is not applied to the optical component 5. After the optical component 5 has been disposed over the front surface 3a of the sensor chip 3 in Step S6b, the optical component 5 can be fixed temporarily by the spacer SP1. The optical component 5 can be prevented from moving in a horizontal direction in the adhesive 11a curing step of Step S6c, even if the optical component 5 is not pressed (held) by the bonding tool 23 or the like. Then, it is possible to control or prevent the generation of the interference patterns in the cured adhesive 11 and to control or prevent the degradation of the transmittance in the adhesive 11, by curing the adhesive 11a in Step S6c in a state in which the optical component 5 is not pressed (held) by the bonding tool 23 or the like and a load is not applied to the optical component 5.

The reason why the generation of the interference patterns in the adhesive 11 can be prevented and the degradation of the transmittance in the adhesive 11 can be prevented will be explained in more detail. When the optical component 5 is disposed over the sensor chip 3 in Step S6a, the load of the bonding tool 23 is applied to the optical component 5 and is also transferred to the adhesive 11a via the optical component 5, but the curing of the adhesive 11a has not yet started at this step and the load applied to the optical component 5 is removed when the bonding tool 23 is separated from the optical component 5. When the load transferred to the adhesive 11a via the optical component is also removed, the non-uniformity (interference patterns) generated in the adhesive 11a disappears. Then, in the step of providing the adhesive 11a with the processing of curing the adhesive 11a (ultraviolet light irradiation processing or heat treatment) in Step S6c, the bonding tool 23 already does not hold the optical component 5, the load is not applied to the optical component 5, and the load transferred to the adhesive 11a via the optical component 5 is also removed. So, the adhesive 11a is cured in a state without the non-uniformity (interference patterns) in the adhesive 11a. Then, it is possible to control or prevent the generation of the non-uniformity (interference patterns) in the cured adhesive 11 and to control or prevent the degradation of the light transmittance in the adhesive 11.

Further, when the optical component 5 is disposed over the front surface 3a of the sensor chip 3 in Step S6b, the distance between the front surface 3a of the sensor chip 3 and the rear surface of the optical component 5 is defined by the height of the spacer SP1. Then, in Step S6c, the adhesive 11a is cured in a state in which the optical component 5 is not pressed (held) by the bonding tool 23 or the like and also a load is not applied to the optical component 5. Accordingly, in Step S6c, the adhesive 11a is cured in a state without bending of the optical component 5 and then the thickness of the cured adhesive 11 becomes approximately the same as the height of the spacer SP1. The height of the spacer SP1 can be controlled by adjusting the amount and the viscosity of the adhesive 21 disposed at a position where each of the spacers SP1 is to be formed on the front surface 3a of the sensor chip 3 in Step S5a. The spacers SP1 having approximately the same height can be formed by disposing the adhesives having the same viscosity in the same amount at respective positions where the spacers SP1 are to be formed. Thus, the thickness of the adhesive 11 can be also made more uniform for each of the sensor modules MJ1.

Further, differently from the embodiment, when the spacer SP1 is formed without the curing step of Step S5b (corresponding to a case in which the adhesive 21 is disposed on the front surface 3a of the sensor chip 3 and used as the spacer SP1 without being cured), the viscosity of the spacer SP1 is low and the spacer SP1 may be able to keep no spacing between the front surface 3a of the sensor chip 3 and the rear surface of the optical component 5.

In accordance with the embodiment, the spacer SP1 is formed in Step S5a (adhesive 21 disposition step) and Step S5b (adhesive 21 curing step). By increasing the viscosity of the adhesive 21, which has been disposed on the front surface 3a of the sensor chip 3 in Step S5a, in Step S5b (adhesive 21 curing step), it is possible to form the spacer SP1 having a viscosity higher than the viscosity of the adhesive 21 at the supply (when the adhesive 21 is supplied on the front surface 3a of the sensor chip 3 in Step S5a). Then, it becomes possible to keep the spacing between the front surface 3a of the sensor chip 3 and the rear surface of the optical component 5 by the spacer SP1 and to appropriately form a layer of the adhesive 11 having approximately the same thickness as the spacer SP1. Further, the adhesive 21 having a viscosity $V_1$ lower than the viscosity $V_2$ of the spacer SP1 may be supplied to (disposed on) the front surface 3a of the sensor chip 3 in Step S5a, and then it becomes easy to perform the supply (disposition) of the adhesive 21 in Step S5a.

In this manner, in accordance with the embodiment, it is possible to dispose (fix) the optical component 5 over the sensor chip 3 precisely. Accordingly, it is possible to improve the performance of the manufactured sensor module MJ1 (semiconductor device).

Although the features and advantages of Step S5 (spacer SP1 formation step) and Step S6 (optical component 5 mounting step) have been explained, features and advantages of the Step S7 (spacer SP2 formation step) and Step S8 (optical component 6 mounting step) are basically the same.

In a brief explanation, after the plurality of spacers SP2 having adherence has been formed on the front surface 5a of the optical component 5 in Step S7, the adhesive 12a in a paste state is disposed on the front surface 5a of the optical component 5 in Step S8a, the optical component 6 is disposed over the front surface 5a of the optical component 5 via the plurality of spacers SP2 and the adhesive 12a in Step S8b, and the adhesive 12a is cured in Step S8c. In Step S8b, the optical component 6 is disposed over the front surface 5a of the optical component 5 while a load is applied to the optical component 6. In Step S8c, the adhesive 12a is cured in a state in which a load is not applied to the optical component 6. Accordingly, because the optical component 6 can be fixed temporarily by the spacer SP2 the same as the optical component 5 in Step S6, it is possible to prevent the optical component 6 from moving in a horizontal direction in the adhesive 12a curing step of Step S8c even when the optical component 6 is not pressed (held) by the bonding tool 23 or the like. Then, it is possible to control or prevent the generation of the interference patterns in the cured adhesive 12 and to control or prevent the degradation of the transmittance in the adhesive 12, by curing the adhesive 12a in Step S8c in a state in which the optical component 6 is not pressed (held) by the bonding tool 23 or the like and a load is not applied to the optical component 6. The reason why the interference patterns are not generated in the adhesive 12 is basically the same as the reason why the interference patterns are not generated in the adhesive 11. Further, because the spacer SP2 is formed in Step S7a (adhesive 24 disposition step) and Step S7b (adhesive 24 curing step), the same as in the case of the spacer SP1, it becomes possible to appropriately keep the spacing between the front surface 5a of the optical component 5 and the rear surface of the optical component 6 by the spacer SP2, and to appropriately form a layer of the adhesive 12 having approximately the same thickness as the spacer SP2, and it becomes easy to supply the adhesive 24 in Step S7a.

In this manner, in accordance with the embodiment, it is possible to dispose (fix) the optical component 6 over the optical component 5 precisely. Accordingly, it is possible to improve the performance of the manufactured sensor module MJ1 (semiconductor device).

<Variation Example> While the above embodiment has been explained for a case in which the spacer SP1 is formed on the front surface 3a of the sensor chip 3 outside the sensor plane (sensor region) SE, the spacer SP1 can be formed over the sensor plane SE in the front surface 3a of the sensor chip 3 and further the spacer SP2 can be formed at a position overlapping the sensor plane SE in a planer configuration (overlapping in a planar view) on the front surface 5a of the optical component 5, in another embodiment (variation example). When the spacer SP1 is formed over the sensor plane SE, if the formed spacer SP1 is not translucent, a part of the pixel is not irradiated with light and the performance of the sensor is degraded. When the spacer SP2 is formed at a position overlapping the sensor plane SE in a planar configuration, if the formed spacer SP2 is not translucent, a part of the pixel is not irradiated with light and the performance of the sensor is degraded. Accordingly, to control the degradation of the sensor performance, the spacer SP1 is preferably formed at a position avoiding the sensor plane SE (outside the sensor plane SE) on the front surface 3a of the sensor chip 3 and the spacer SP2 is preferably formed at a position without overlapping the sensor plane SE in a planar configuration (without overlapping in a planar view) on the front surface 5a of the optical component 5.

Further, in accordance with another embodiment (variation example), the viscosity of the adhesives 11a and 12a respectively used in Steps S6a and S8a can be made the same (approximately the same) as the viscosity of the adhesives 21 and 24 respectively used in Steps S5a and S7a. In this case, spread-wettability of the adhesives 11a and 12a is reduced, accordingly, because the adhesive 11a needs to be disposed (coated) over approximately the whole surface of the sensor plane SE in Step S6a, it takes a longer time to dispose the adhesive 11a and it becomes difficult to control the coating amount of the adhesive 11a (the adhesive 11a tends to overflow). This is the same for the adhesive 12a. Therefore, for the adhesives 11a and 12a respectively to be used in Steps S6a and S8a, as described in the above embodiment, it is preferable to use adhesive having a low viscosity and accordingly the viscosity of the adhesives 11a and 12a respectively to be used in Steps S6a and S8a is more preferably lower than the viscosity of the adhesives 21 and 24 respectively to be used in Steps S5a and S7a for forming the spacers.

Further, mounting using an alignment mark can be performed in Steps S6b and S8b. In Step S6b, the optical component 5 is preferably disposed over the front surface 3a of the sensor chip 3 after the optical component 5 has been aligned with the sensor chip 3 by using alignment marks formed on the sensor chip 3 and the optical component 5. Further, in Step S8b, the optical component 6 is preferably disposed over the front surface 5a of the optical component 5 after the optical component 6 has been aligned with the optical component 5 by using alignment marks formed on the optical component 5 and the optical component 6. This will be explained specifically in the following.

Figure 72:
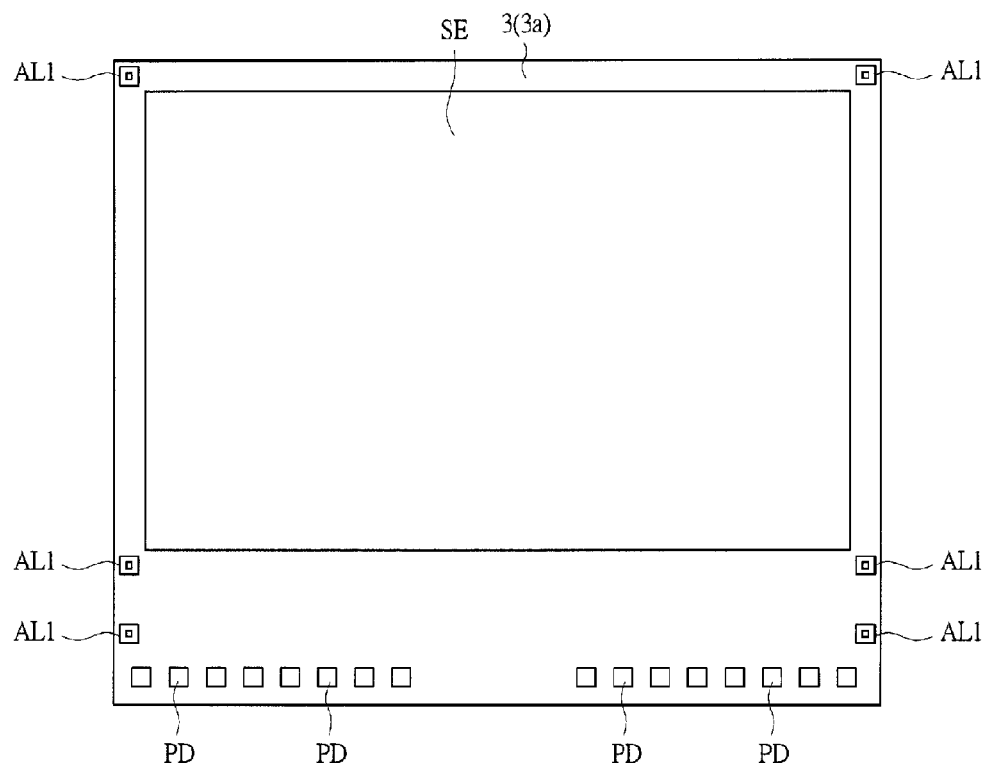
FIG. 72 is a plan view of a sensor chip on which an alignment mark is formed.
Figure 73:
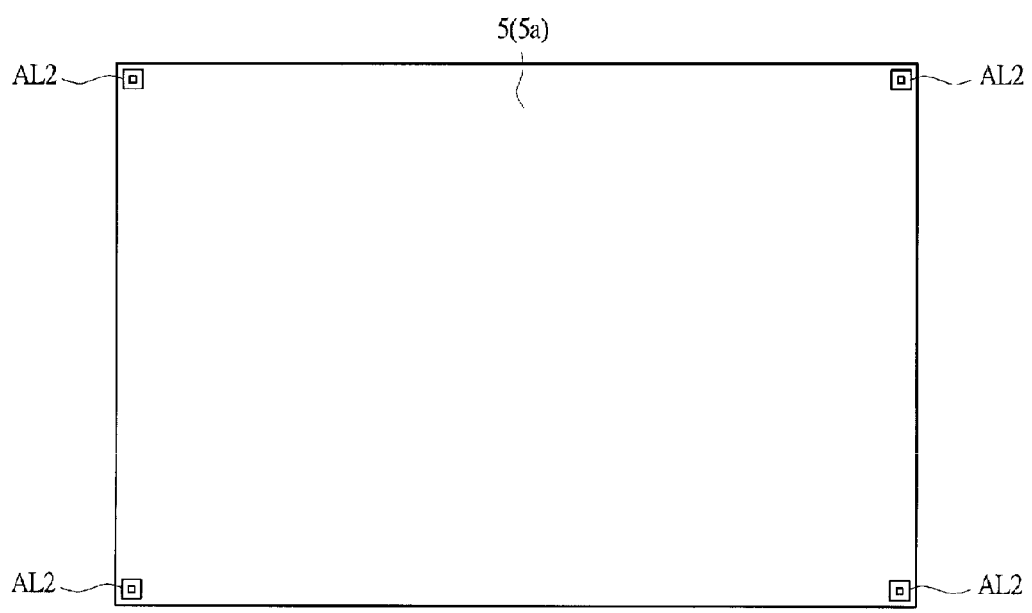
FIG. 73 is a plan view of an optical component on which an alignment mark is formed.
Figure 74:
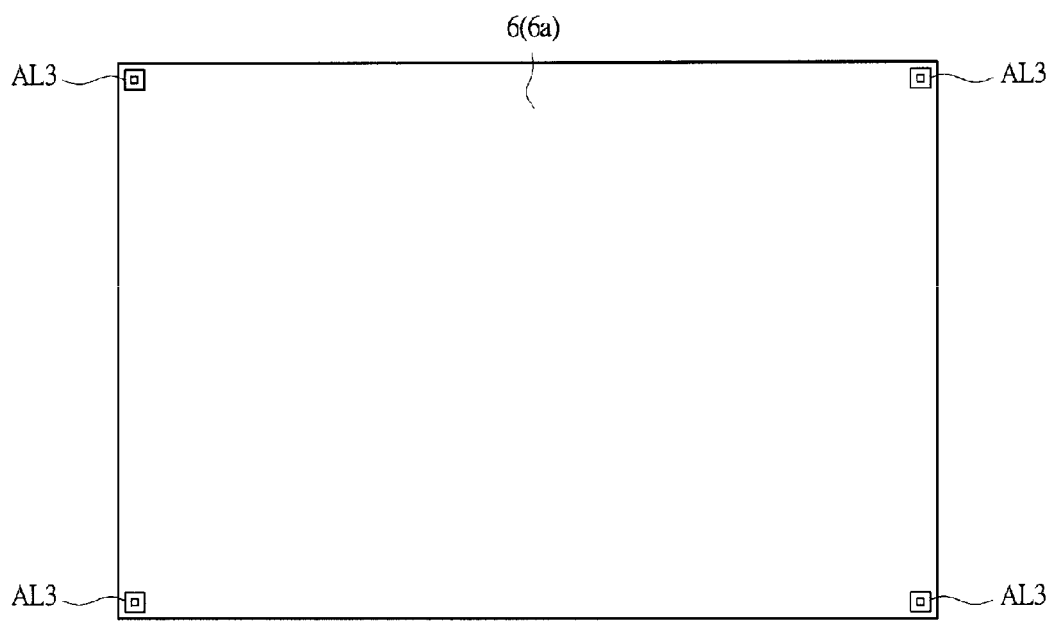
FIG. 74 is a plan view of an optical component on which an alignment mark is formed.

FIG. 72 is a plan view (top view) of the sensor chip 3. FIG. 73 is a plan view (top view) of the optical component 5. FIG. 74 is a plan view (top view) of the optical component 6, and FIG. 72, FIG. 73, and FIG. 74 correspond to above FIG. 7, FIG. 8, and FIG. 9, respectively (enlarged view parts shown in above FIG. 7 to FIG. 9 are omitted from FIG. 72 to FIG. 74, respectively). The sensor chip 3 in FIG. 72 has an alignment mark AL1 formed on its front surface. The optical component 5 in FIG. 73 has an alignment mark AL2 formed on its front surface 5a. The optical component 6 in FIG. 74 has an alignment mark AL3 formed on its front surface 6a.

In Step S6b, the optical component 5 is disposed over the front surface 3a of the sensor chip 3 after the optical component 5 has been aligned with the sensor chip 3 by using the alignment mark AL1 formed on the sensor chip 3 and the alignment mark AL2 formed on the optical component 5. Then, the positional precision of the optical component 5 with respect to the sensor chip 3 in a horizontal direction can be improved. After the optical component 5 has been disposed over the sensor chip 3 by using the alignment marks AL1 and AL2, the optical component 5 is fixed temporarily by the spacer SP1 as described above and the adhesive 11a is cured in this state in Step S6c. Then, it is possible to manufacture the sensor module MJ1 to which a high positional precision based on the alignment marks AL1 and AL2 in Step S6b (positional precision of the optical component 5 with respect to the sensor chip 3) is reflected directly. Further, it is more preferable to form the spacer SP1 at a position without overlapping the alignment mark AL1 in a planar configuration on the front surface 3a of the sensor chip 3. Then, it is possible to eliminate influence of the spacer SP1 on the recognition of the alignment mark AL1.

Similarly in Step S8b, the optical component 6 is disposed over the front surface 5a of the optical component 5 after the optical component 6 has been aligned with the optical component 5 by using the alignment mark AL2 formed on the optical component 5 and the alignment mark AL3 formed on the optical component 6. Then, the positional precision of the optical component 6 with respect to the optical component 5 in a horizontal direction can be improved. After the optical component 6 has been disposed over the optical component 5 by the use of the alignment marks AL2 and AL3, the optical component 6 is fixed temporarily by the spacer SP2 as described above and the adhesive 12a is cured in this state in Step S8c. Then, it is possible to manufacture the sensor module MJ1 to which a high positional precision based on the alignment marks AL2 and AL3 in Step S8b (positional precision of the optical component 6 with respect to the optical component 5) is reflected directly. Further, it is more preferable to form the spacer SP2 at a position without overlapping the alignment mark AL2 in a planer configuration on the front surface 5a of the optical component 5. Then, it is possible to eliminate influence of the spacer SP2 on the recognition of the alignment mark AL2.

The present invention achieved by the inventers has been explained in accordance with the embodiment. The present invention is not limited to the above embodiment and can be modified variously in a range without departing from the purport.

The present invention is effectively applied to the manufacturing technique of a semiconductor device.

What is claimed is:

1. A manufacturing method of a semiconductor device comprising the steps of:
   (a) providing a wiring substrate having an upper surface and a lower surface opposite to the upper surface;
   (b) mounting a sensor chip having a first major surface, a sensor region formed on the first major surface, a plurality of pixels formed in the sensor region, and a first rear surface opposite to the first major surface, on the upper surface of the wiring substrate so that the first rear surface faces to the upper surface of the wiring substrate;
   (c) disposing a first adhesive having a first viscosity at a plurality of positions on the first major surface of the sensor chip;
   (d) after the (c) step, forming a plurality of first spacers having a second viscosity higher than the first viscosity and also having adherence on the first major surface of the sensor chip by curing the first adhesive;
   (e) after the (d) step, disposing a second adhesive in a paste state on the first major surface of the sensor chip;
   (f) after the (e) step, disposing a first optical component having a light blocking layer in which a plurality of optical regions is formed, over the first major surface of the sensor chip via the first spacers and the second adhesive; and
   (g) after the (f) step, curing the second adhesive, wherein the (f) step disposes the first optical component over the first major surface of the sensor chip while applying a load to the first optical component, the (g) step cures the second adhesive in a state of not applying a load to the first optical component, the (f) step disposes the first optical component on the first major surface of the sensor chip via the first spacers and the second adhesive so that the optical regions overlap the pixels, and the optical region is a region where an opening portion is formed in the light blocking layer.

2. The manufacturing method of a semiconductor device according to claim 1, wherein the first adhesive is ultraviolet curable adhesive, and the (d) step cures the first adhesive to form the first spacer by irradiating the first adhesive with ultraviolet light.

3. The manufacturing method of a semiconductor device according to claim 1, wherein the (d) step cures the first adhesive to form the first spacer by irradiating the first adhesive with ultraviolet light in a state in which a surface of the first adhesive disposed over the first major surface of the sensor chip contacts air.

4. The manufacturing method of a semiconductor device according to claim 3, wherein the first optical component has a second major surface and a second rear surface opposite to the first major surface, and the (f) step disposes the first optical component over the first major surface of the sensor chip via the first spacers and the second adhesive so that the second rear surface of the first optical component faces to the first major surface of the sensor chip, the method further comprising the steps of:

(h) after the (g) step, disposing a third adhesive having a third viscosity at a plurality of positions on the second major surface of the first optical component;

(i) after the (h) step, forming a plurality of second spacers having a fourth viscosity higher than the third viscosity and also having adherence on the second major surface of the first optical component by curing the third adhesive;

(j) after the (i) step, disposing a fourth adhesive in a paste state on the second major surface of the first optical component;

(k) after the (j) step, disposing a second optical component including a plurality of lens portions over the second major surface of the first optical component via the second spacers and the fourth adhesive; and (l) after the (k) step, curing the fourth adhesive.

5. The manufacturing method of a semiconductor device according to claim 4, wherein the (k) step disposes the second optical component over the second major surface of the first optical component while applying a load to the second optical component, and the (l) step cures the fourth adhesive in a state in a state of not applying a load to the second optical component.

6. The manufacturing method of a semiconductor device according to claim 5, wherein the third adhesive is ultraviolet curable adhesive, and the (i) step cures the third adhesive to form the second spacer by irradiating the third adhesive with ultraviolet light.

7. The manufacturing method of a semiconductor device according to claim 6, wherein the (i) step cures the third adhesive to form the second spacer by irradiating the third adhesive with ultraviolet light in a state in which a surface of the third adhesive disposed over the second major surface of the first optical component contacts air.

8. The manufacturing method of a semiconductor device according to claim 7, wherein the (g) step cures the second adhesive by heating, and the (i) step cures the fourth adhesive by ultraviolet light.

9. The manufacturing method of a semiconductor device according to claim 8, wherein the same adhesive is used as the second adhesive and the fourth adhesive.

10. The manufacturing method of a semiconductor device according to claim 9, wherein a heatproof temperature of the second optical component is lower than a heating temperature at which the (g) step cures the second adhesive.

11. The manufacturing method of a semiconductor device according to claim 10, wherein the (d) step forms the first spacers at positions avoiding the sensor region on the first major surface of the sensor chip.

12. The manufacturing method of a semiconductor device according to claim 11, wherein the (d) step forms the first spacers in a periphery of the sensor region on the first major surface of the sensor chip in a planar view.

13. The manufacturing method of a semiconductor device according to claim 12, wherein the (i) step forms the second spacers at positions which do not overlap the sensor region in a planar view.

14. The manufacturing method of a semiconductor device according to claim 13, wherein the (f) step disposes the first optical component held by a bonding tool over the first major surface of the sensor chip via the first spacers and the second adhesive, and the (g) step cures the second adhesive in a state in which the bonding tool is separated from the first optical component.

15. The manufacturing method of a semiconductor device according to claim 14, wherein the (k) step disposes the second optical component held by a bonding tool over the second major surface of the first optical component via the second spacers and the fourth adhesive, and the (l) step cures the fourth adhesive in a state in which the bonding tool is separated from the second optical component.

16. The manufacturing method of a semiconductor device according to claim 15, wherein when the (f) step disposes the first optical component held by the bonding tool over the first major surface of the sensor chip, the first spacers are formed at positions which do not overlap a head portion of the bonding tool in a planar view.

17. The manufacturing method of a semiconductor device according to claim 16, wherein the (e) step disposes the second adhesive over the first major surface of the sensor chip so that the second adhesive protrudes from the first spacer in a side view.

18. The manufacturing method of a semiconductor device according to claim 17, wherein the (e) step disposes the second adhesive at a center part in the sensor region of the sensor chip, and the (f) step presses and spreads the second adhesive by the first rear surface of the first optical component.

19. The manufacturing method of a semiconductor device according to claim 18, wherein the (f) step aligns the first optical component with the sensor chip using alignment marks formed on the sensor chip and the first optical component, and then disposes the first optical component over the first major surface of the sensor chip.

* * * * *